(12) United States Patent
Min et al.

(10) Patent No.: US 10,103,030 B2
(45) Date of Patent: Oct. 16, 2018

(54) METHODS OF FABRICATING SEMICONDUCTOR DEVICES

(71) Applicant: Samsung Electronics Co., Ltd., Suwon-si, Gyeonggi-do (KR)

(72) Inventors: Hyo-sun Min, Suwon-si (KR); Yoonjae Kim, Seoul (KR); Sooho Shin, Hwaseong-si (KR); Sunghee Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/377,113

(22) Filed: Dec. 13, 2016

(65) Prior Publication Data
US 2017/0200616 A1    Jul. 13, 2017

(30) Foreign Application Priority Data

Jan. 12, 2016  (KR) .................. 10-2016-0003788

(51) Int. Cl.
| | |
|---|---|
| *H01L 21/3205* | (2006.01) |
| *H01L 21/306* | (2006.01) |
| *H01L 21/265* | (2006.01) |
| *H01L 21/283* | (2006.01) |
| *H01L 21/308* | (2006.01) |
| *H01L 21/768* | (2006.01) |
| *H01L 21/822* | (2006.01) |

(Continued)

(52) U.S. Cl.
CPC .... *H01L 21/30604* (2013.01); *H01L 21/0337* (2013.01); *H01L 21/26506* (2013.01); *H01L 21/283* (2013.01); *H01L 21/3085* (2013.01); *H01L 21/3086* (2013.01); *H01L 21/32139* (2013.01); *H01L 21/76895* (2013.01); *H01L 21/8221* (2013.01); *H01L 27/10823* (2013.01); *H01L 27/10894* (2013.01)

(58) Field of Classification Search
USPC ........................................................ 438/586
See application file for complete search history.

(56) References Cited

U.S. PATENT DOCUMENTS

| | | |
|---|---|---|
| 7,865,865 B2 | 1/2011 | Socha |
| 8,310,055 B2 | 11/2012 | Park et al. |
| (Continued) | | |

FOREIGN PATENT DOCUMENTS

| | | |
|---|---|---|
| KR | 20100075202 A | 7/2010 |
| KR | 20140028906 A | 3/2014 |

*Primary Examiner* — Timor Karimy
(74) *Attorney, Agent, or Firm* — Harness, Dickey, & Pierce, P.L.C.

(57) ABSTRACT

A method of fabricating a semiconductor device includes sequentially forming a first insulation pattern and an etch stop pattern on a peripheral circuit area of a substrate, forming a first mask pattern on a cell array area of the substrate, the first mask pattern including a pair of first portions extending in parallel and a second portion covering a portion of a sidewall of the etch stop pattern and a portion of a sidewall of the first insulation pattern, forming a second insulation layer covering the etch stop pattern and the first mask pattern, partially etching the etch stop pattern and the second insulation layer to expose the second portion of the first mask pattern, and removing the second portion of the first mask pattern to divide the pair of first portions of the first mask pattern.

20 Claims, 56 Drawing Sheets

(51) Int. Cl.
*H01L 21/033* (2006.01)
*H01L 21/3213* (2006.01)
*H01L 27/108* (2006.01)

(56) References Cited

U.S. PATENT DOCUMENTS

| | | |
|---|---|---|
| 8,877,647 B2 | 11/2014 | Tsai |
| 9,118,002 B2 | 8/2015 | Seo et al. |
| 2008/0239781 A1 | 10/2008 | Kwak |
| 2009/0034336 A1 | 2/2009 | Kwak et al. |
| 2009/0298276 A1 | 12/2009 | Lee et al. |
| 2010/0102371 A1* | 4/2010 | Yeom ................ H01L 21/76224 257/296 |
| 2011/0183505 A1 | 7/2011 | Min et al. |

* cited by examiner

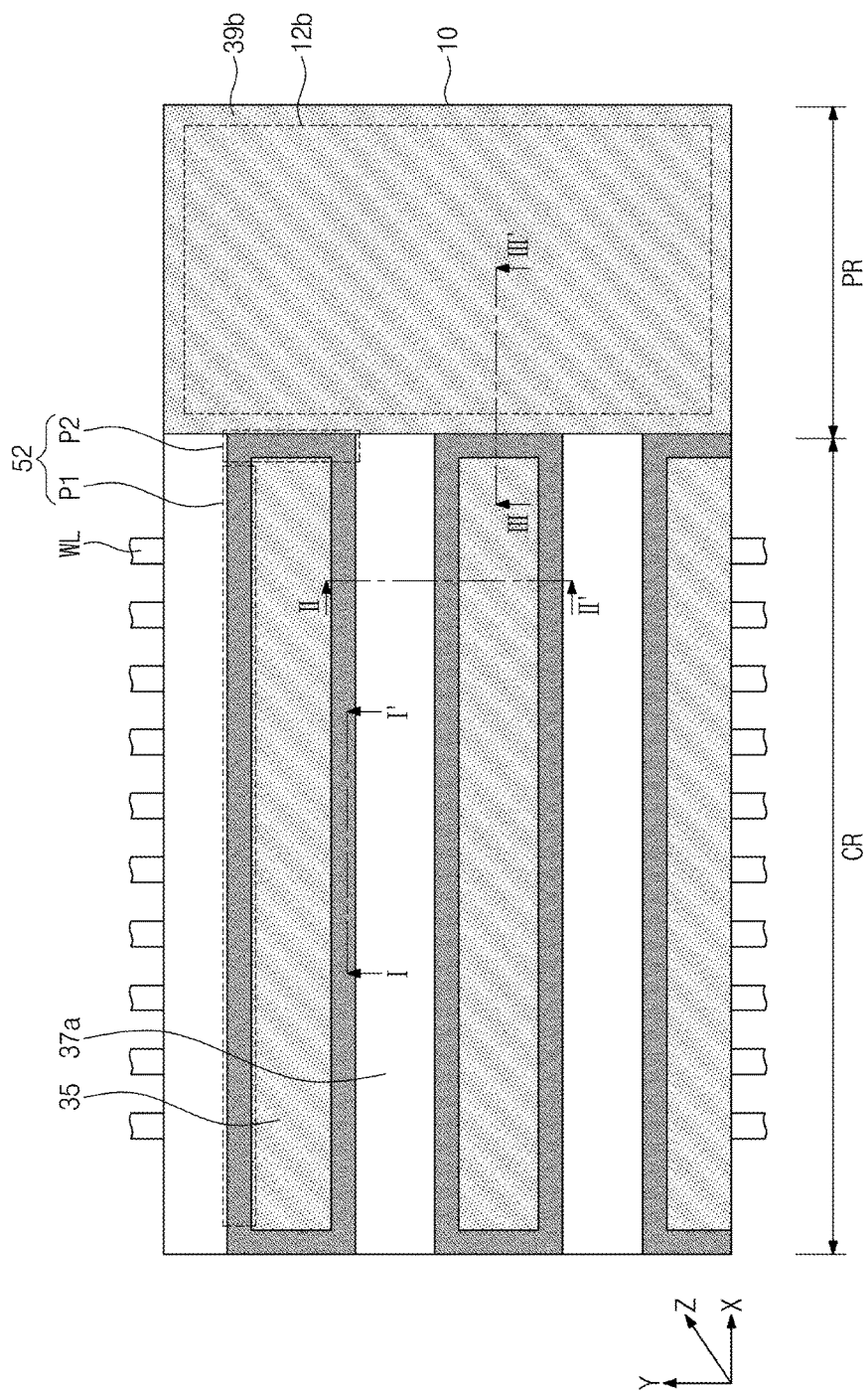

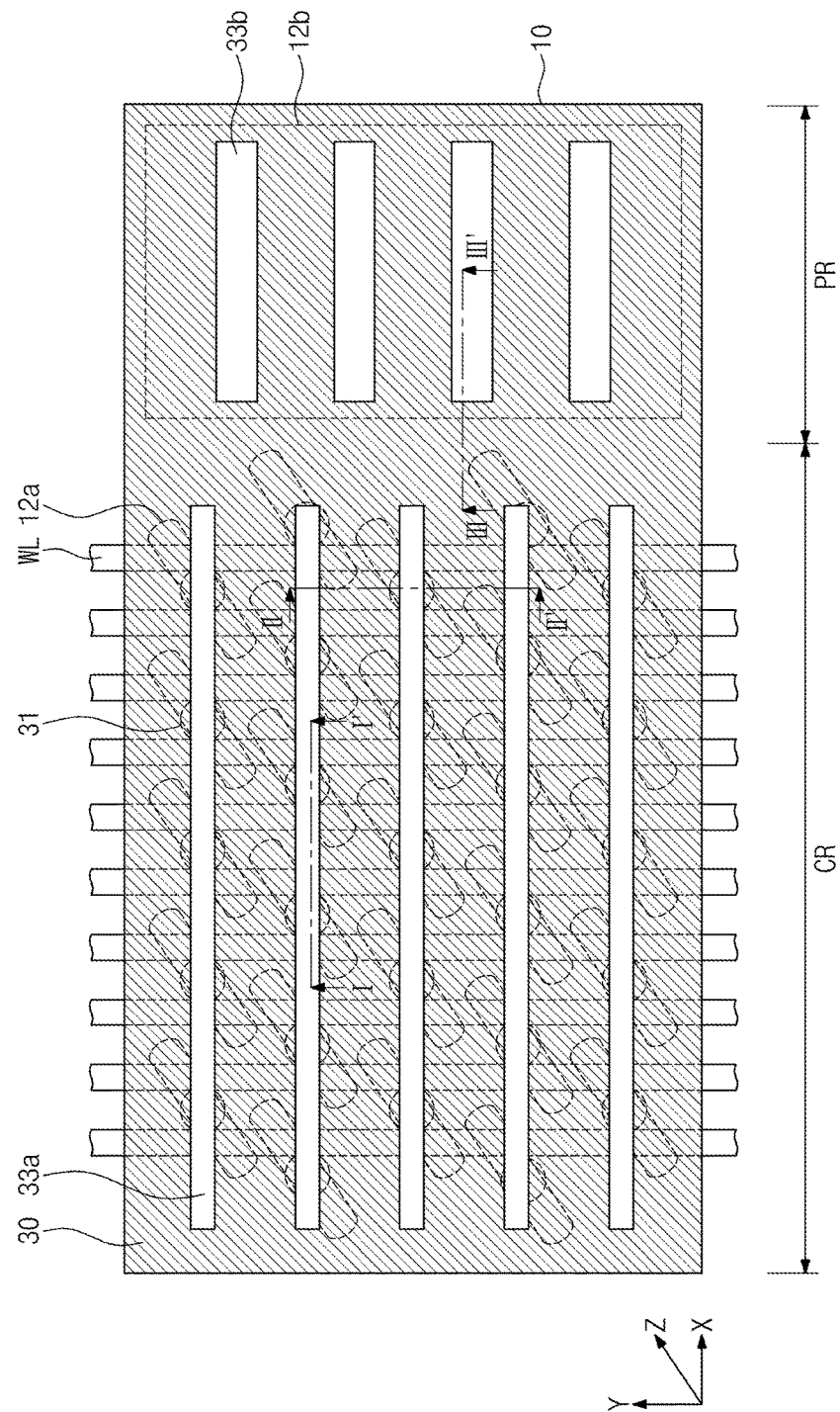

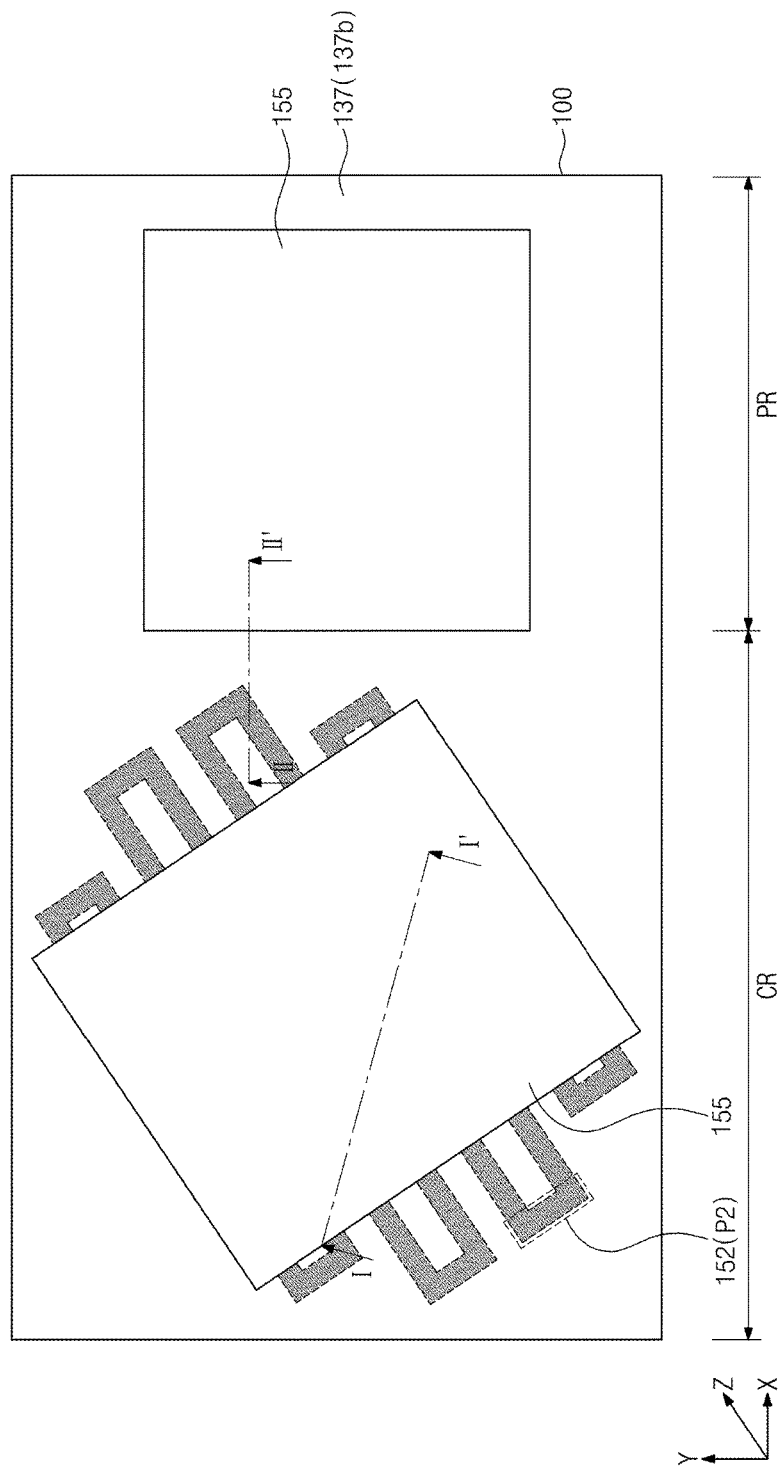

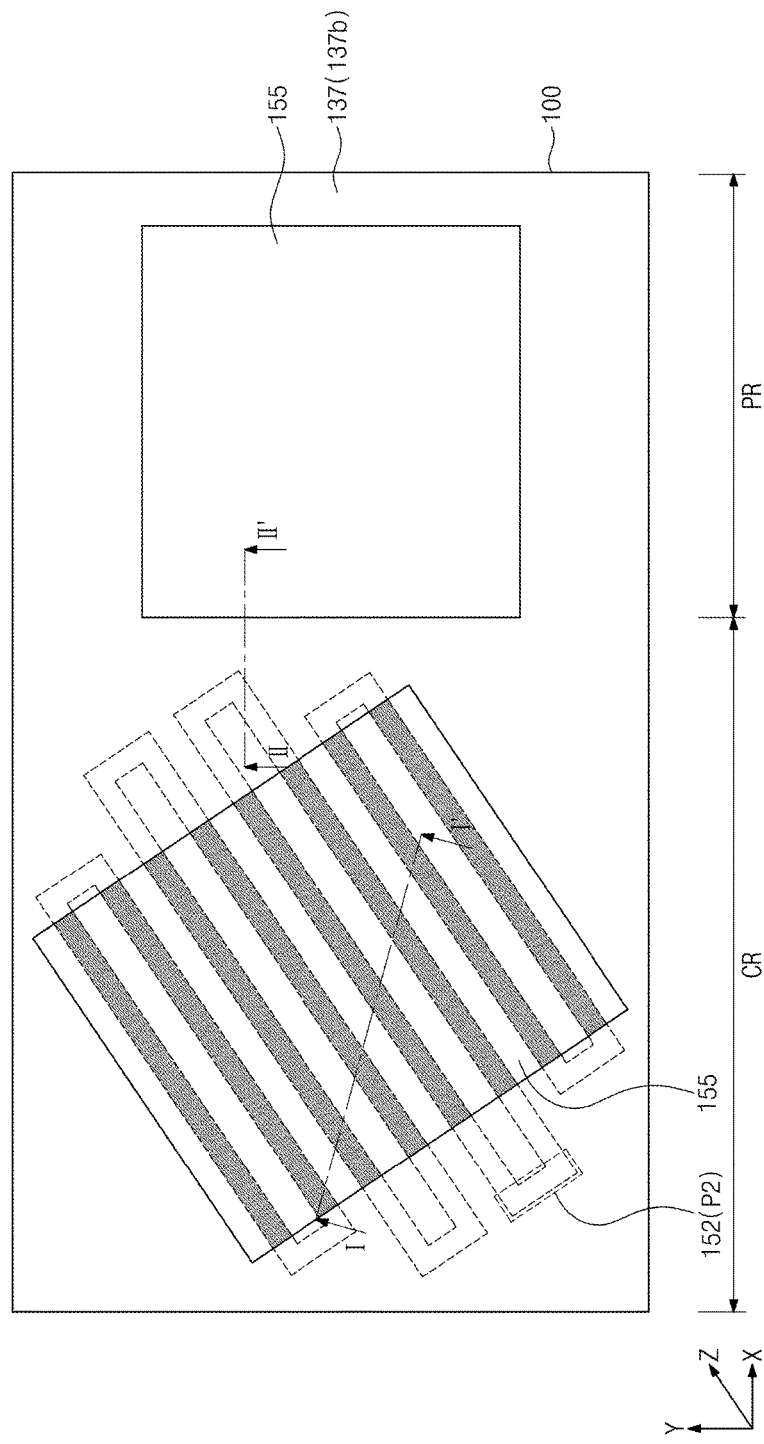

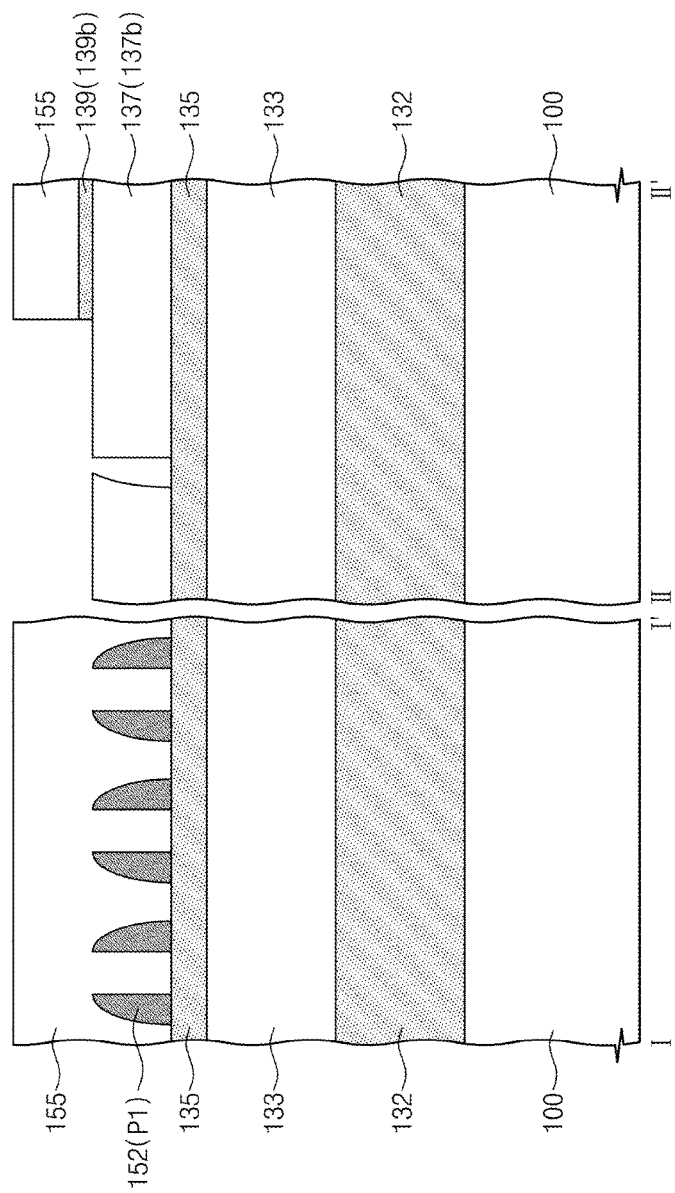

METHODS OF FABRICATING SEMICONDUCTOR DEVICES

CROSS-REFERENCE TO RELATED APPLICATIONS

This U.S. nonprovisional patent application claims priority under 35 U.S.C. § 119 of Korean Patent Application 10-2016-0003788, filed on Jan. 12, 2016, the entire contents of which are hereby incorporated by reference.

BACKGROUND

1. Field

Some example embodiments of the present inventive concepts relate to a method of fabricating a semiconductor device and, more particularly, to a method of fabricating a semiconductor device using a double patterning process.

2. Description of the Related Art

As a design rule of a semiconductor device decreased, forming fine patterns may be useful in realizing highly-integrated semiconductor device. A double patterning technology (DPT) may be useful to form a fine pattern, whose dimension is smaller than the minimum size that can be achieved by a photolithography process.

The double patterning technology may be generally classified into a self-alignment double patterning (SADP) process and a self-alignment reversed patterning (SARP) process. The SARP process may include operations of forming spacers on both sidewalls of each pattern of a set of patterns, selectively removing the patterns, and patterning an underlying layer using the spacers as an etch mask. The SADP process may include operations of forming spacers between patterns, removing spacers, and patterning an underlying layer using the patterns as an etch mask.

SUMMARY

Example embodiments of the present inventive concepts provide a method of fabricating a semiconductor device capable of reducing the number of process operations.

According to example embodiments of the present inventive concepts, a method of fabricating a semiconductor includes sequentially forming a first insulation pattern and an etch stop pattern on a peripheral circuit area of a substrate, forming a first mask pattern on a cell array area of the substrate, the first mask pattern including a pair of first portions extending in parallel in a first direction, and a second portion connected to the pair of first portions, the second portion covering a portion of a sidewall of the etch stop pattern and a portion of a sidewall of the first insulation pattern, forming a second insulation layer on the substrate to cover the etch stop pattern and the first mask pattern, sequentially etching a portion of the etch stop pattern and a portion of the second insulation layer to expose the second portion of the first mask pattern such that a remaining portion of the etch stop pattern defines a second mask pattern on the peripheral circuit area of the substrate, and removing the second portion of the first mask pattern to divide the pair of first portions of the first mask pattern.

According to example embodiments of the present inventive concepts, a method of fabricating a semiconductor includes forming a bit line contact on first active regions in a cell array area of a substrate, the bit line contact on a central portion of each of the first active regions extending in a first direction, sequentially forming a first insulation pattern and an etch stop pattern on a second active region in a peripheral circuit area of the substrate, forming a bit line mask pattern including a first portion extending across the bit line contact in a second direction crossing the first direction and a second portion on an end of the first portion, the second portion covering a portion of a sidewall of the etch stop pattern and a portion of a sidewall of the first insulation pattern, forming a second insulation layer on the substrate to cover the etch stop pattern and the bit line mask pattern, sequentially etching a portion of the second insulation layer and a portion of the etch stop pattern to expose the second portion of the bit line mask pattern such that a remaining portion of the etch stop pattern defines a gate mask pattern on the peripheral circuit area of the substrate, and removing the second portion of the bit line mask pattern.

According to example embodiments of the present inventive concepts, a method of fabricating a semiconductor device includes forming an etch stop pattern on a peripheral circuit area of a substrate, forming a first mask pattern on a cell array area of the substrate, the first mask pattern including a pair of first portions and a second portion connected to the pair of first portions, and simultaneously removing the second portion of the first mask pattern and a portion of the etch stop pattern in order to divide the pair of first portions of the first mask pattern and form a second mask pattern on the peripheral circuit area of the substrate.

BRIEF DESCRIPTION OF THE DRAWINGS

The accompanying drawings are included to provide a further understanding of the inventive concepts, and are incorporated in and constitute a part of this specification. The drawings illustrate example embodiments of the present inventive concepts, and together with the description, serve to explain principles of the present inventive concepts. In the drawings:

FIGS. 1A through 18A are plan views illustrating a method of fabricating a semiconductor device according to example embodiments of the present inventive concepts;

FIGS. 1B through 18B are cross-sectional view taken along lines I-I', II-II' and III-III' of FIGS. 1A through 18A;

FIGS. 19A through 28A are plan views illustrating a method of fabricating a semiconductor device according to example embodiments of the present inventive concepts; and FIGS. 19B through 28B are cross-sectional view taken along lines I-I', II-II' and III-III' of FIGS. 19A through 28A.

DETAILED DESCRIPTION

FIGS. 1A through 18A are plan views illustrating a method of fabricating a semiconductor device according to example embodiments of the present inventive concepts. FIGS. 1B through 18B are cross-sectional view taken along lines I-I', II-II' and III-III' of FIGS. 1A through 18A.

Figure 1A:
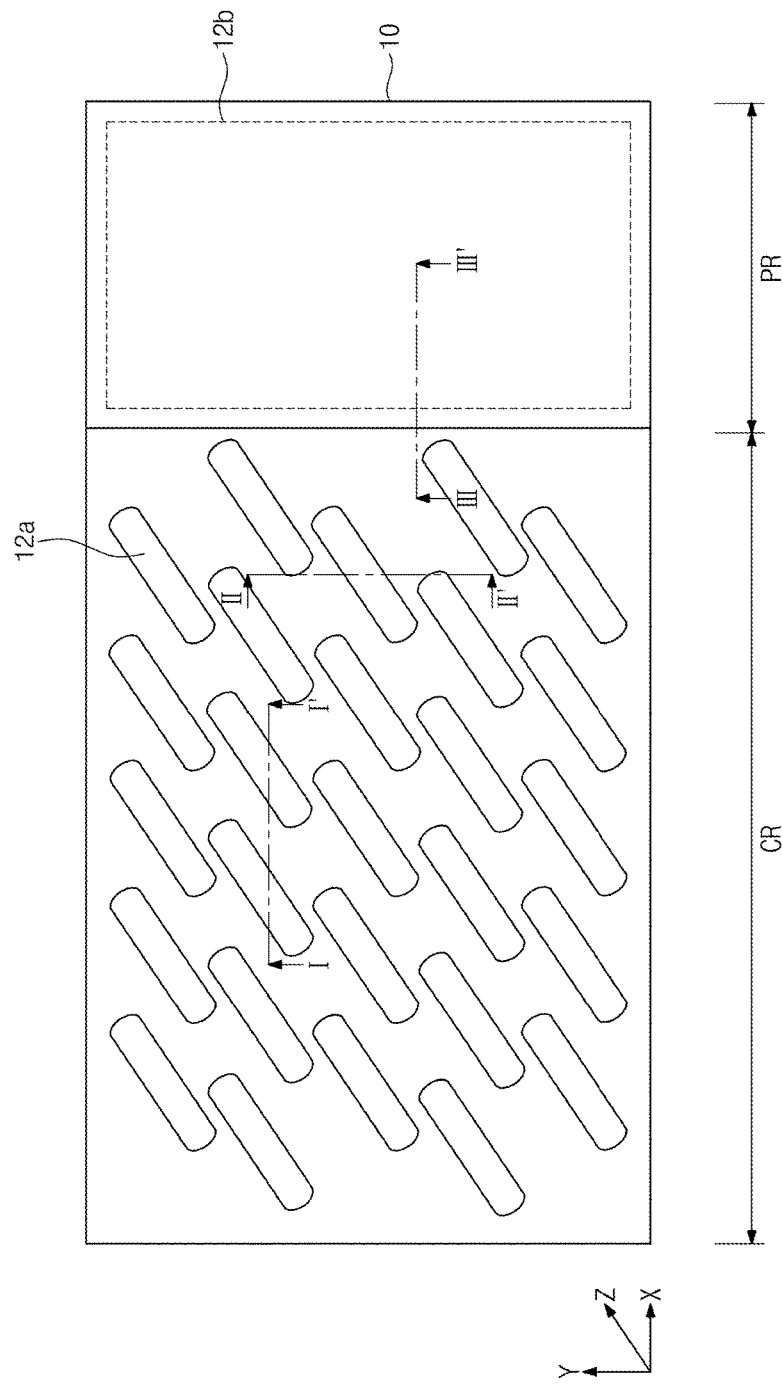
Figure 1B:
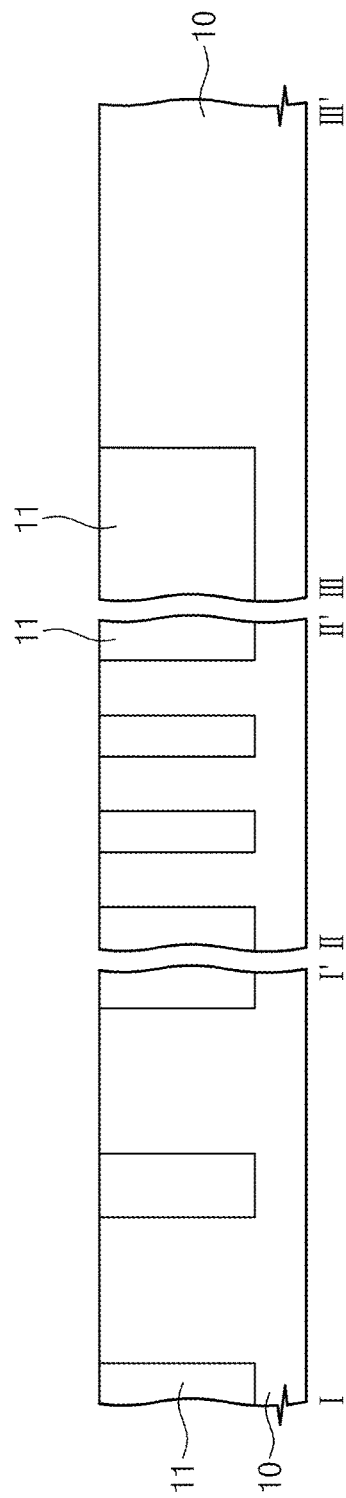

Referring to FIGS. 1A and 1B, a substrate 10 may include a cell array area CR and a peripheral circuit area PR. Semiconductor memory cells for storing data may be formed on the cell array area CR of the substrate 10, and transistors for driving the semiconductor memory cells may be formed on the peripheral circuit area PR.

A device isolation layer 11 may be formed in the substrate 10. The device isolation layer 11 may be formed by etching the substrate 10 to form a device isolation trench (not shown) and filling the device isolation trench with an insulative material. The device isolation layer 11 may define a plurality of first active regions 12a and a second active region 12b of the substrate 10. The plurality of first active regions 12a may be provided in the cell array area CR of the substrate 10. The plurality of first active regions 12a may have bar shapes parallel extending in a third direction Z. The second active region 12b may be provided in the peripheral circuit area PR.

The substrate 10 may be a bulk silicon substrate, a silicon-on-insulator (SOI) substrate, a germanium substrate, a germanium-on-insulator (GOI) substrate, a silicon-germanium substrate, or an epitaxial layered substrate formed using a selective epitaxial growth process. The device isolation layer 11 may include, for example, silicon oxide, silicon nitride, and/or silicon oxynitride.

Figure 2A:
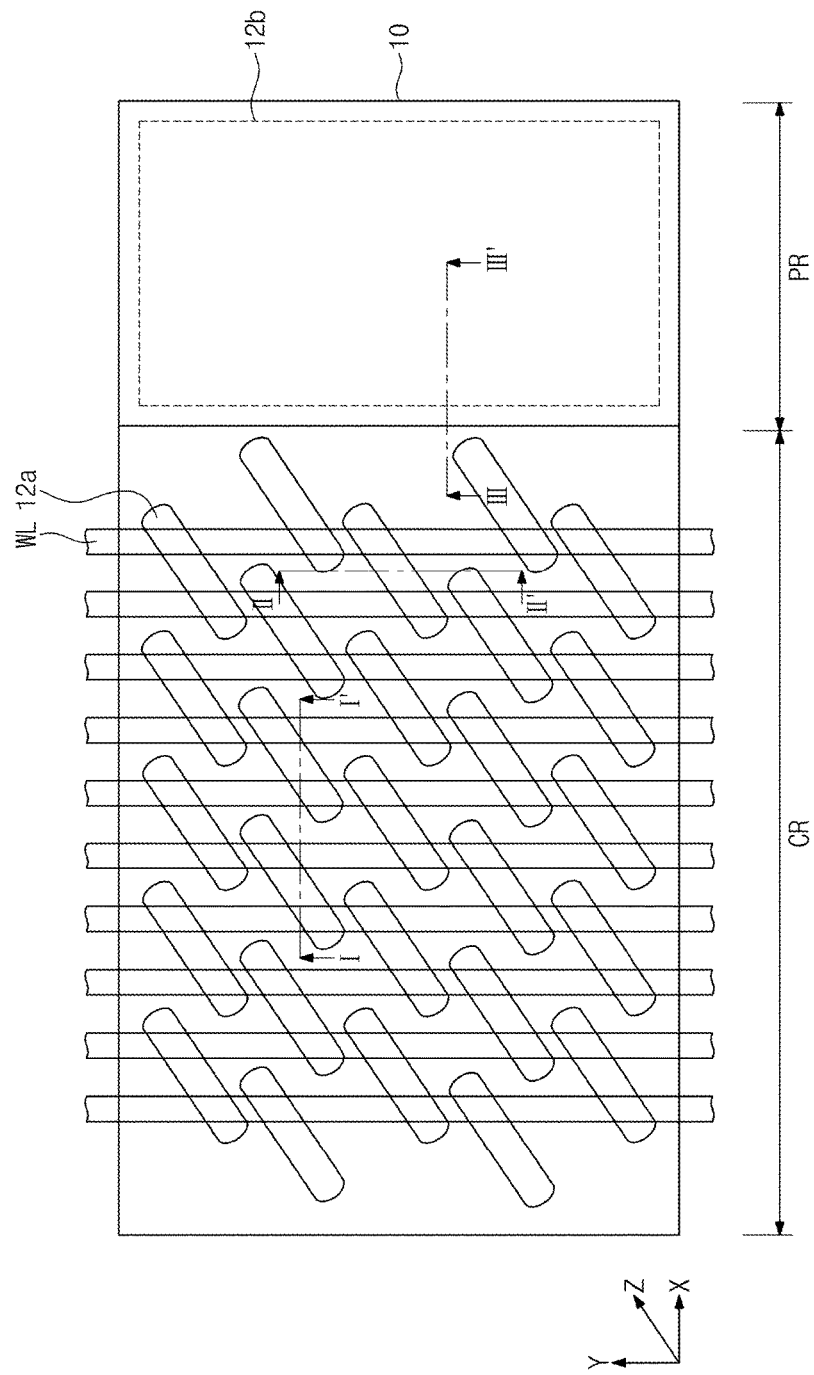
Figure 2B:
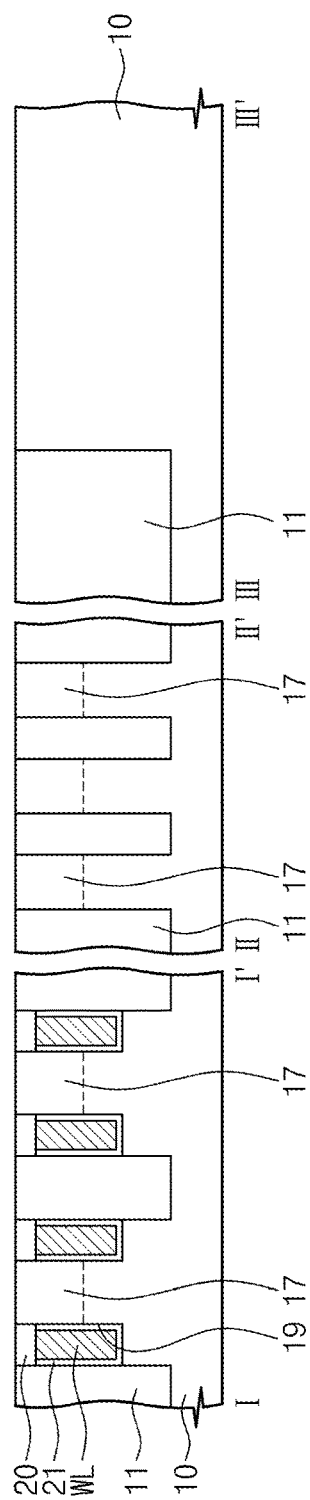

Referring to FIGS. 2A and 2B, a source/drain region 17 may be formed in the first active region 12a. The source/drain region 17 may be formed by performing an ion implantation process to place an ion mask on the substrate 10 to expose a portion of the first active region 12a and then to dope impurities into the exposed portion of the first active region 12a. In example embodiments, the source/drain region 17 may be formed by an ion implantation process to dope impurities into the first active region 12a without an ion mask.

A plurality of trenches 19 may be formed in the substrate 10 to run across the first active regions 12a. The trenches 19 may be arranged in a first direction X crossing the third direction Z and extend in a second direction Y crossing the first and third directions X and Z. Each of the first active regions 12a may include two trenches 19 running thereacross. The trenches 19 may have bottom surfaces higher than that of the device isolation layer 11.

A gate insulation layer 21 may be formed to conformally cover surfaces of the trenches 19. The gate insulation layer 21 may include an insulative material, for example, a thermal oxide layer.

Word lines WL may be formed in the trenches 19 whose surfaces are covered with the gate insulation layer 21. The word lines WL may be formed by forming a conductive layer filling the trenches 19. The word lines WL may include a conductive material, for example, polysilicon, doped polysilicon, metal, and/or metal silicide.

Upper portions of the gate insulation layer 21 and the word lines WL may be selectively removed to form capping patterns 20 in upper spaces of the trenches 19. The capping patterns 20 may be formed on the word lines WL and completely fill the trenches 19. The capping patterns 20 may include, for example, a silicon oxide layer, a silicon nitride layer, and/or a silicon oxynitride layer. For example, the capping pattern 20 may have a top surface coplanar with that of the first active region 12a. Alternatively, the capping pattern 20 may have a top surface higher than that of the first active region 12a.

Figure 3A:
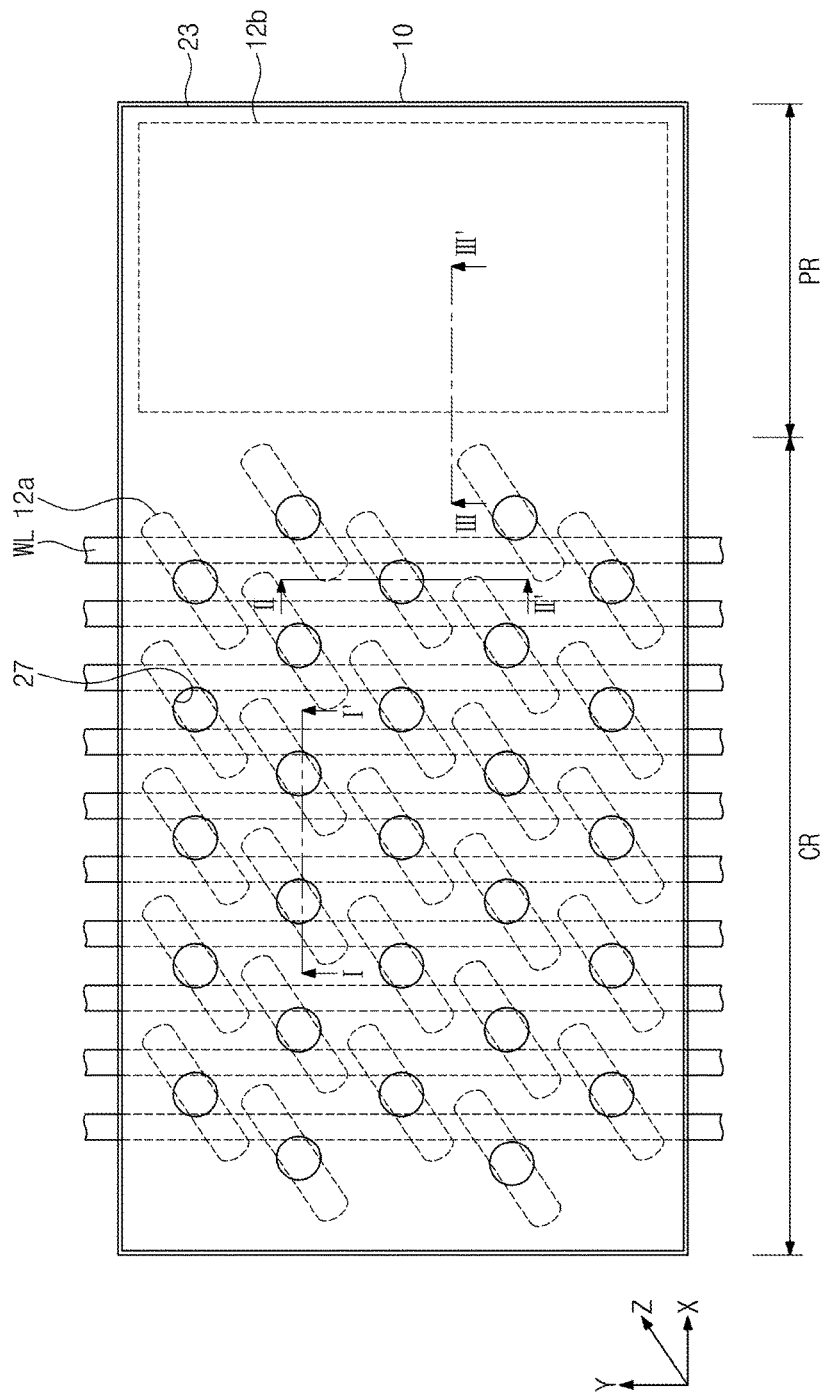
Figure 3B:
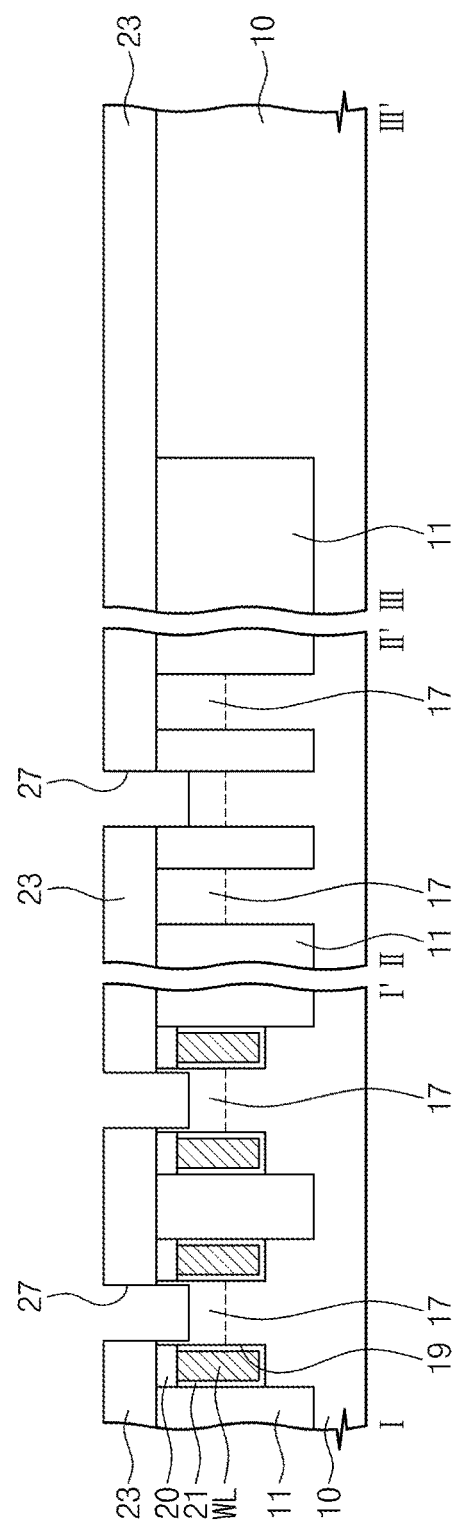

Referring to FIGS. 3A and 3B, a buffer layer 23 may be formed on the substrate 10. The buffer layer 23 may include, for example, a silicon oxide layer and a thermal oxide layer. A mask pattern (not shown) may be formed on the substrate 10 which exposes a portion of the buffer layer 23.

An etch process may be carried out to remove the exposed portion of the buffer layer 23 and a portion of the substrate 10. Accordingly, first contact holes 27 may be formed in an upper portion of the substrate 10. For example, the first contact holes 27 may be formed by etching portions of the substrate 10 which correspond to central portions of the first active regions 12a. As viewed in plan, the first contact hole 27 may reveal the source/drain region 17 between a pair of word lines WL which are overlapped by the first active region 12a.

Figure 4A:
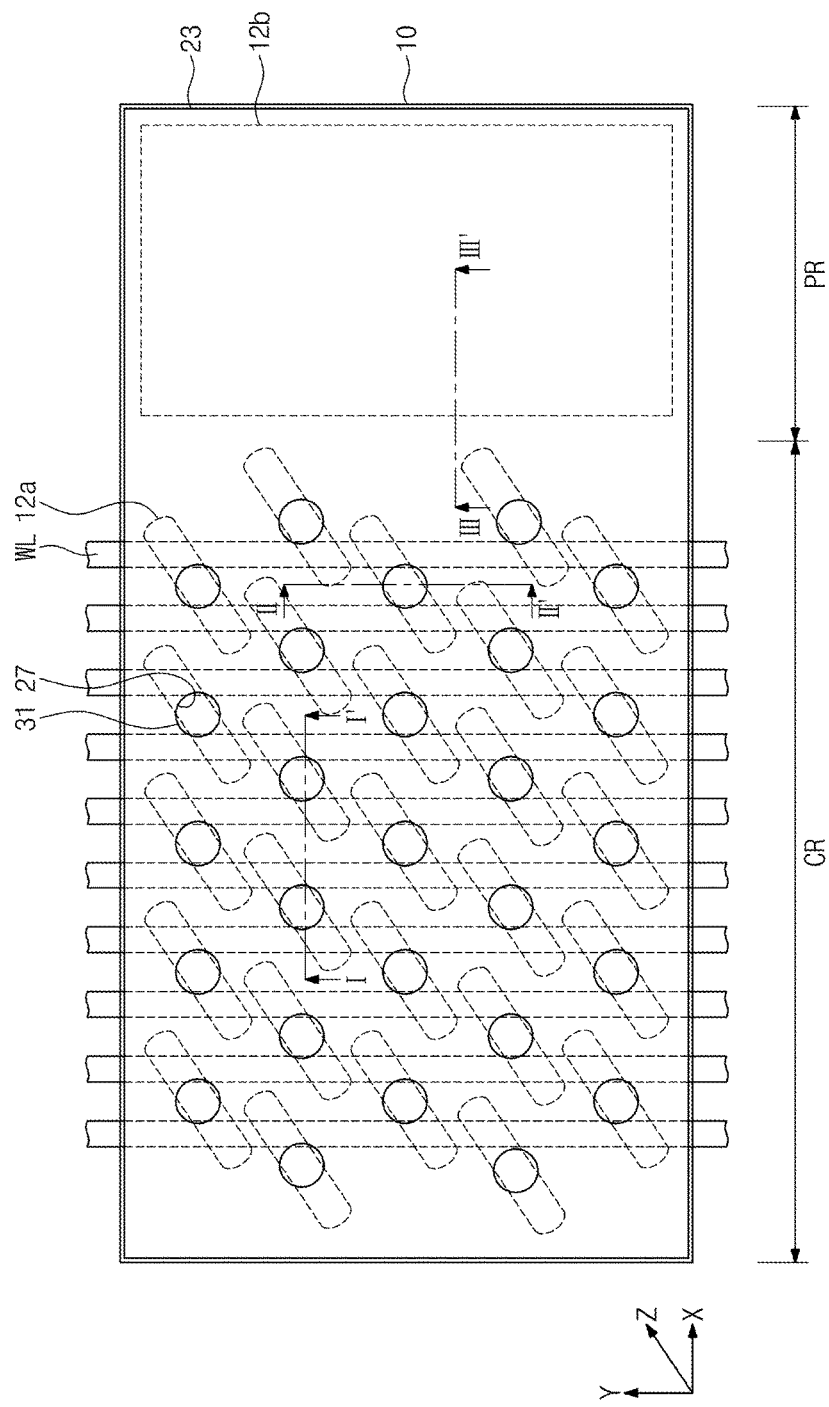
Figure 4B:
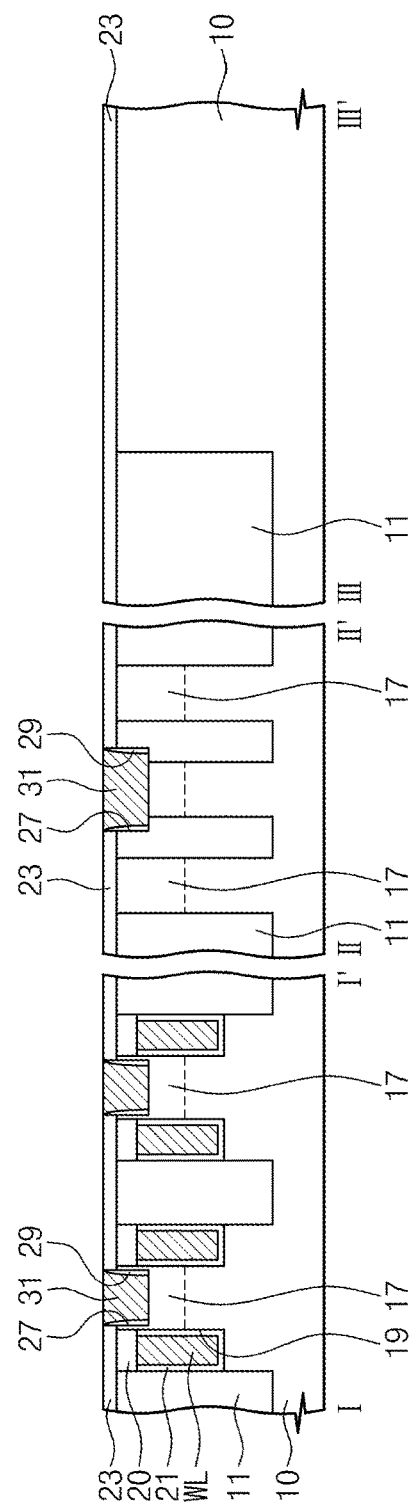

Referring to FIGS. 4A and 4B, first spacers 29 may be formed on sidewalls of the first contact holes 27. The first spacers 29 may be formed to cover the sidewalls of the first contact holes 27 while exposing the source/drain regions 17. The first spacer 29 may include an insulative material (e.g., silicon oxide and/or silicon nitride).

Bit line contacts 31 may be formed in the first contact holes 27. The bit line contacts 31 may be formed by forming a conductive layer (not shown) filling the first contact holes 27 on the buffer layer 10 and performing a planarization process (e.g., a CMP or etch back process) on the conductive layer until a top surface of the buffer layer 23 is exposed. During the planarization process, a thickness of the buffer layer 23 may be decreased. The bit line contacts 31 may include, for example, a metal silicide layer, a polysilicon layer, a metal nitride layer, and/or a metal layer.

Figure 5A:
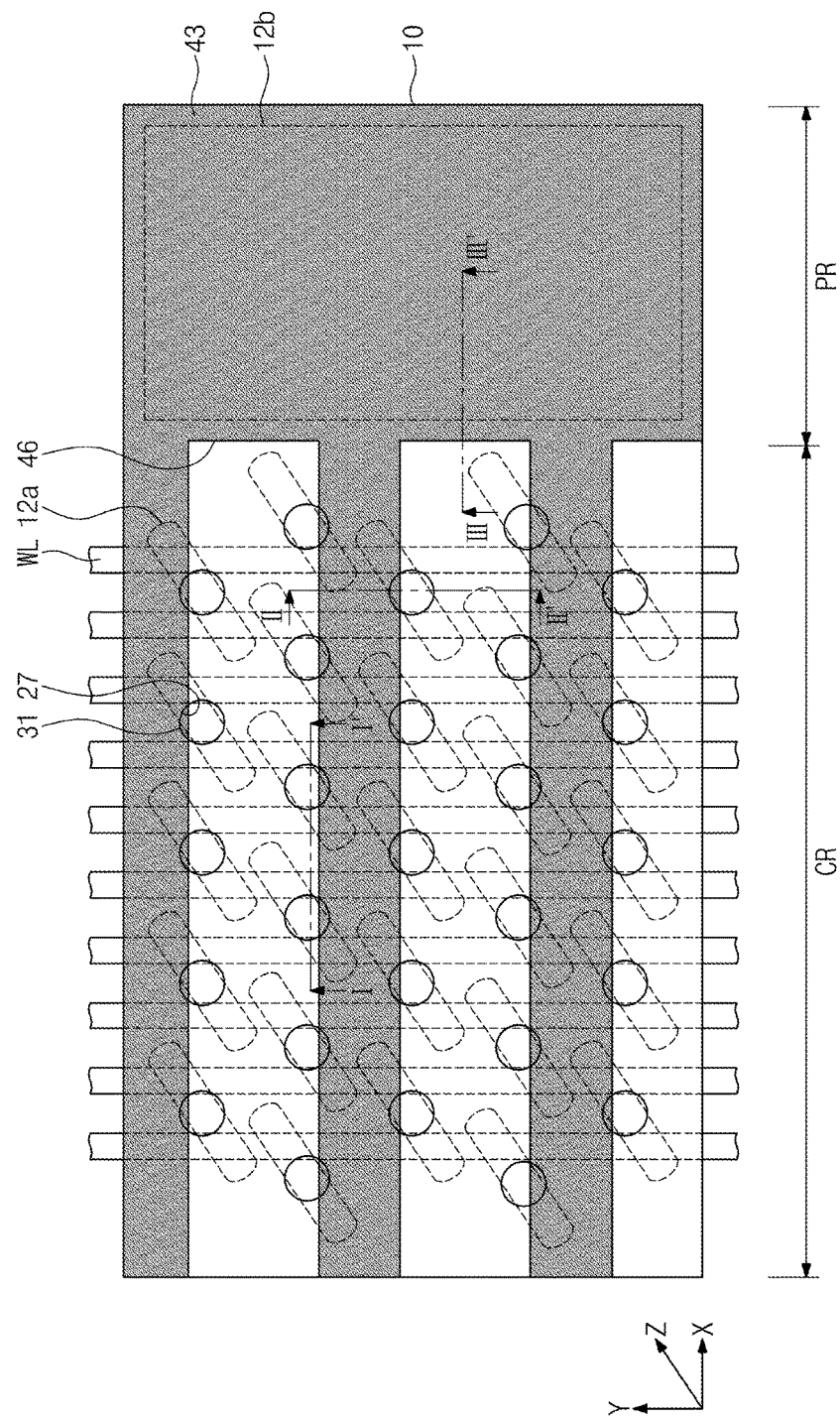
Figure 5B:
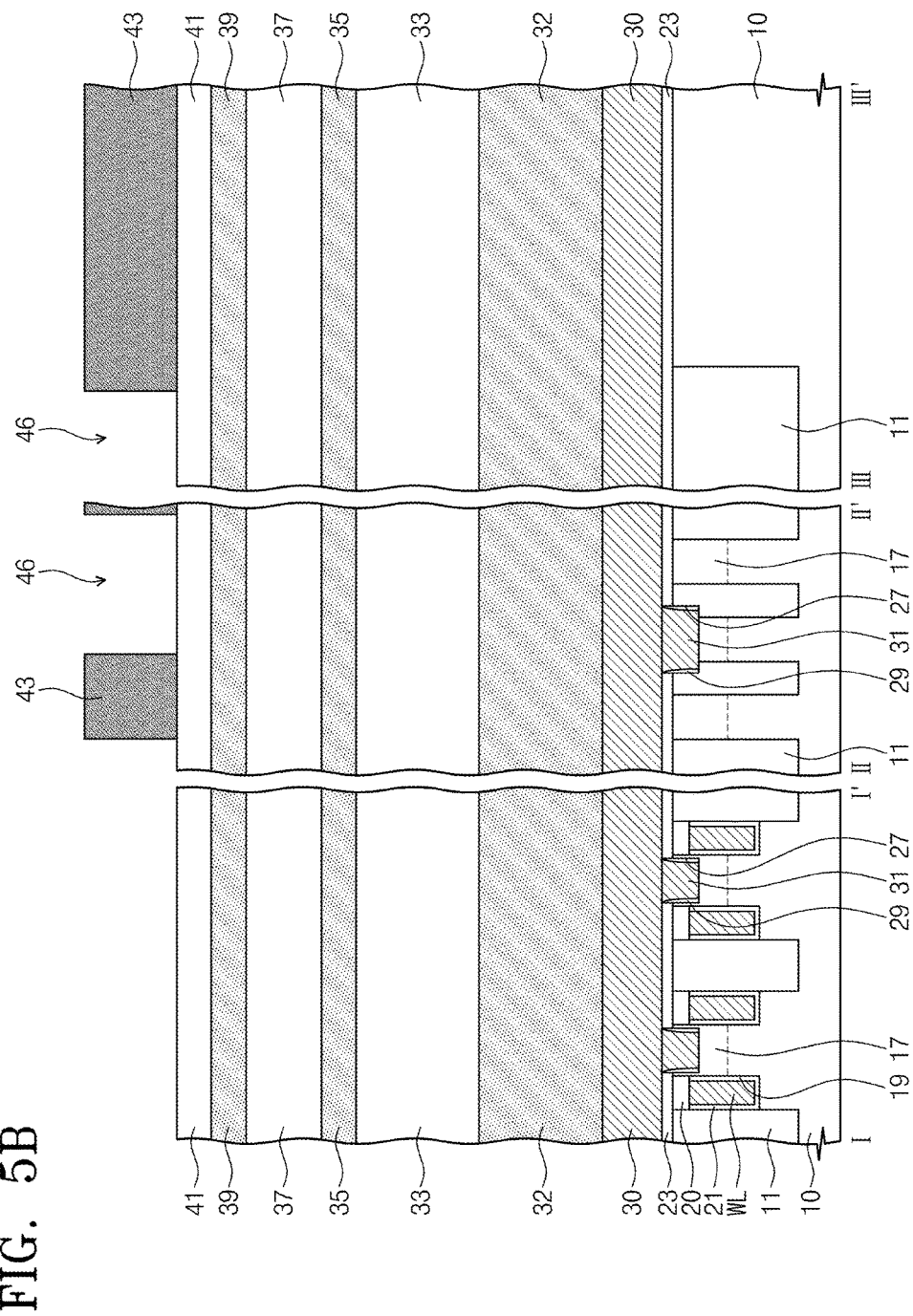

Referring to FIGS. 5A and 5B, one or more processes may be performed to form a conductive layer 30, a first mask layer 32, a second mask layer 33, a first etch stop layer 35, a third mask layer 37, a second etch stop layer 39, and a fourth mask layer 41 that are sequentially stacked on one another on the substrate 10.

The conductive layer 30 may cover the buffer layer 23 and the bit line contacts 31. The conductive layer 30 may be a single layered film or a multiple layered film. For example, the conductive layer 30 may include, for example, a silicon layer (e.g., polysilicon or doped polysilicon), a metal nitride layer (e.g., TiN, Ti/TiN, TiSiN, TaN, and/or WN), and/or a metal layer (e.g., W, Al, Cu, Ni and/or Co).

The first mask layer 32 may be formed on the conductive layer 30. The first mask layer 32 may include a material having etch selectivity with respect to the conductive layer 30. For example, the first mask layer 32 may be a silicon nitride layer and/or a silicon oxide layer. If the conductive layer 30 includes a silicon layer, the first mask layer 32 may include a silicon oxide layer. Alternatively, if the conductive layer 30 includes a metal layer, the first mask layer 32 may include a silicon nitride layer.

The second mask layer 33 may be formed on the first mask layer 32. The second mask layer 33 may include a material having etch selectivity with respect to the first mask layer 32. For example, the second mask layer 33 may include an amorphous carbon layer (ACL).

The first etch stop layer 35 may be formed on the second mask layer 33. The first etch stop layer 35 may include a material having etch selectivity with respect to the second mask layer 33 and a deposition layer which will be formed directly on the first etch stop layer 35. The first etch stop layer 35 may include, for example, silicon oxynitride (SiON).

The third mask layer 37 may be formed on the first etch stop layer 35. The third mask layer 37 may include a material having etch selectivity with respect to the second etch stop layer 35. For example, the third mask layer 37 may include a spin on hard mask layer.

The second etch stop layer 39 may be formed on the third mask layer 37. The second etch stop layer 39 may include a material having etch selectivity with respect to the second mask layer 37 and a deposition layer which will be formed directly on the second etch stop layer 39. The second etch stop layer 39 may include, for example, a silicon oxynitride (SiON) layer.

The fourth mask layer 41 may be formed on the second etch stop layer 39. The fourth mask layer 41 may include an anti-reflective coating material.

A first resist pattern 43 may be formed on the fourth mask layer 41. The first resist pattern 43 may cover the peripheral circuit area PR of the substrate 10. The first resist pattern 43 may have one or more openings 46. The openings 46 may be positioned on the cell array area CR of the substrate 10 and expose portions of the fourth mask layer 41 on the cell array area CR of the substrate 10. For example, as viewed in plan, the openings 46 may partially overlap with the bit line contacts 31.

Figure 6A:
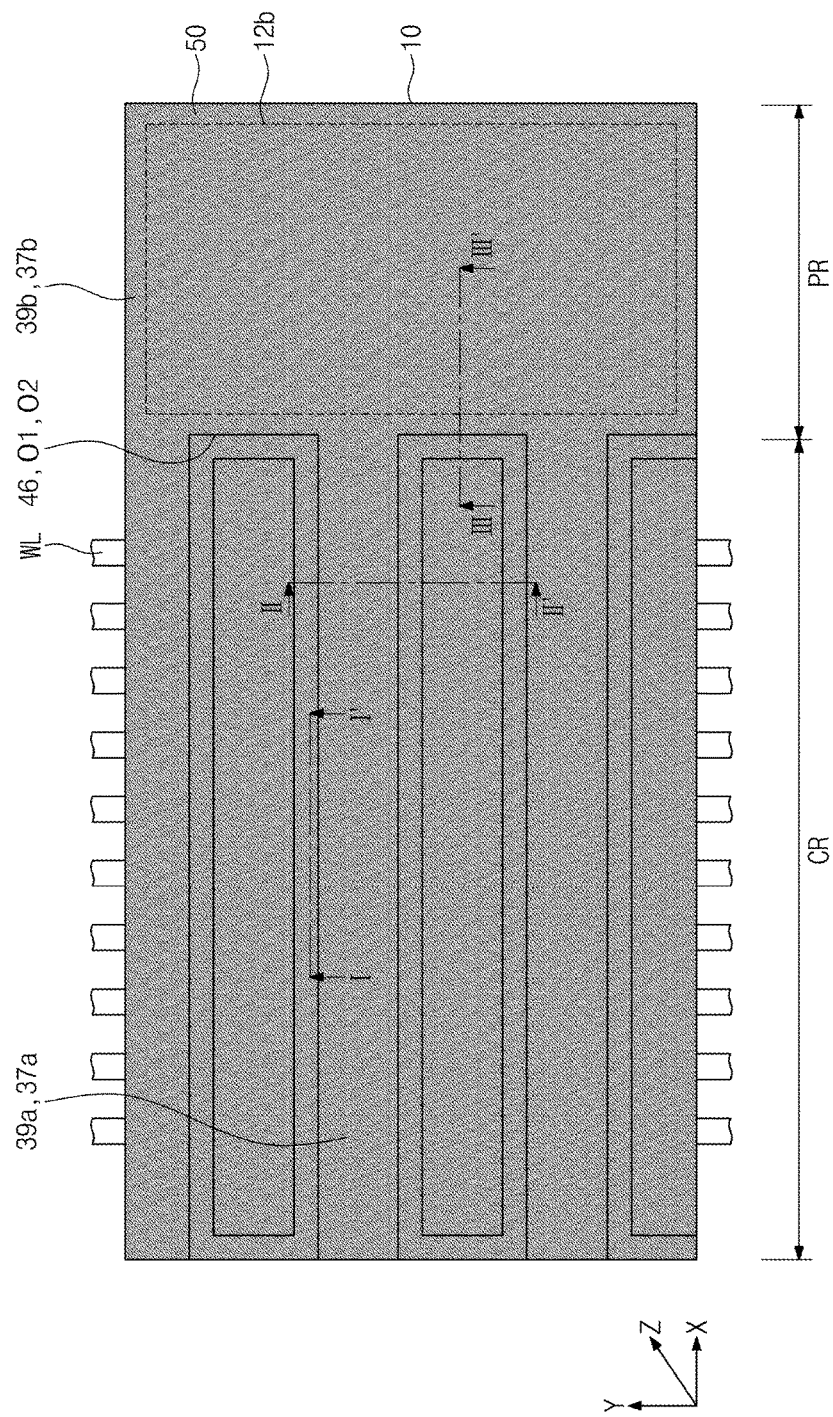
Figure 6B:
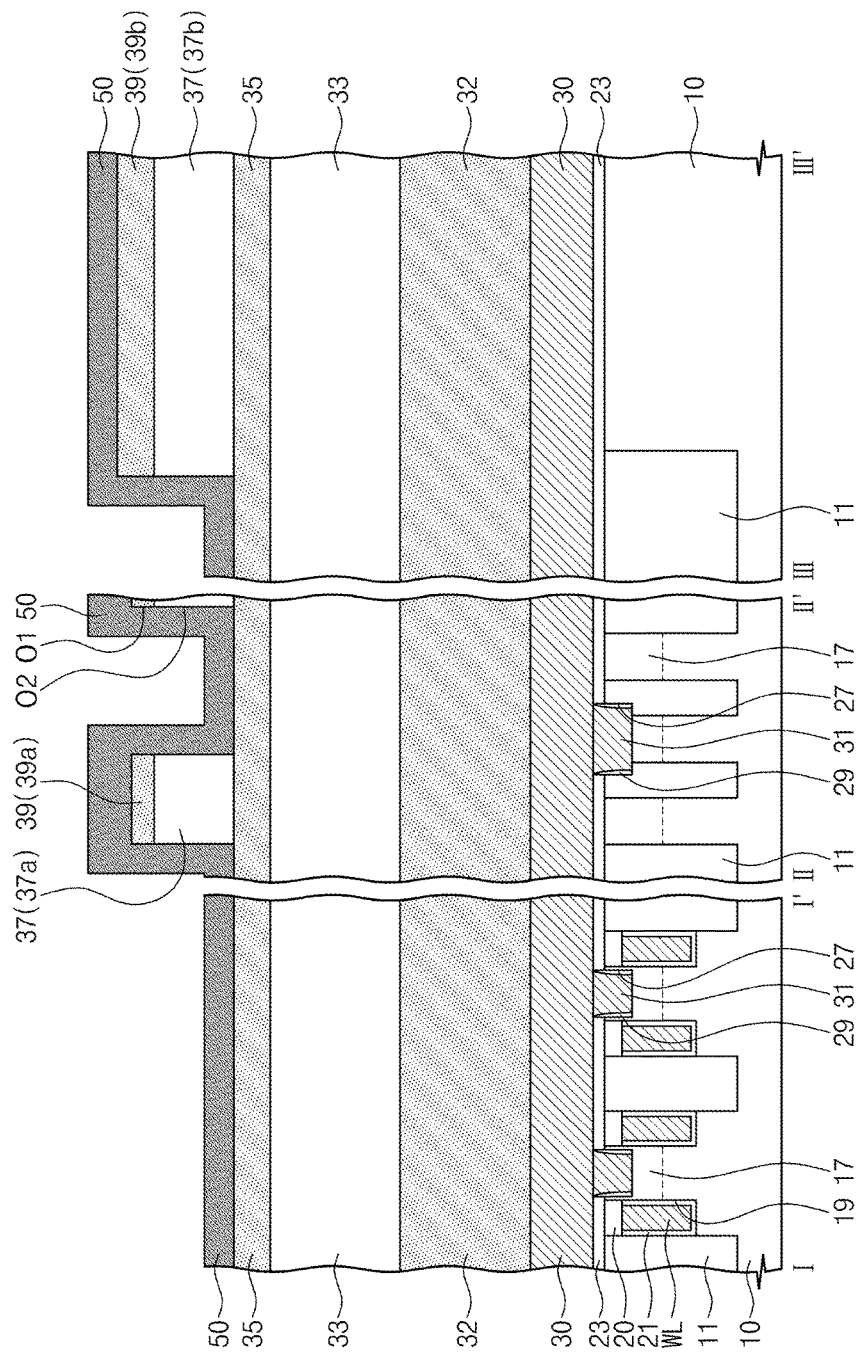

Referring to FIGS. 6A and 6B, the fourth mask layer 41, the second etch stop layer 39, and the third mask layer 37 may be sequentially etched using the first resist pattern 43 as an etch mask. Accordingly, first openings O1 may be formed in the second etch stop layer 39, and second openings O2 may be formed in the third mask layer 37. As viewed in plan, each of the first and second openings O1 and O2 may be aligned with the openings 46. When the second etch stop layer 39 and the third mask layer 37 are patterned, the first resist pattern 43 and the fourth mask layer 41 may be etched to be removed. The second etch stop layer 39 may be patterned to have exposed top and side surfaces.

The second etch stop layer 39 may include first portions 39a and a second portion 39b. The first portions 39a may be disposed on the cell array area CR of the substrate 10 and face to each other in the second direction Y with the first opening O1 interposed therebetween. The second portion 39b may be disposed on the peripheral circuit area PR of the substrate 10. The first portions 39a may extend in the first direction X and be in contact with the second portion 39b. For example, after the etch process for patterning the second etch stop layer 39, the second etch stop layer 39 may have a planar shape substantially the same as or similar to that of the first resist pattern 43 as shown in FIG. 5A.

As shown in FIG. 5A, the first resist pattern 43 may be divided into a first pattern on the peripheral circuit area PR of the substrate 10 and a second pattern on the cell array area CR of the substrate 10, and the first pattern may have an area or size greater than an area or size of the second pattern. During the etch process, the first pattern of the first resist pattern 43 may be etched faster than the second pattern of the first resist pattern 43 such that the second portion 39b of the second etch stop layer 39 may be exposed earlier than the first portions 39a of the second etch stop layer 39. The first portions 39a of the second etch stop layer 39 may experience the etch process in a state that the second portion 39b of the second etch stop layer 39 is still covered with the second pattern of the first resist pattern 43, such that the first portions 39a of the second etch stop layer 39 may have first thicknesses less than a second thickness of the second portion 39b of the second etch stop layer 39.

The third mask layer 37 may include first portions 37a and a second portion 37b. The first portions 37a may be disposed on the cell array area CR of the substrate 10 and face to each other in the second direction Y with the second opening O2 interposed therebetween. The second portion 37b may be disposed on the peripheral circuit region CR of the substrate 10. The first portions 37a may extend in the first direction X and be in contact with the second portion 37b. For example, after the etch process for patterning the third mask layer 137, the third mask layer 37 may have a planar shape substantially the same as or similar to that of the first resist pattern 43 as shown in FIG. 5A.

A spacer layer 50 may be formed on the second etch stop layer 39. The spacer layer 50 may uniformly cover a top surface of the second etch stop layer 39, sidewalls of the third mask layer 37 which are exposed through the second opening O2, sidewalls of the second etch stop layer 39 which are exposed through the first opening O1, and a top surface of the first etch stop layer 35 which is exposed through the first and second openings O1 and O2. The spacer layer 50 may be formed by, for example, an atomic layer deposition (ALD) process. The spacer layer 50 may include, for example, a silicon oxide layer.

Figure 7B:
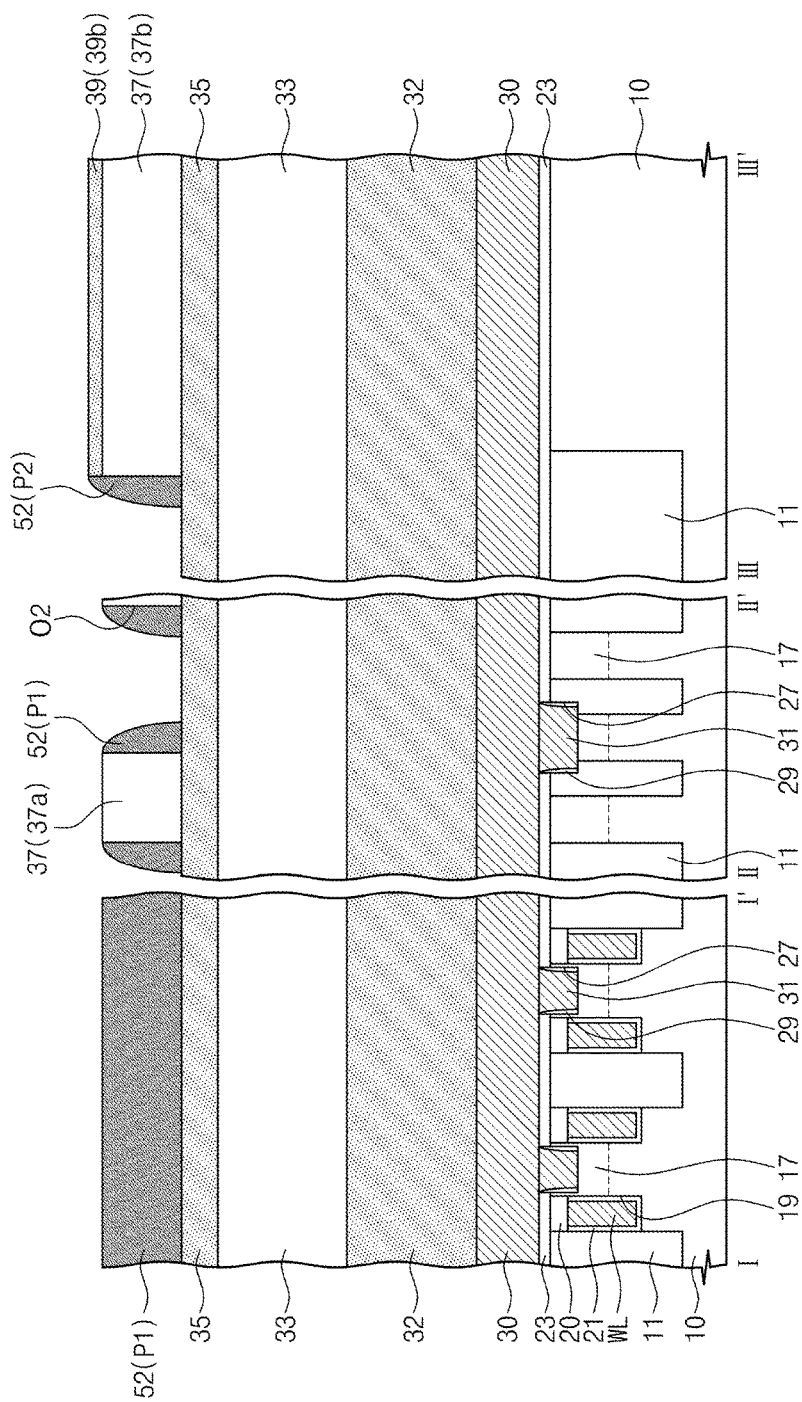

Referring to FIGS. 7A and 7B, a spacer etch process may be performed to partially etch the spacer layer 50 on the top surfaces of the first and second etch stop layers 35 and 39, which may form bit line mask layers 52. Each of the bit line mask layers 52 may be formed in the second opening O2 of the third mask layer 37. The spacer etch process may be carried out until the top surfaces of the first and second etch stop layers 35 and 39 are revealed. The spacer etch process may remove the first portions 39a of the second etch stop layer 39 to expose top surfaces of the first portions 37a of the third mask layer 37.

The second portion 39b of the second etch stop layer 39 may remain on the second portion 37b of the third mask layer 37. For example, the second portion 39b of the second etch stop layer 39 after the spacer etch process may have a third thickness which is obtained by subtracting the first thickness of the first portion 39a from the second thickness of the second portion 39b, as shown in FIG. 6B, before the spacer etch process. Each of the bit line mask layers 52 may include a pair of first portions P1 and a pair of second portions P2 connected to the pair of first portion P1. The first portions P1 of the bit line mask layer 52 may cover sidewalls of the first portions 37a of the third mask layer 37. As viewed in plan, the pair of first portions P1 of the bit line mask layer 52 may extend in parallel in the first direction X. At least one of the pair of second portions P2 of the bit line mask layer 52 may cover a sidewall of the second portion 39b of the second mask layer 39 and a sidewall of the second portion 37b of the third mask layer 37. As viewed in plan, the bit line mask layer 52 may have, for example, a rectangular shape extending along an inner wall of the second opening O2.

For example, the first portions P1 of the bit line mask layer 52 may have thicknesses less than those of the second portions P2 of the bit line mask layer 52.

Figure 8A:
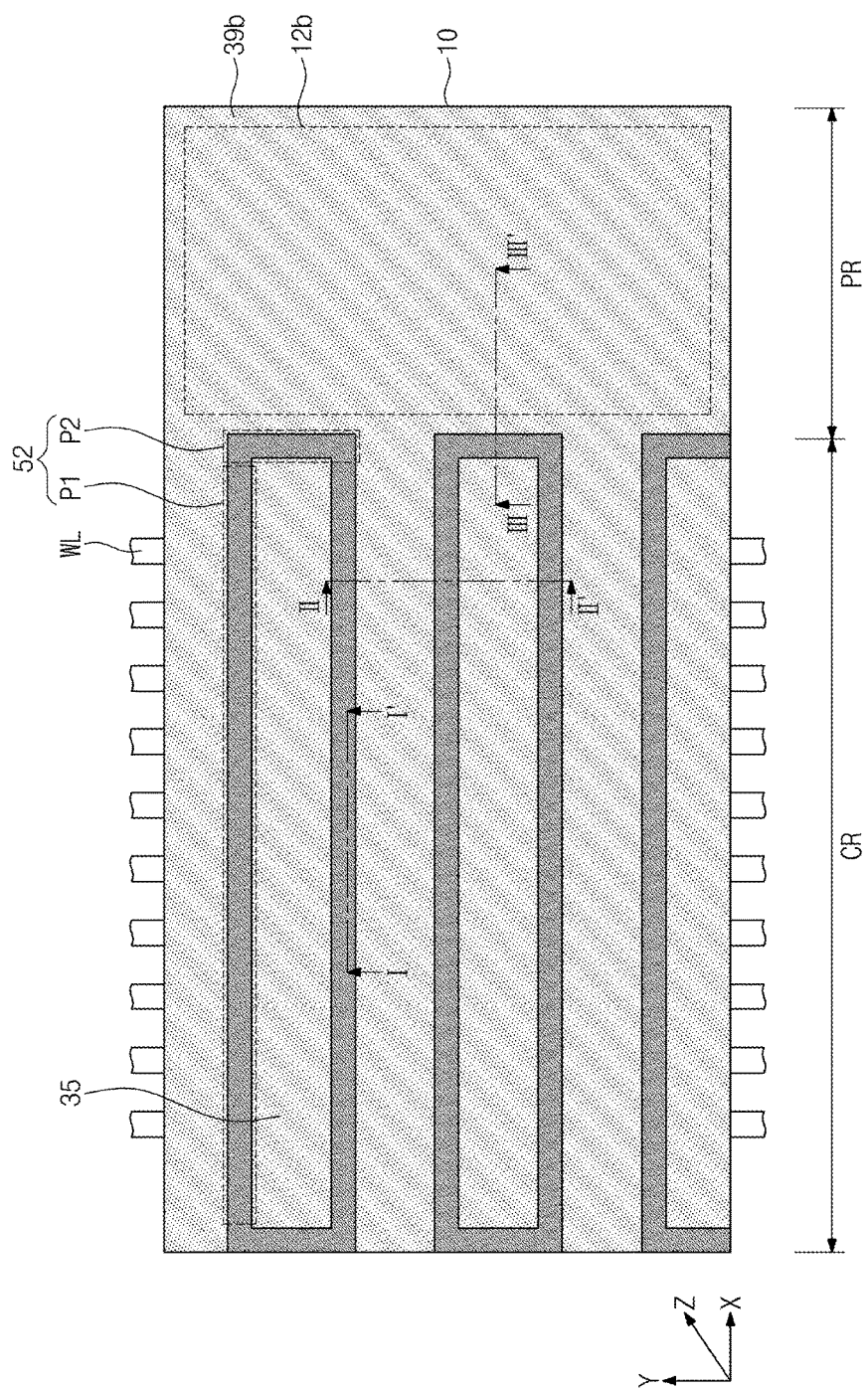
Figure 8B:
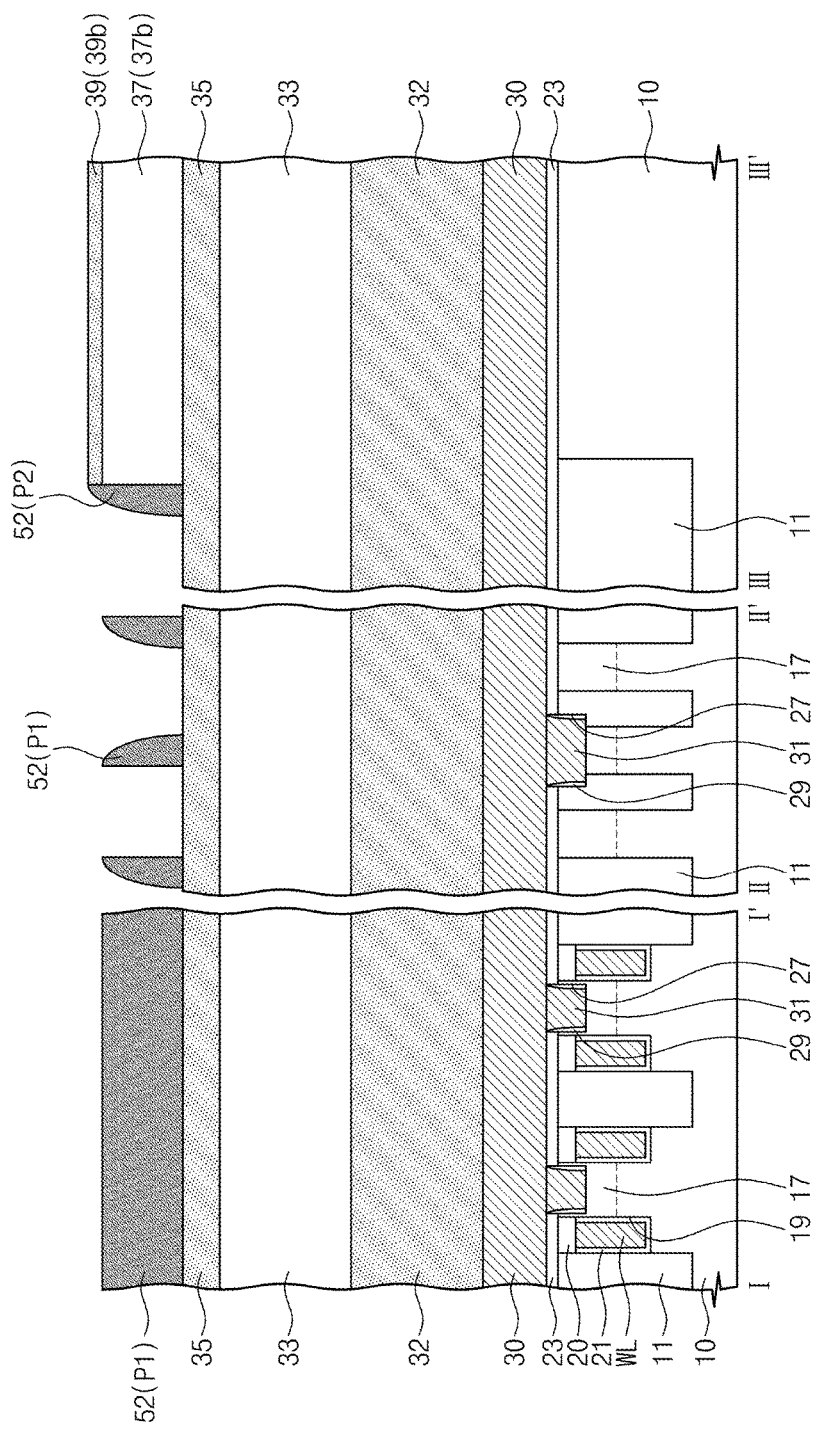

Referring to FIGS. 8A and 8B, an etch process may be performed to remove the first portions 37a of the third mask layer 37. Accordingly, the etch process may partially reveal the first etch stop layer 35 on the cell array area CR of the substrate 10, except portions of the first etch stop layer 35 on which the bit line mask layers 52 are formed. During the etch process for removing the first portions 37a of the third mask 37, the second portion 37b of the third mask layer 37 may still be covered with the second portion 39b of the second etch stop layer 39 and may not be removed. In addition, the second portion 39b of the second etch stop layer 39, the bit line mask layer 52, and the first etch stop layer 35 may not be removed during the etch process.

Figure 9A:
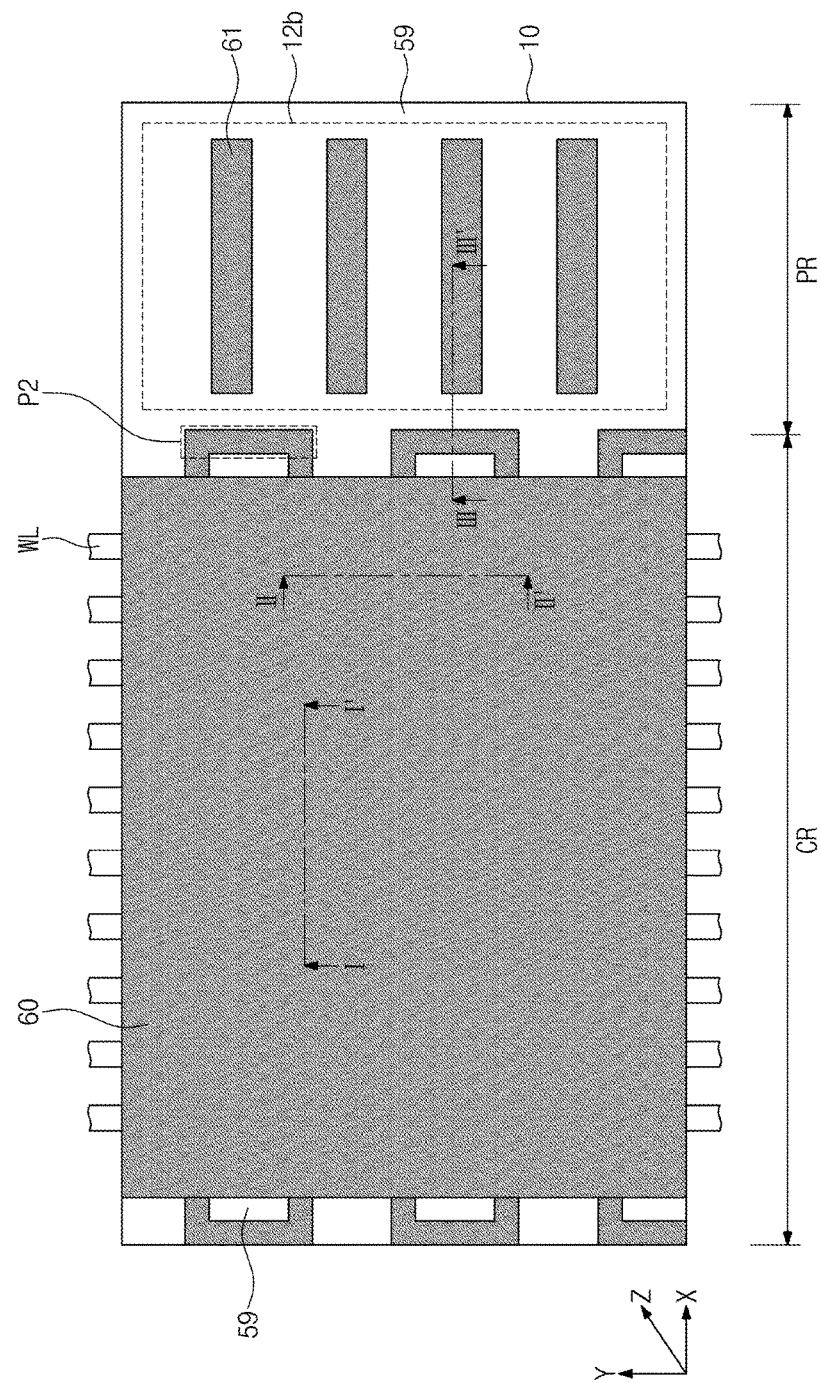
Figure 9B:
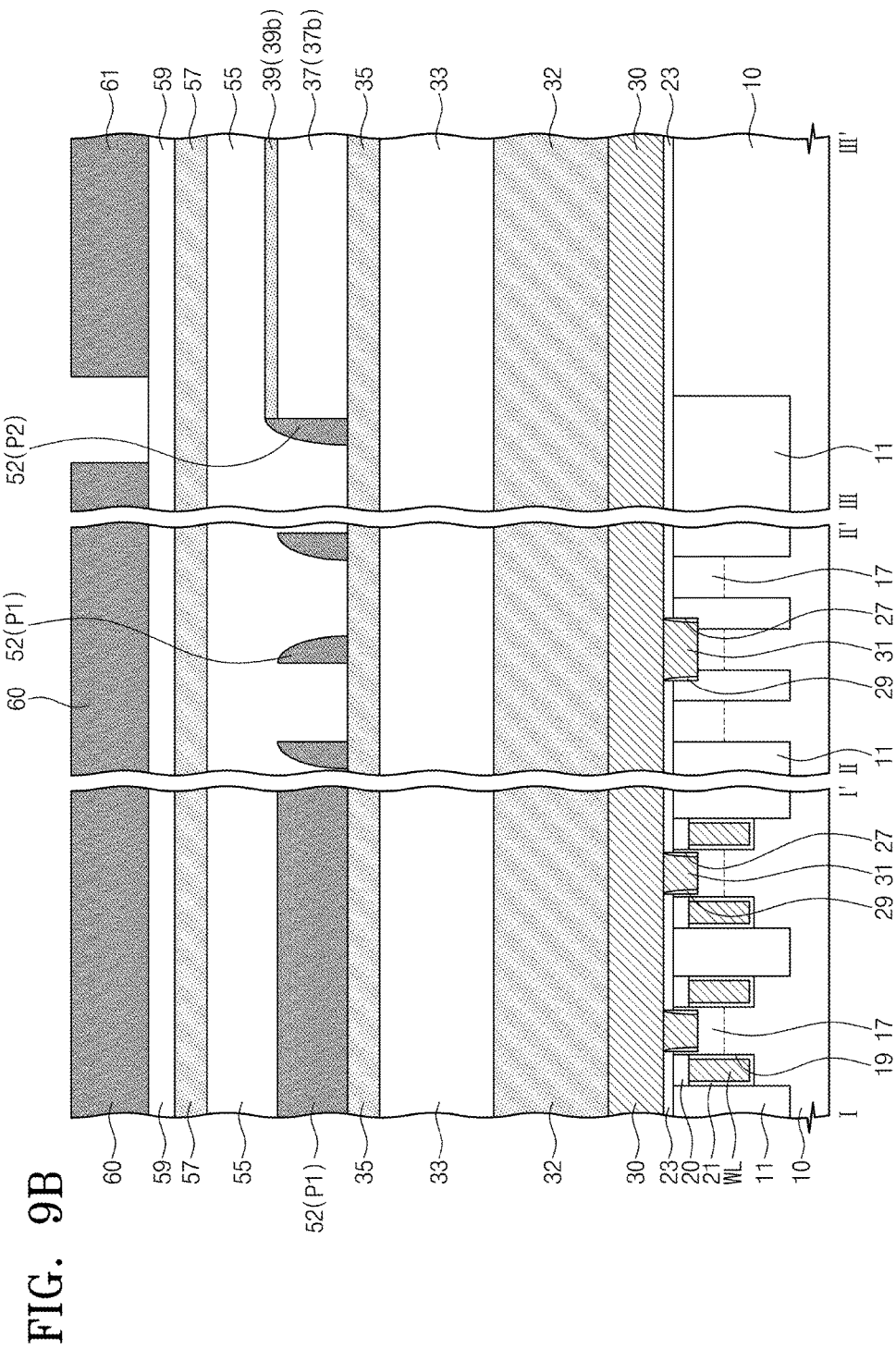

Referring to FIGS. 9A and 9B, a fifth mask layer 55, a third etch stop layer 57, and a sixth mask layer 59 may be sequentially formed on the first etch stop layer 35 and the second portion 39b of the second etch stop layer 39.

The fifth mask layer 55 may cover the first etch stop layer 35 and the second portion 39b of the second etch stop layer 39. The fifth mask layer 55 may fill an inner space enclosed by the bit line mask layer 52 and cover the first and second portions P1 and P2 of the bit line mask layer 52. The fifth mask layer 55 may include, for example, a spin on hard mask layer.

The third etch stop layer 57 may cover the fifth mask layer 55. The third etch stop layer 57 may include, for example, a silicon oxynitride (SiON) layer.

The sixth mask layer 59 may cover the third etch stop layer 57. The sixth mask layer 59 may include, for example, an anti-reflective coating material.

Next, a second resist pattern 60 and a third resist pattern 61 may be formed on the sixth mask layer 59. The second resist pattern 60 may be formed on the cell array area CR of the substrate 10. For example, as viewed in plan, the second resist pattern 60 may completely or partially cover the first portions P1 of the bit line mask layers 52 and expose the second portions P2 of the bit line mask layers 52. In other words, as viewed in cross-sectional view, the second resist pattern 60 may vertically overlap with the first portions P1 of the bit line mask layers 52.

Figure 15A:
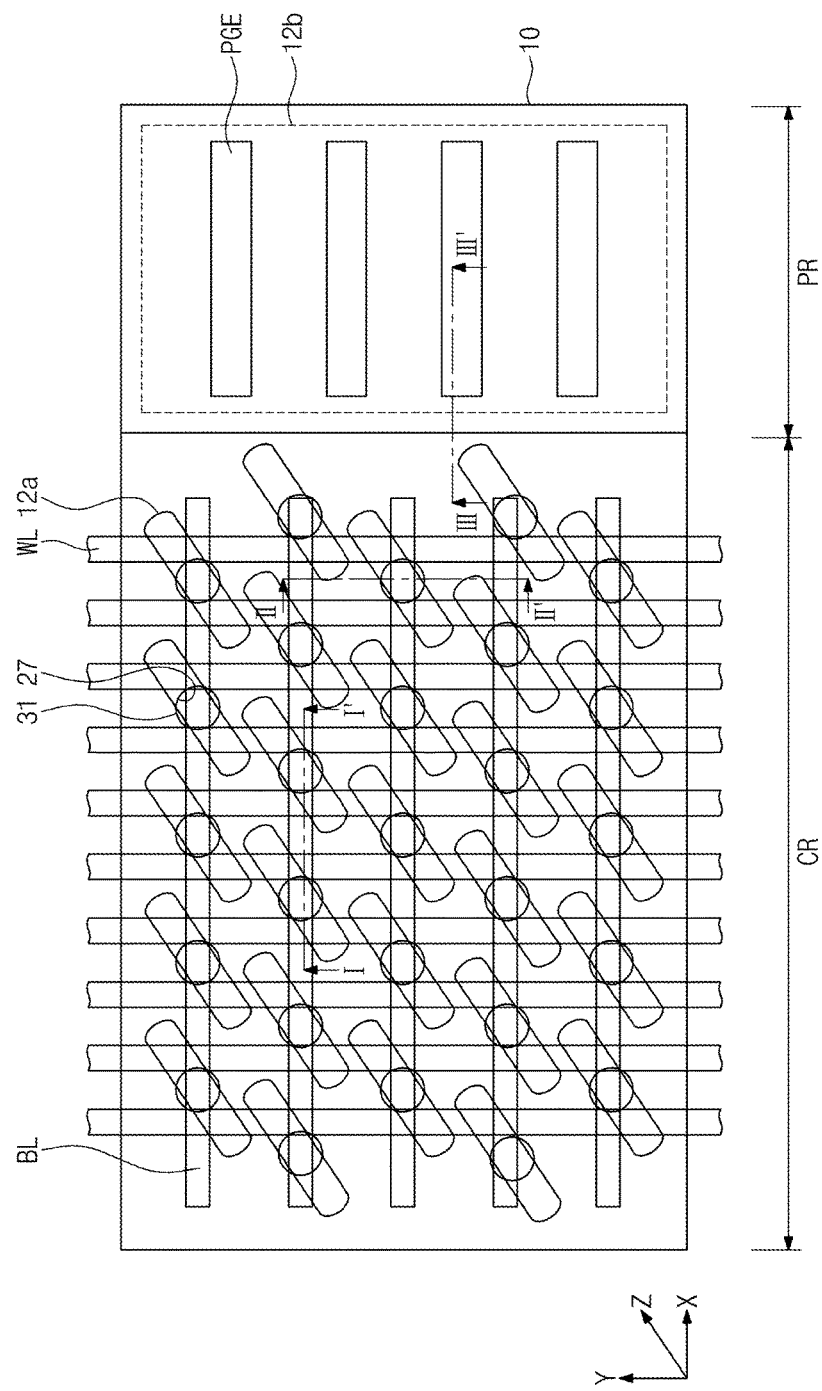
Figure 15B:
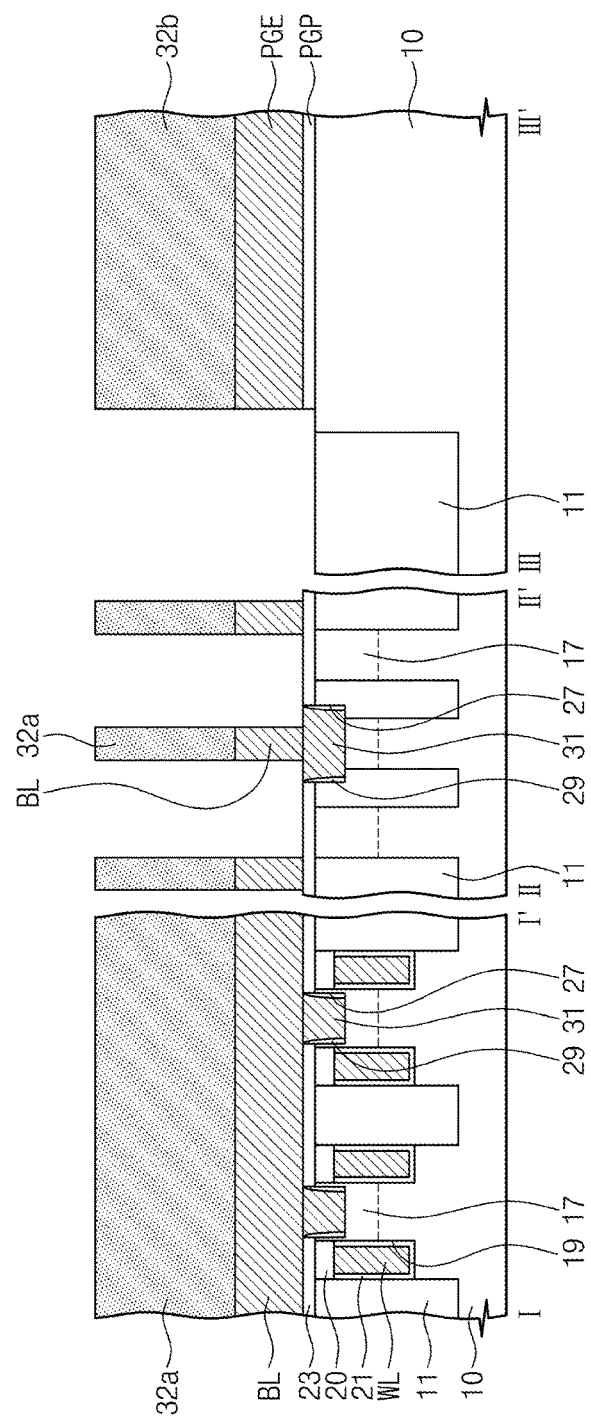

The third resist pattern 61 may be formed on the peripheral circuit area PR of the substrate 10. For example, the third resist pattern 61 may be locally formed on the second active region 12b. The area in which the third resist pattern 61 may correspond to an area in which a peripheral gate electrode PGE of FIGS. 15A and 15B is formed through a subsequent process. A portion of the fifth mask layer 59 may be exposed on the peripheral circuit area PR of the substrate 10 by the third resist pattern 61.

Figure 10A:
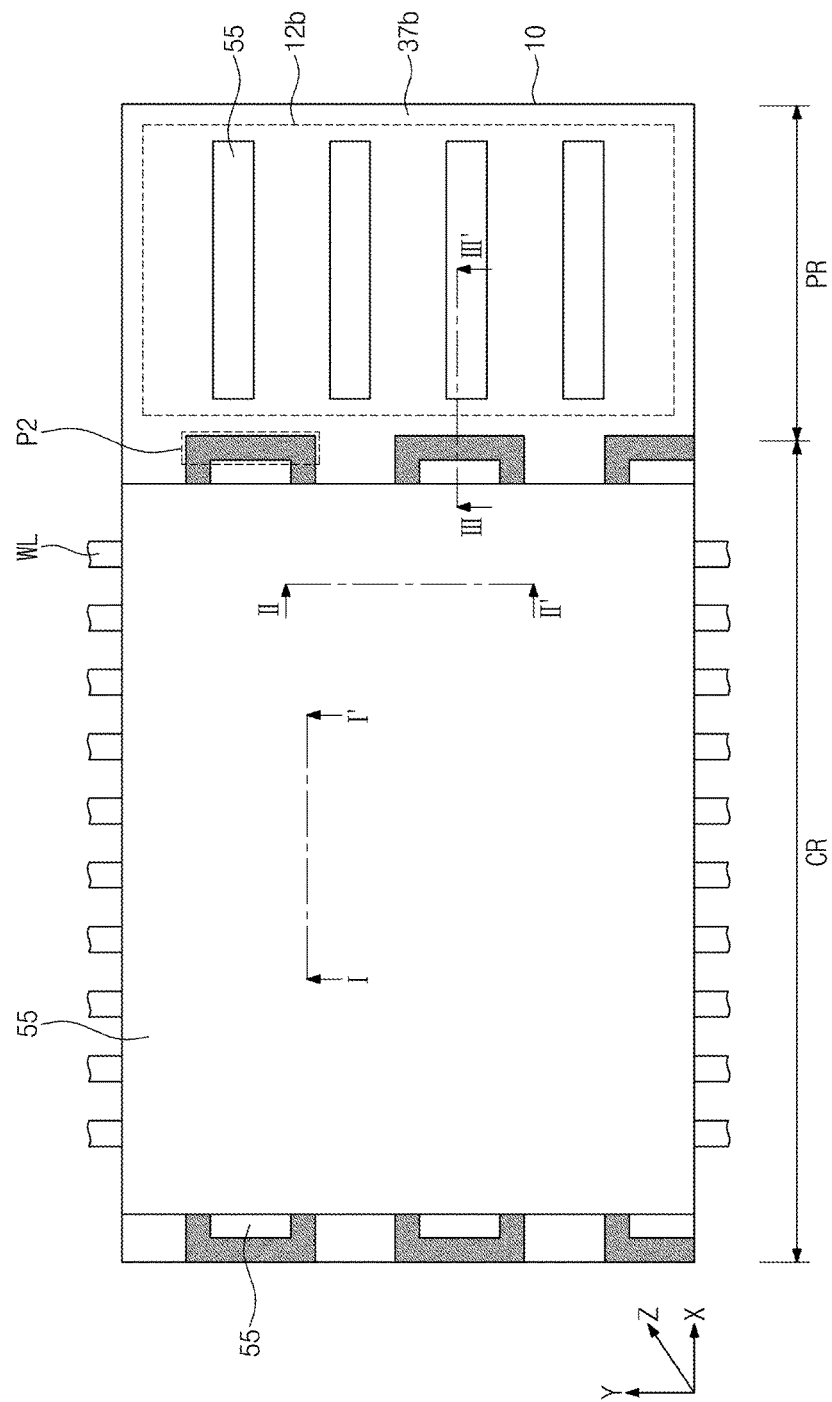
Figure 10B:
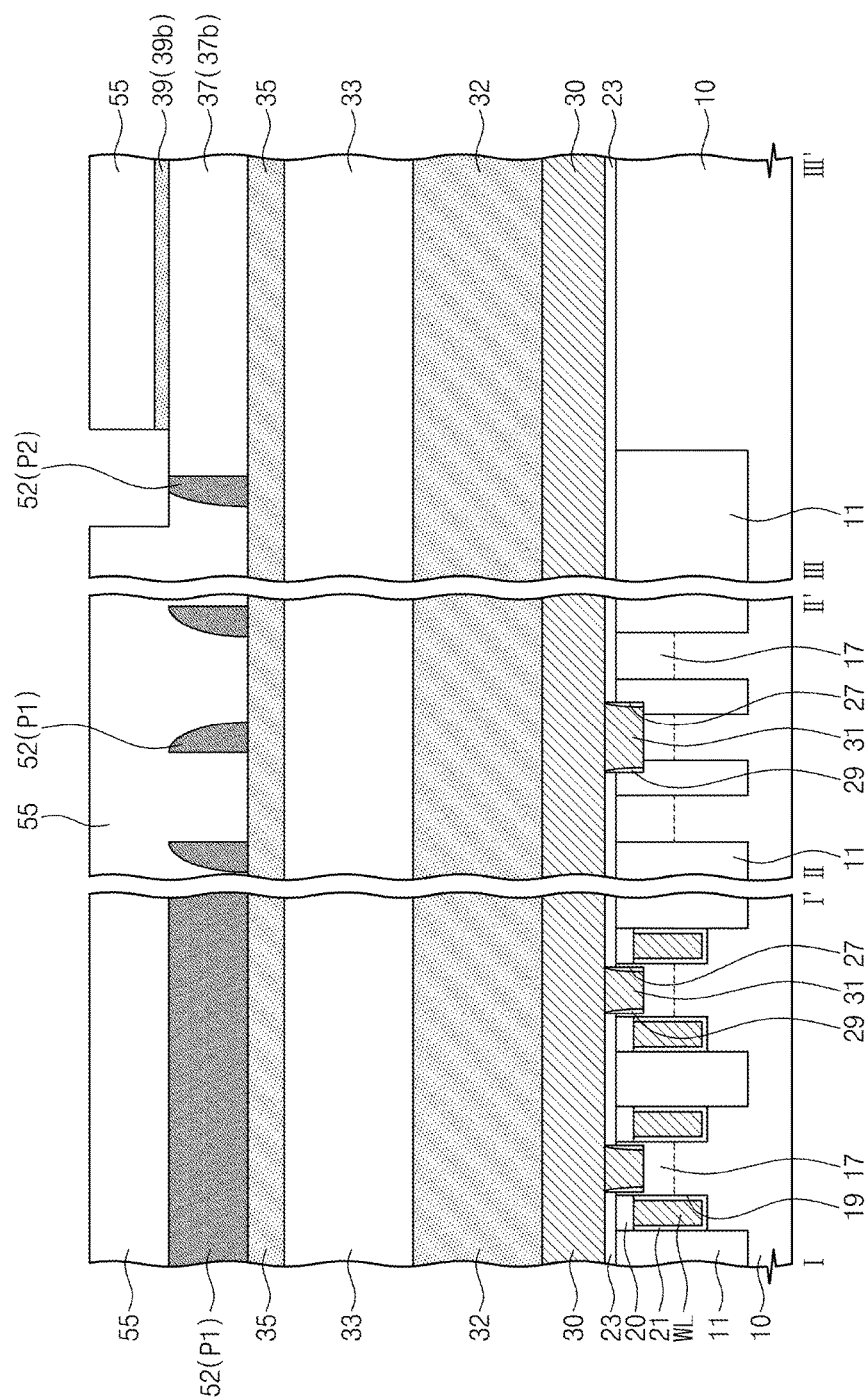

Referring to FIGS. 10A and 10B, the sixth mask layer 59, the third etch stop layer 57, the fifth mask layer 55, and the second portion 39b of the second etch stop layer 39 may be partially etched using the second and third resist patterns 60 and 61 as an etch mask. Accordingly, the etch process may partially expose the second portion P2 of the bit line mask layer 52 and the second portion 37b of the third mask layer 37. During the etch process, the second and third resist patterns 60 and 61, the sixth mask layer 59, and the third etch stop layer 57 may be etched together to be removed. Therefore, the fifth mask layer 55 may be exposed.

The fifth mask layer 55 and the second portion 39b of the second etch stop layer 39 may be partially removed to expose a top surface of the second portion P2 of the bit line mask layer 52, a sidewall of the second portion 39b of the second etch stop layer 39, and a portion of a top surface of the second portion 37b of the third mask layer 37. For example, the second portion 39b of the second etch stop layer 39 may be used as a mask pattern for forming a peripheral gate electrode PGE of FIGS. 15A and 15B which is formed on the peripheral circuit area PR of the substrate 10. In example embodiments, the second portion P2 of the bit line mask layer 52 may be partially removed. The partially removed second portion P2 of the bit line mask layer 52 may have a top surface coplanar to the exposed top surface of the second portion 37b of the third mask layer 37.

Figure 11A:
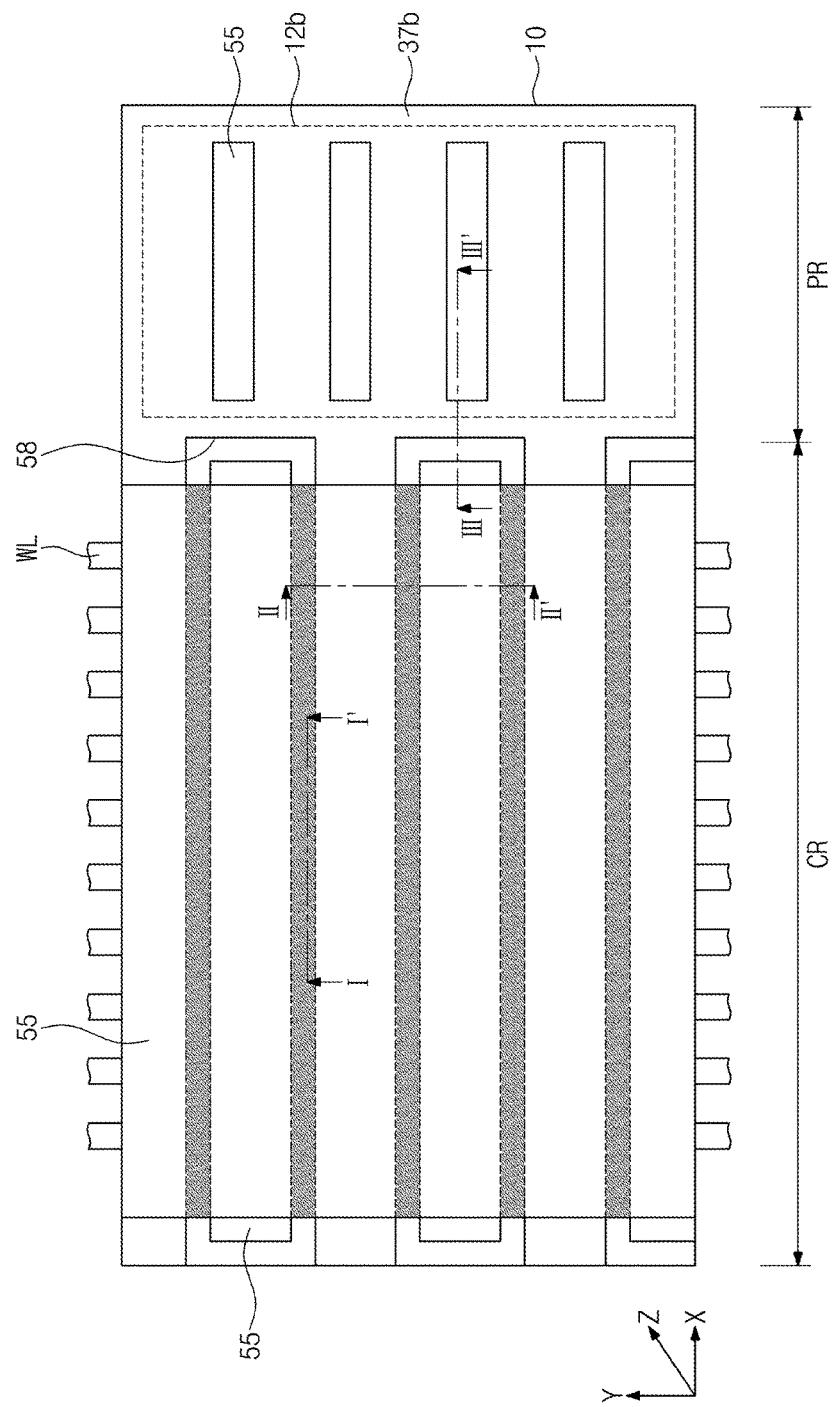
Figure 11B:
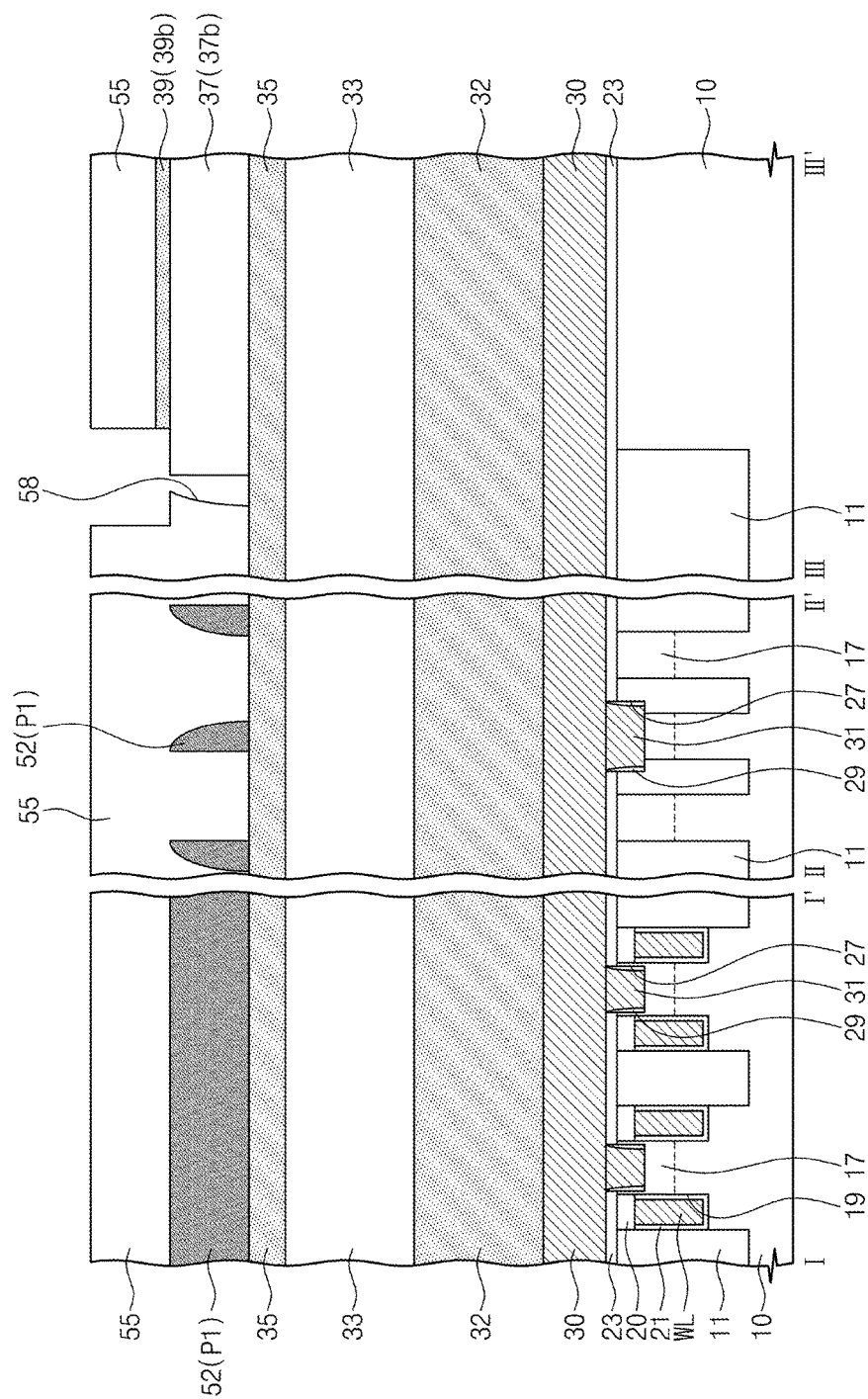

Referring to FIGS. 11A and 11B, the exposed second portion P2 of the bit line mask layer 52 may be removed to form a hollow space 58 in the second portion 37b of the third mask layer 37. The hollow space 58 may expose sidewalls of the second portion 37b of the third mask layer 37 and a portion of the top surface of the first etch stop layer 35. To remove the second portion P2 of the bit line mask layer 52, it may be desirable to use an etch recipe having etch selectivity with the first etch stop layer 35, the second portion 37b of the third mask layer 37, the second portion 39b of the second etch stop layer 39, and the fifth mask layer 55. For example, the second portion P2 of the bit line mask layer 52 may be removed by a wet etch process based on a hydrofluoric acid (HF). Therefore, the pair of first portions P1 of the bit line pattern 52 may be divided into two pieces spaced apart from each other in the second direction Y.

In example embodiments, the dividing the pair of first portions P1 of the bit line mask layer 52 may be performed simultaneously or contemporaneously with forming the mask pattern (i.e., the second portion 39b of the second etch stop layer 39) for a peripheral gate pattern which will be formed in the peripheral circuit area PR of the substrate 10. As a result, the method of example embodiments may reduce the number of process operations and manufacturing cost.

The divided first portions P1 of the bit line mask layer 52 may also be referred to hereinafter as bit line mask patterns 52a.

Figure 12A:
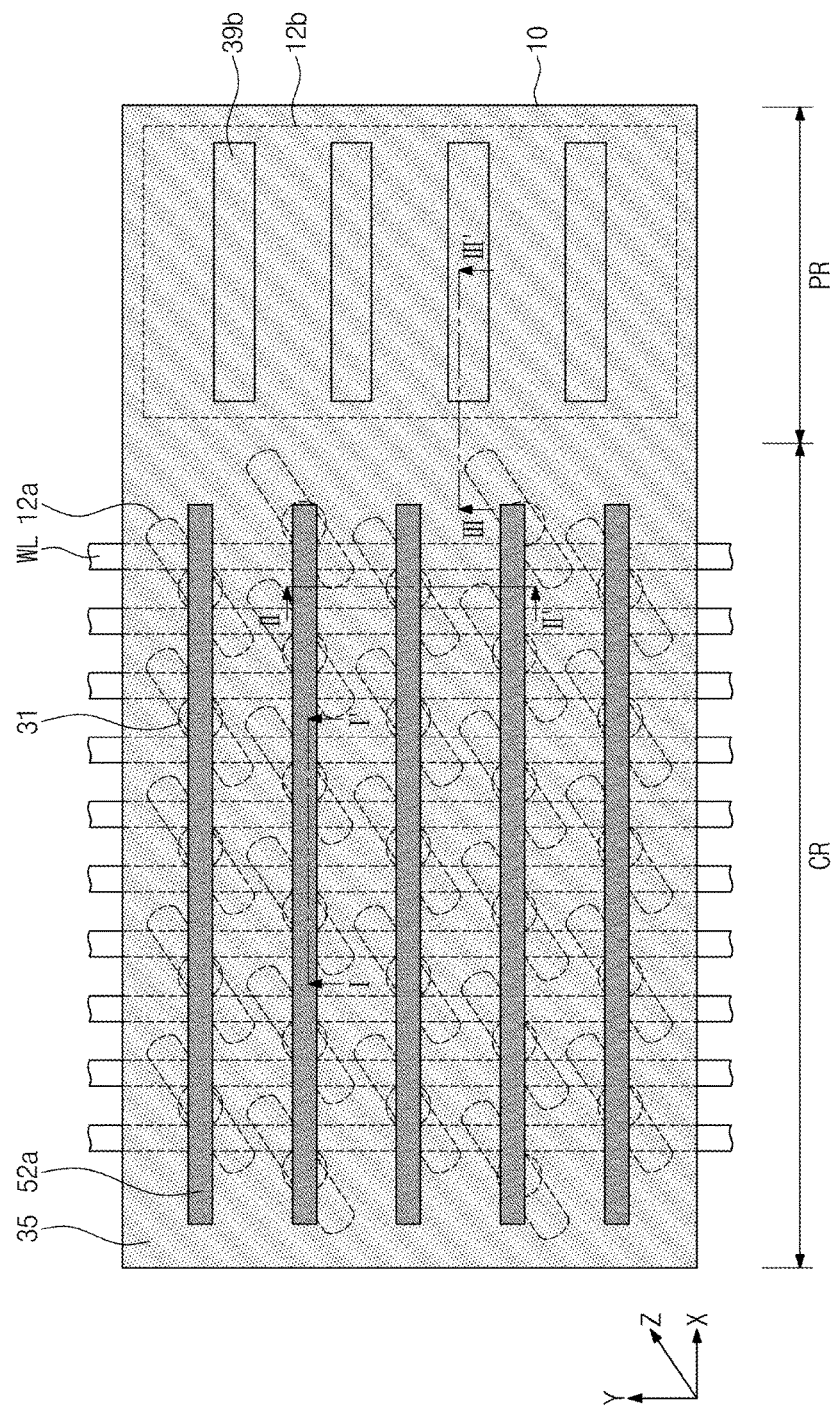
Figure 12B:
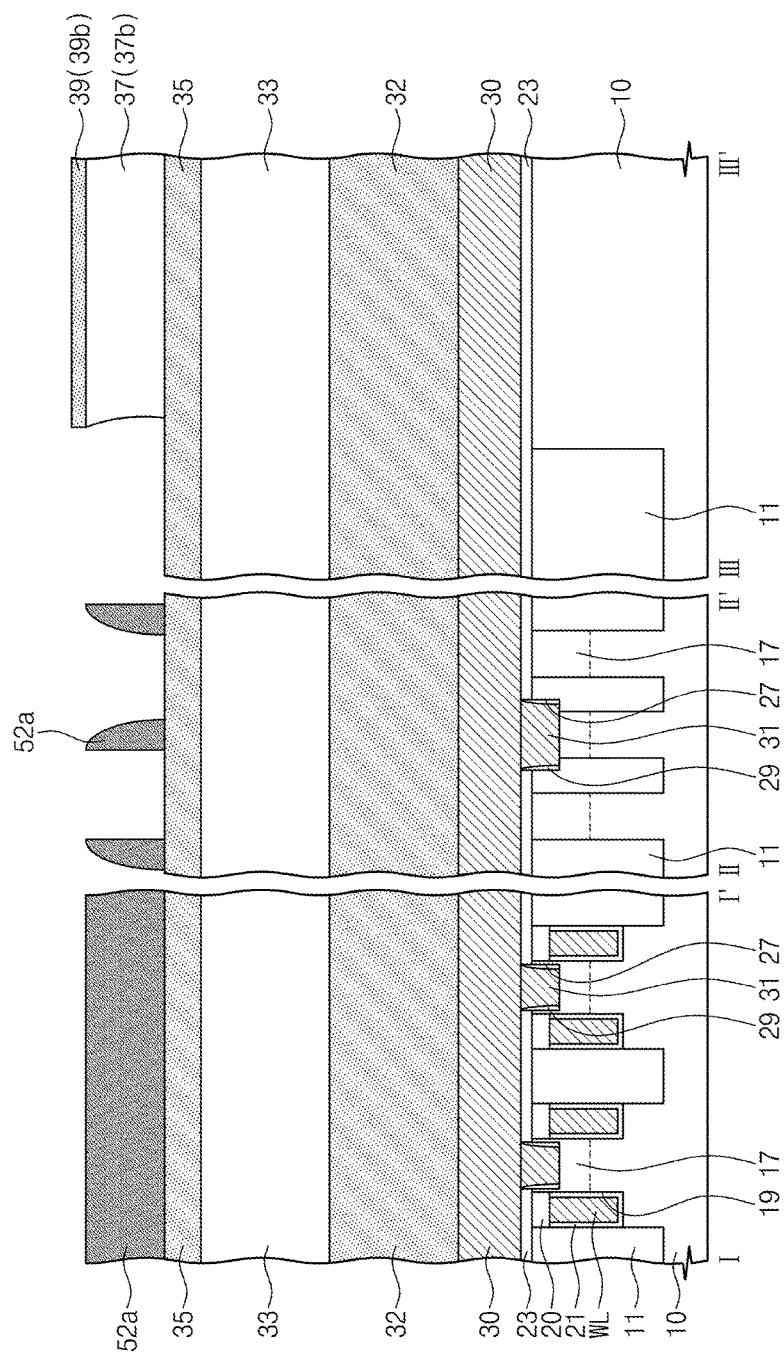

Referring to FIGS. 12A and 12B, the fifth mask layer 55 may be removed to expose the bit line mask patterns 52a. The fifth mask layer 55 may be removed together with a portion of the second portion 37b of the third mask layer 37 which is not covered with the second portion 39b of the second etch stop layer 39. On the contrary, the other portion of the second portion 37b of the third mask layer 37, which vertically overlaps with the second portion 39b of the second etch stop layer 39, may not be removed but remain on the first etch stop layer 35. When the fifth mask layer 55 is removed together with a portion of the second portion 37b of the third mask layer 37, the second portion 39b of the second etch stop layer 39 and the first etch stop layer 35 may not be removed due to their etch selectivity with the third mask layer 37 and the fifth mask layer 55. Thus, the second portion 39b of the second etch stop layer 39 may be exposed together with a portion of the first etch stop layer 35.

An ashing process may be performed to remove the fifth mask layer 55.

Figure 13A:
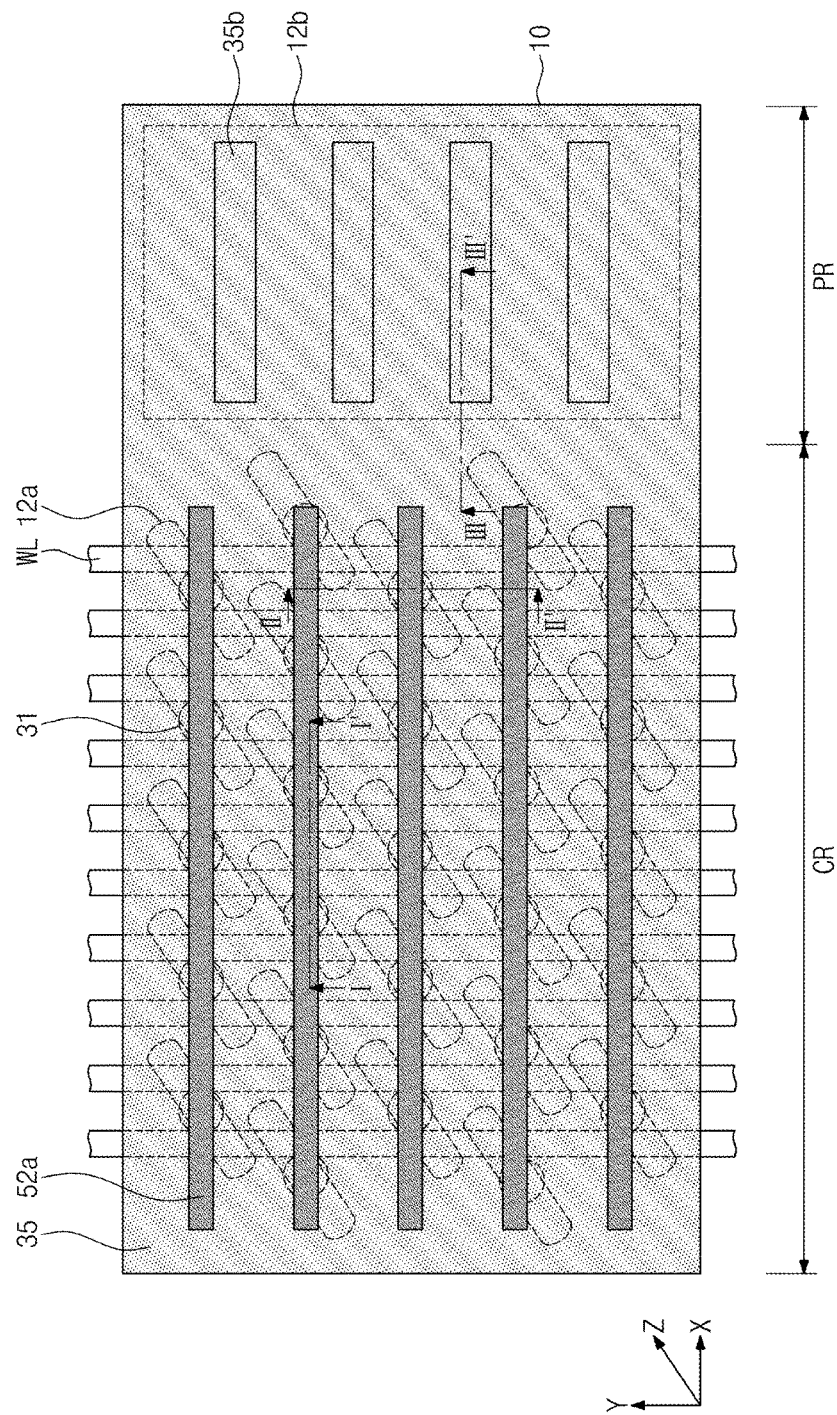
Figure 13B:
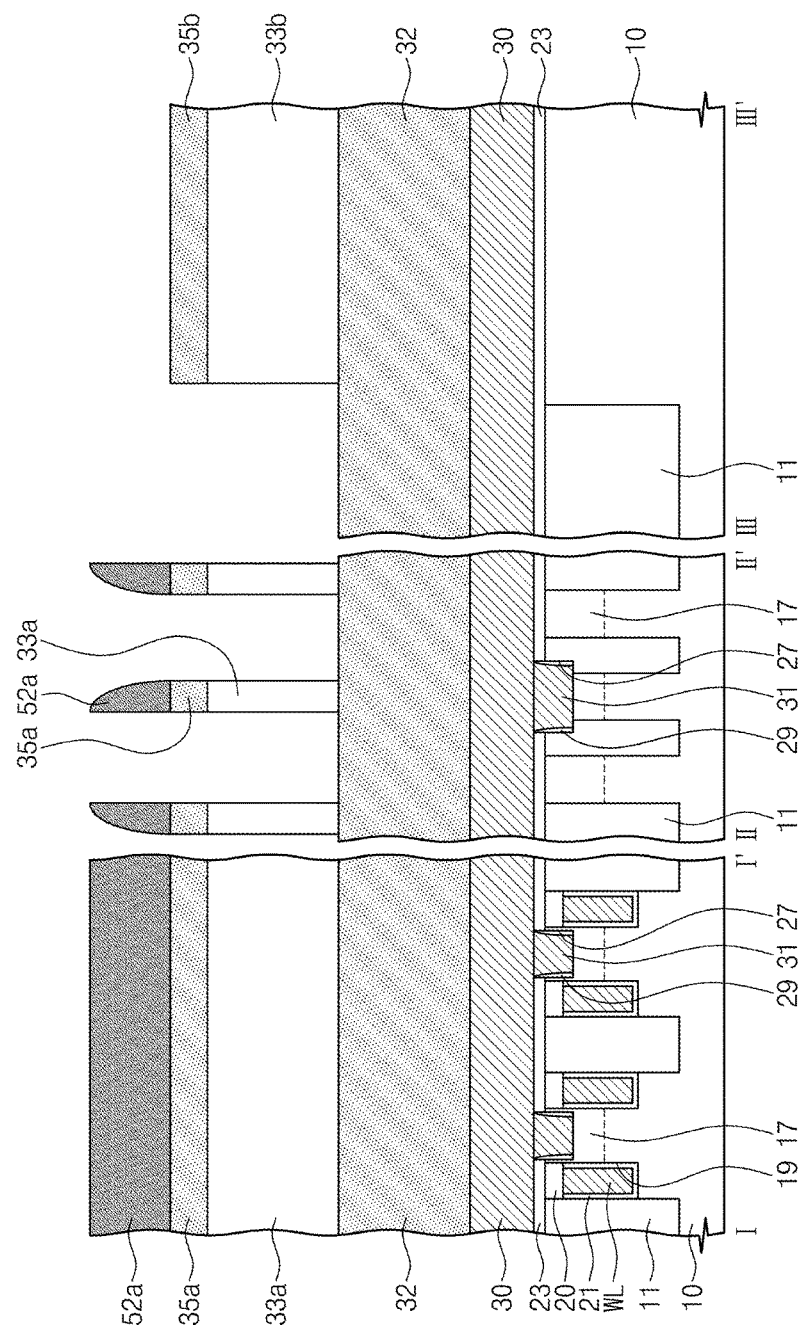

Referring to FIGS. 13A and 13B, in the cell array area CR of the substrate 10, the first etch stop layer 35 and the second mask layer 33 may be etched using the bit line mask patterns 52a as an etch mask. Therefore, a second cell mask pattern 33a and a cell etch stop pattern 35a may be sequentially formed on the first mask layer 32 in the cell array area CR of the substrate 10.

In the peripheral circuit area PR of the substrate 10, the first etch stop layer 35 and the second mask layer 33 may be etched using the second portion 39b of the second etch stop layer 39 and the second portion 37b of the third mask layer 37 as an etch mask. Thus, a second peripheral mask pattern 33b and a peripheral etch stop pattern 35b may be sequentially formed on the first mask layer 32 in the peripheral circuit area PR of the substrate 10.

The second portion 39b of the second etch stop layer 39 and the second portion 37b of the third mask layer 37 may be etched simultaneously or contemporaneously with the first etch stop layer 35 and the second mask layer 33. For example, the second portion 39b of the second etch stop layer 39 and the second portion 37b of the third mask layer 37 may be completely removed during the etch process, which exposes the peripheral etch stop pattern 35b. The etch process may be a dry etch process.

After the etch process, the bit line mask patterns 52a may be removed. For example, the bit line mask patterns 52a may be removed by a wet etch process based on a hydrofluoric acid (HF).

Figure 14B:
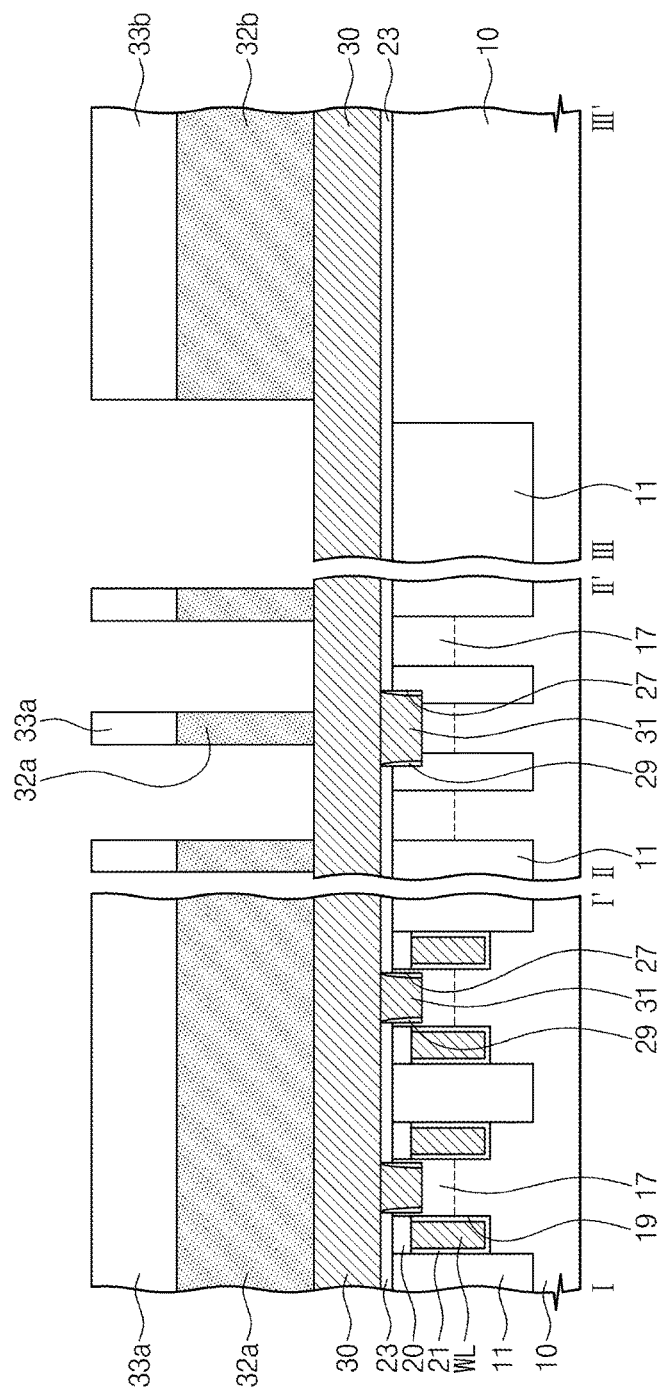

Referring to FIGS. 14A and 14B, in the cell array area CR of the substrate 10, the first mask layer 32 may be etched using the cell etch stop pattern 35a and the second cell mask pattern 33a as an etch mask. Therefore, a first cell mask pattern 32a may be formed on the conductive layer 30 in the cell array area CR of the substrate 10. In the peripheral circuit area PR of the substrate 10, the first mask layer 32 may be etched using the second peripheral mask pattern 33b and the peripheral etch stop pattern 35b as an etch mask.

Thus, a first peripheral mask pattern 32*b* may be formed on the conductive layer 30 in the peripheral circuit area PR of the substrate 10.

During the etch process, the cell etch stop pattern 35*a* and the peripheral etch stop pattern 35*b* may be removed. In addition, during the etch process, the second cell mask pattern 33*a* and the second peripheral mask pattern 33*b* may be etched such that thicknesses of the second cell and peripheral mask patterns 33*a* and 33*b* may be reduced. The etch process may be a dry etch process.

Referring to FIGS. 15A and 15B, in the cell array area CR of the substrate 10, the conductive layer 30 may be etched using the first cell mask pattern 32*a* as an etch mask. Therefore, bit lines BL may be formed in the cell array area CR of the substrate 10. The bit lines BL may extend in the first direction X and run across the bit line contacts 31 arranged in the first direction X. The bit lines BL may be in contact with the bit line contacts 31.

In the peripheral circuit area PR of the substrate 10, the conductive layer 30 may be etched using the first peripheral mask pattern 32*b* as an etch mask. Thus, a peripheral gate electrode PGE may be formed in the peripheral circuit area PR of the substrate 10. The peripheral gate electrode PGE may be disposed on the second active region 12*b*.

During the etch process, the second cell mask pattern 33*a* and the second peripheral mask pattern 33*b* may be removed. In addition, during the etch process, the first cell mask pattern 32*a* and the first peripheral mask pattern 32*b* may be etched such that thicknesses of the first mask and peripheral mask patterns 32*a* and 32*b* may be reduced.

The buffer layer 23 exposed through the peripheral gate electrode PGE may be patterned to form a peripheral gate insulation layer PGP between the substrate 10 and the peripheral gate electrode PGE.

Figure 16A:
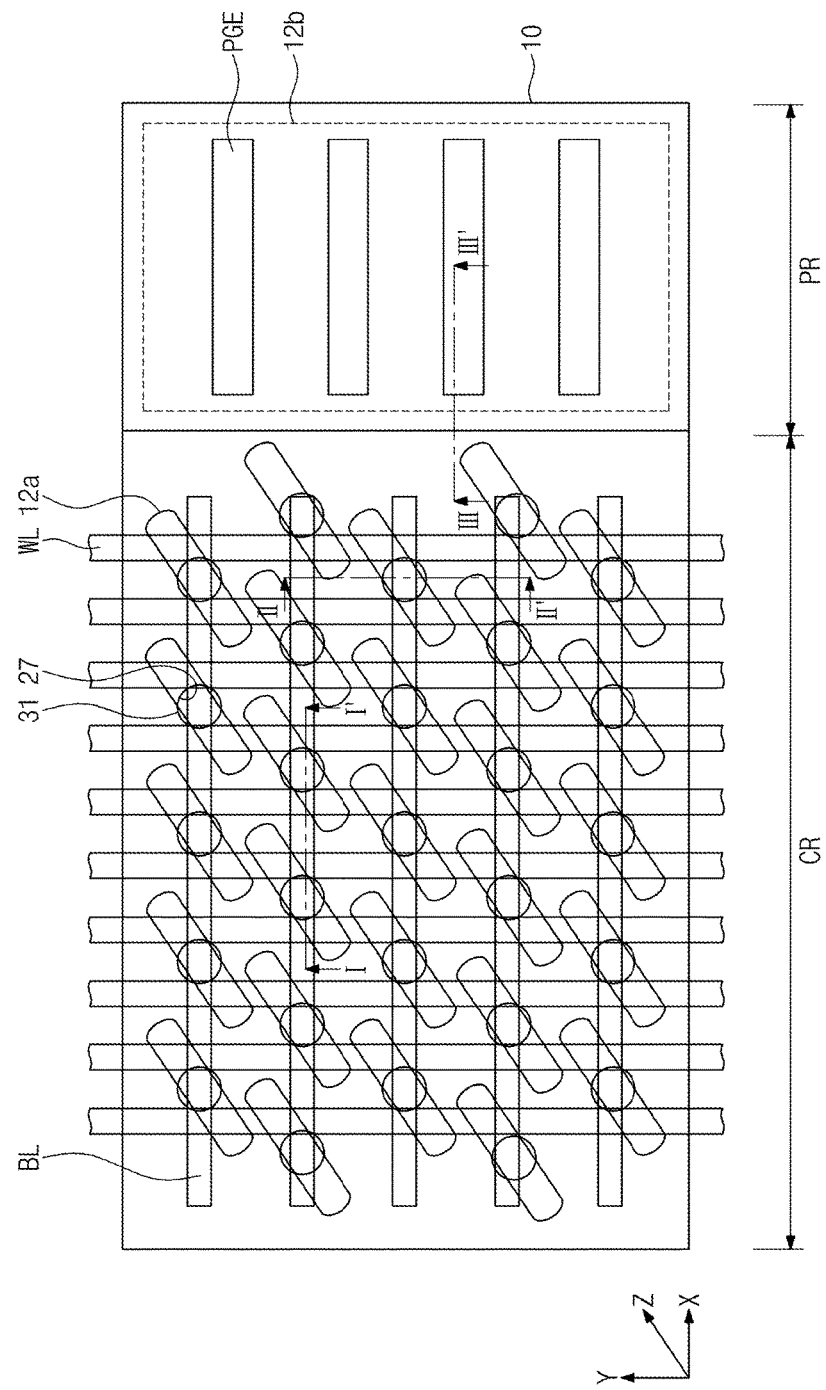
Figure 16B:
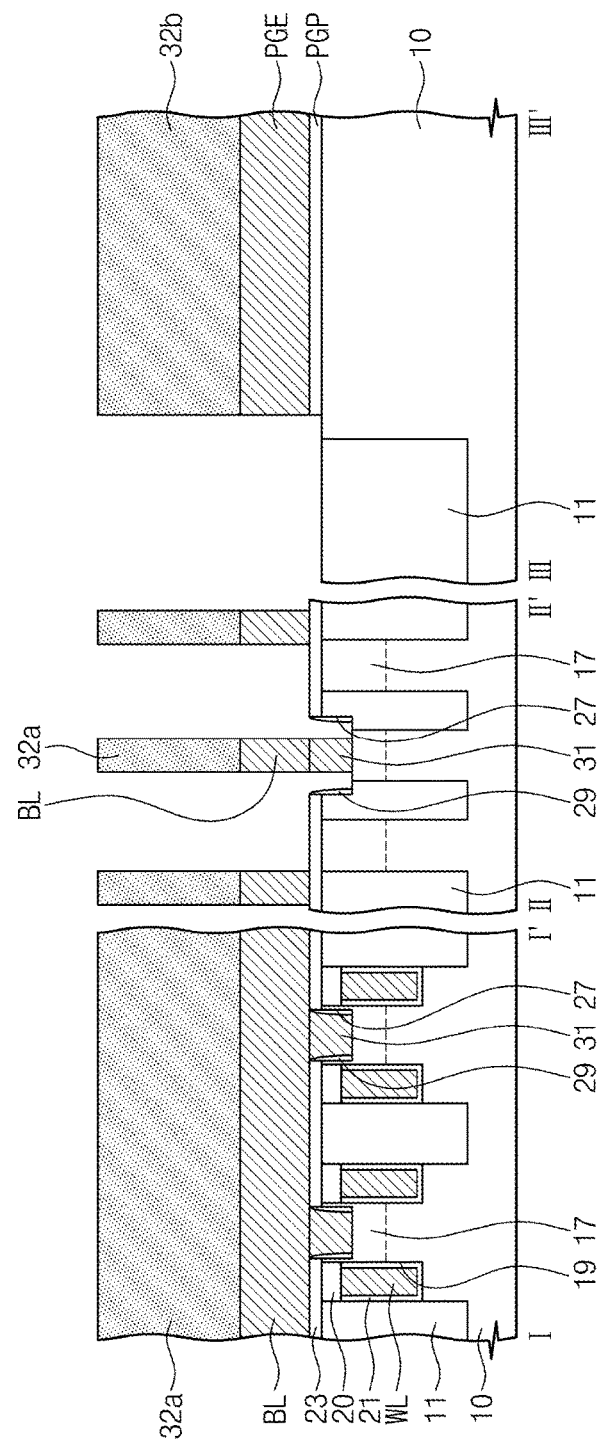

Referring to FIGS. 16A and 16B, exposed portions of the bit line contacts 31 may be etched using the bit lines BL as an etch mask. Therefore, the first spacer 29 may be exposed, and the bit line contact 31 may have a shape confined within the first contact hole 27 under the bit lines BL. For example, the bit line contact 31 may have a width substantially the same or similar to that of the bit line BL.

Figure 17A:
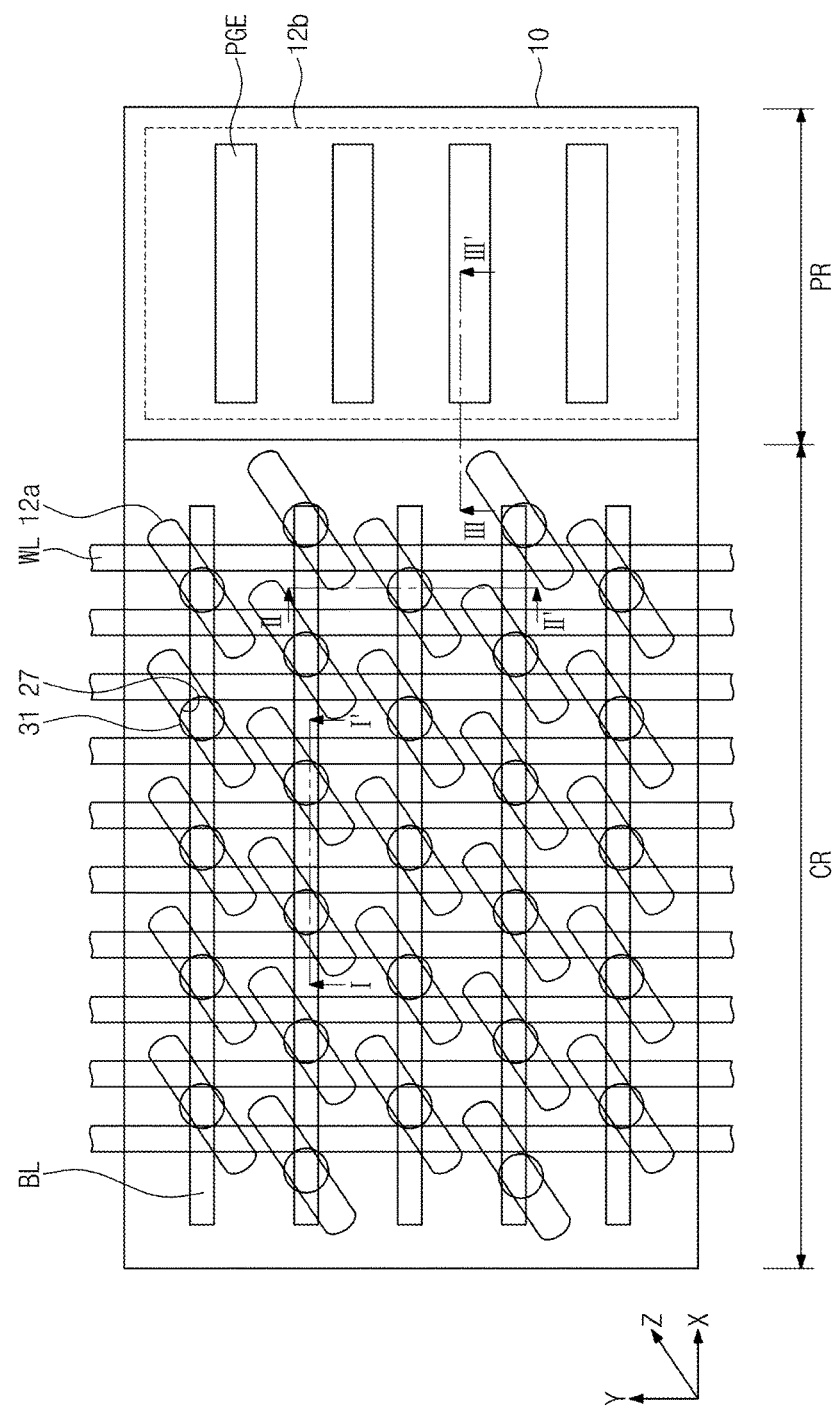
Figure 17B:
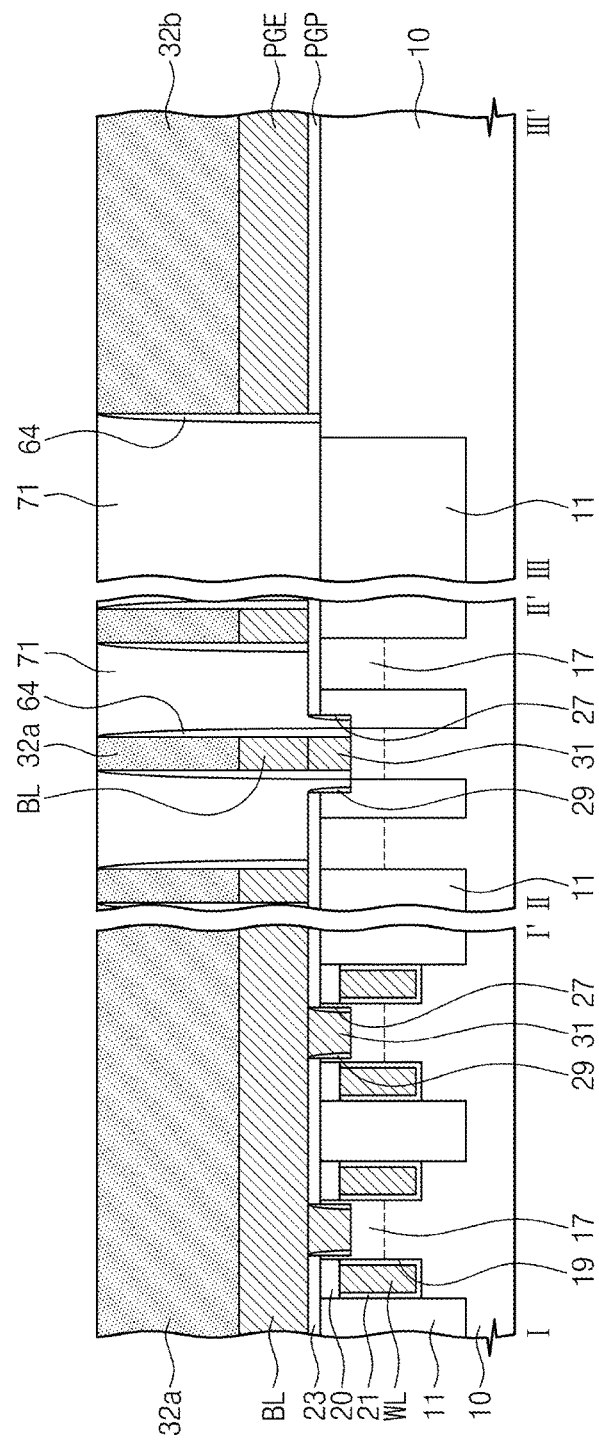

Referring to FIGS. 17A and 17B, second spacers 64 may be formed on sidewalls of the bit line BL and sidewalls of the peripheral gate electrode PGE. The second spacers 64 on the sidewalls of the bit line BL may cover sidewalls of the first cell mask pattern 32*a*, and the second spacers 64 on the sidewalls of the peripheral gate electrode GPE may cover sidewalls of the first peripheral mask pattern 32*b*. The second spacers 64 may include, for example, a silicon oxide layer or a silicon nitride layer.

Impurity regions (not shown) may be formed in portions of the second active region 12*b* which are uncovered with the second spacers 64 on the sidewalls of the peripheral gate electrode PGE and the first peripheral mask pattern 32*b*. The impurity regions may be formed by performing an ion implant process to dope impurities into the second active region 12*b*. For example, the impurity regions may correspond to source/drain regions of peripheral gate transistor.

A first interlayer dielectric layer 71 may be formed on the substrate 10. For example, the first interlayer dielectric layer 71 may fill a hollow space between the bit lines BL facing to each other in the second direction Y and a hollow space between the peripheral gate electrodes PGE facing to each other in the second direction Y. The first interlayer dielectric layer 71 may expose top surfaces of the first cell and peripheral mask patterns 32*a* and 32*b*.

Figure 18A:
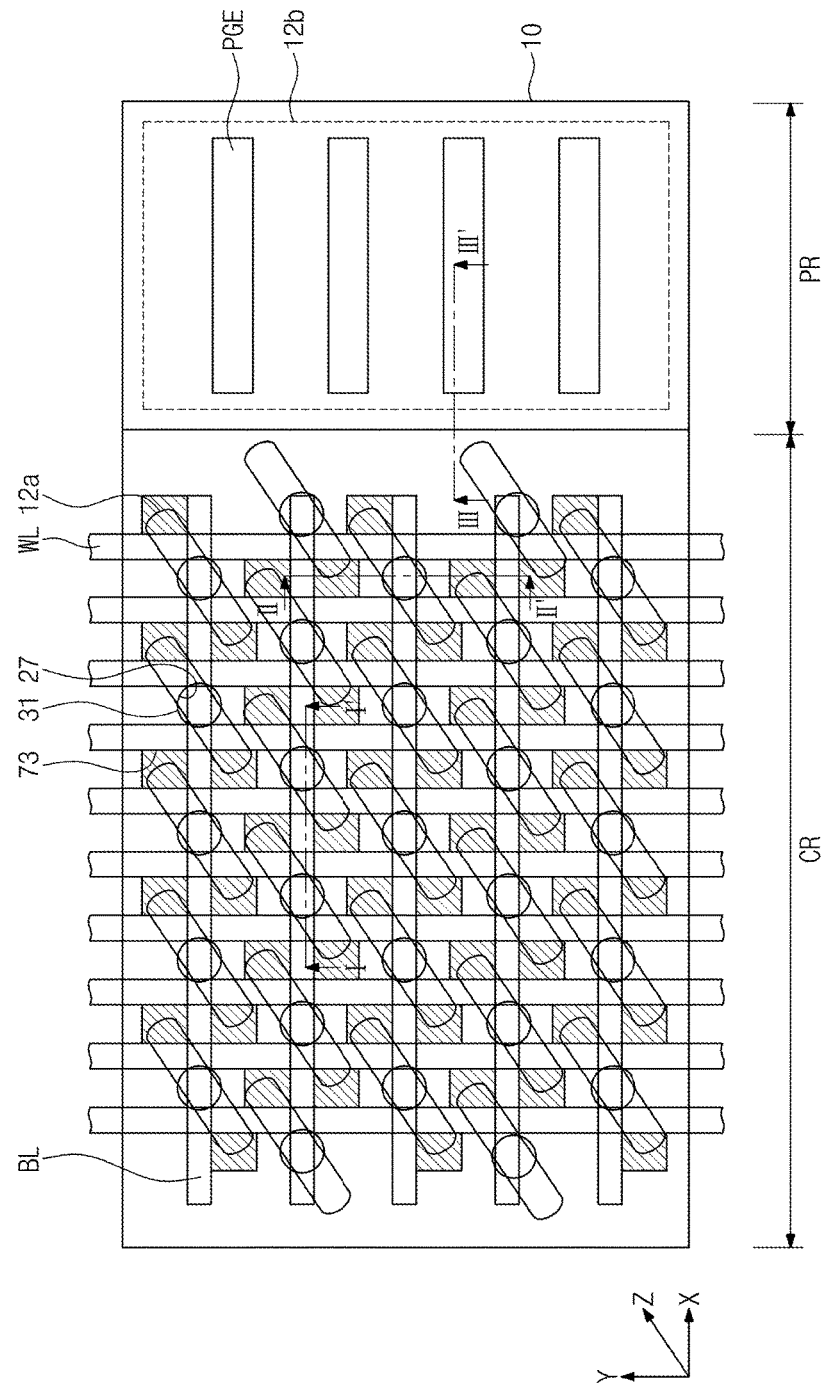
Figure 18B:
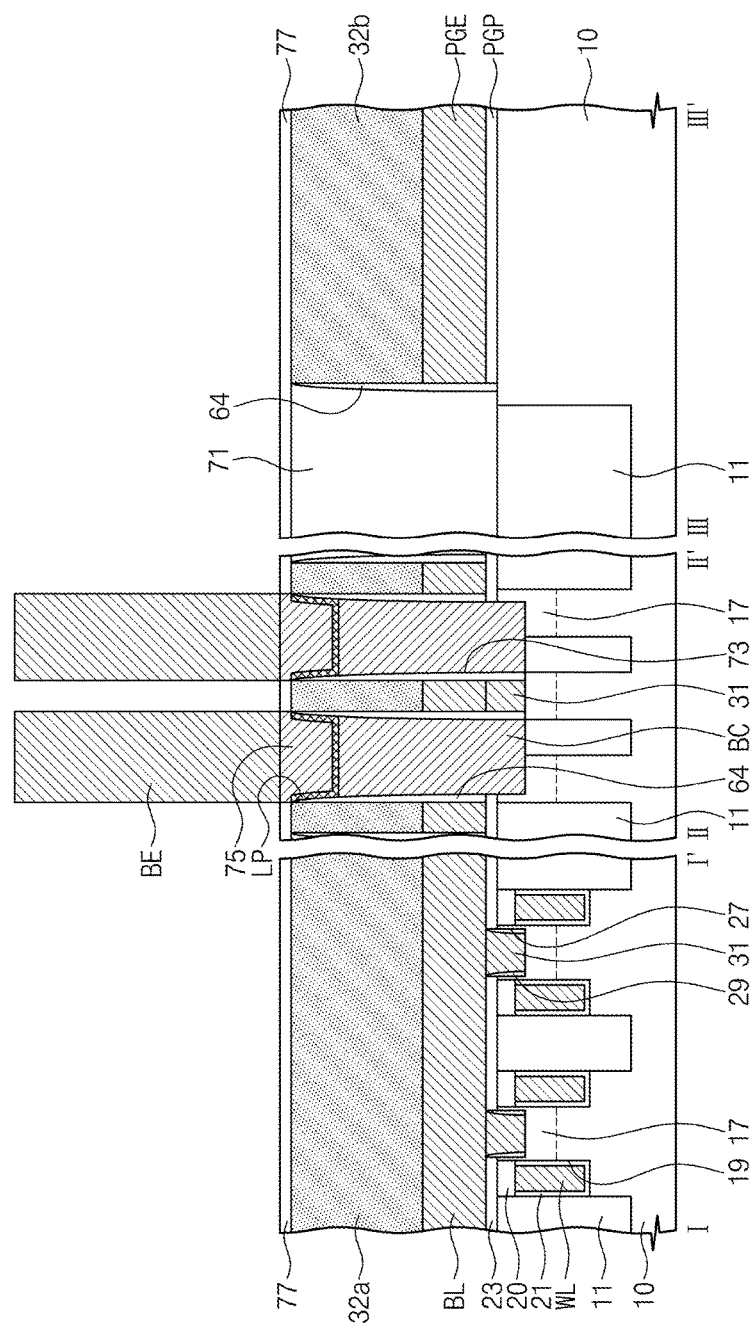

Referring to FIGS. 18A and 18B, the first interlayer dielectric layer 71, the buffer layer 23, and the substrate 10 may be partially etched to form a node contact hole 73 through which at least a portion of the source/drain region 17 is exposed. The second spacer 64 on the sidewall of the bit line BL may be exposed through the node contact hole 73.

A storage node contact BC may be formed in the node contact hole 73. The storage node contact BC may be in contact with and electrically connected to the source/drain region 17. The storage node contact BC may partially fill the node contact hole 73. The storage node contact BC may be formed by filling the node contact hole 73 with a conductive material to form a conductive layer and then performing an etch process (e.g., an etch-back process) to remove an upper portion of the conductive layer. For example, the storage node contact BC may have a top surface lower than a top surface of the first cell mask pattern 32*a*. The storage node contact BC may include at least one of, for example, a metal silicide layer, a polysilicon layer, a metal nitride layer, and a metal layer.

A landing pad LP may be formed in the node contact hole 73. The landing pad LP may cover a top surface of the storage node contact BC and an upper sidewall of the second spacer 64 which is exposed through the node contact hole 73. The landing pad LP may include at least one of, for example, a polysilicon layer, a silicon oxide layer, a metal layer, and a metal silicide layer.

A contact plug 75 may be formed on the landing pad LP. The contact plug 75 may be formed by forming a conductive layer (not shown) completely filling an upper portion of the node contact hole 73 surrounded by the landing pad LP and patterning the conductive layer through an etch process using an etch mask (not shown). The contact plug 75 may include, for example, a conductive material.

A second interlayer dielectric layer 77 may be formed on the first cell mask pattern 32*a*, the first peripheral mask pattern 32*b*, and the first interlayer dielectric layer 71. The second interlayer dielectric layer 77 may include, for example, a silicon oxide layer, a silicon nitride layer, a silicon oxynitride layer, or any combination thereof.

A capacitor may be formed on the contact plug 75. The capacitor may include a bottom electrode BE, a dielectric layer (not shown), and a top electrode (not shown).

FIGS. 19A through 28A are plan views illustrating a method of fabricating a semiconductor device according to example embodiments of the present inventive concepts. FIGS. 19B through 28B are cross-sectional view taken along lines I-I', II-II' and III-III' of FIGS. 19A through 28A. For brevity of descriptions, the same elements of the semiconductor memory device according to example embodiments use the same reference numerals and duplicate explanations thereof are omitted.

Figure 19A:
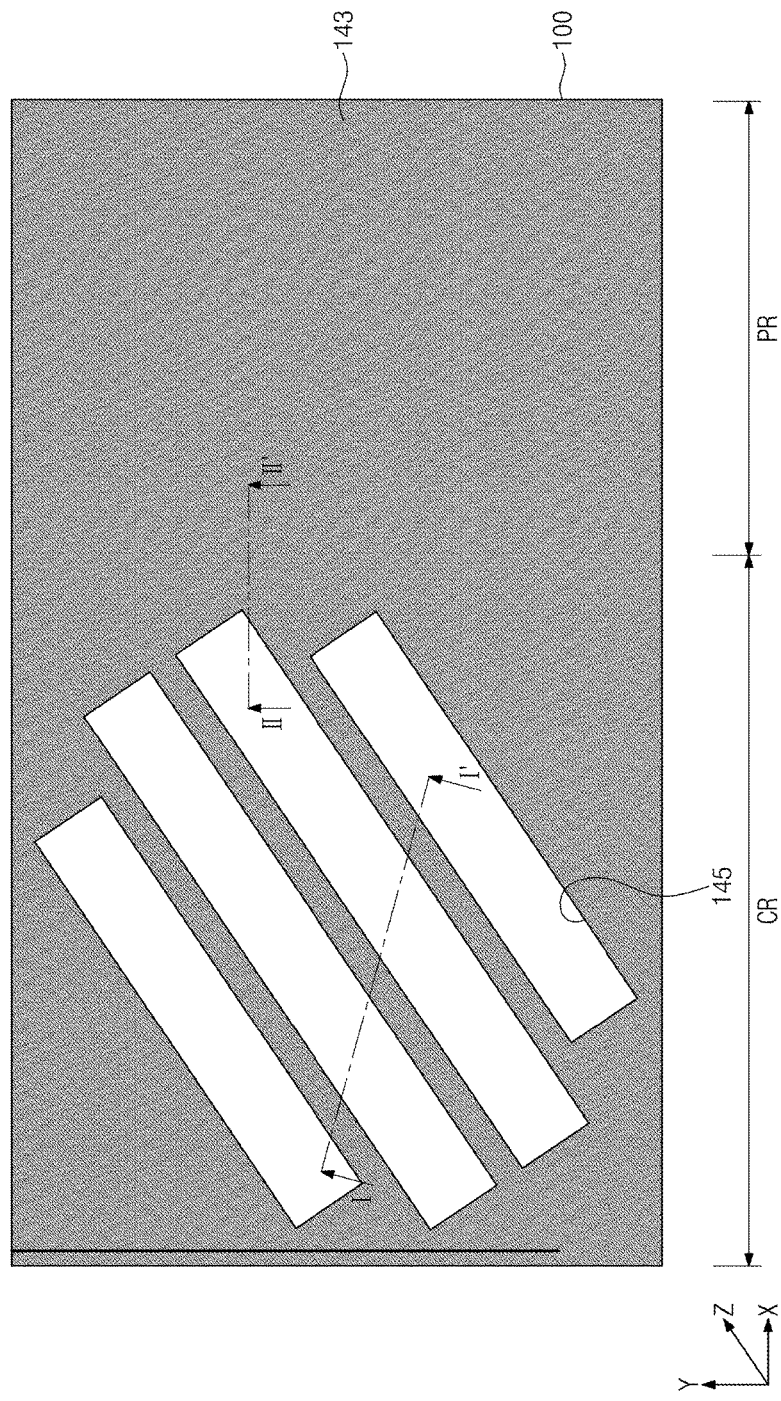
Figure 19B:
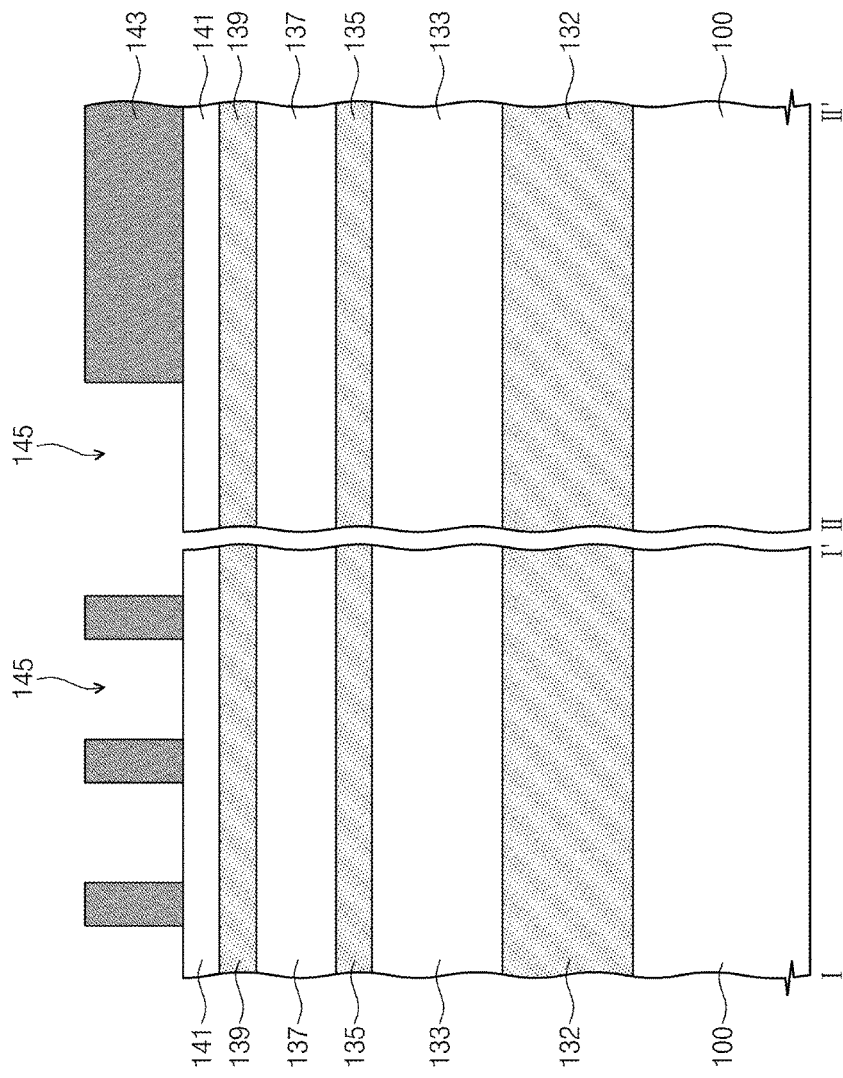

Referring to FIGS. 19A and 19B, one or more process may be performed to form a first mask layer 132, a second mask layer 133, a first etch stop layer 135, a third mask layer 137, a second etch stop layer 139, a fourth mask layer 141, and a first resist pattern 143 on a substrate 100.

The substrate 100 may include a cell array area CR and a peripheral circuit area PR. The substrate 100 may be a bulk silicon substrate, a silicon-on-insulator (SOI) substrate, a germanium substrate, a germanium-on-insulator (GOI) substrate, a silicon-germanium substrate, or an epitaxial layered substrate formed using a selective epitaxial growth.

The first mask layer 132 may include a material having etch selectivity with respect to the substrate 100. The first mask layer 132 may include, for example, a silicon oxide layer. The second mask layer 133 may include a material having etch selectivity with respect to the first mask layer 131. The second mask layer 133 may include, for example, an amorphous carbon (ACL) layer. The first etch stop layer 135 may include a material having etch selectivity with respect to the second mask layer 133. The first etch stop layer 135 may include, for example, a silicon oxynitride layer. The third mask layer 137 may include a material having etch selectivity with respect to the first etch stop layer 135. The third mask layer 137 may include, for example, a spin on hard mask layer. The second etch stop layer 139 may include a material having etch selectivity with respect to the third mask layer 137. The second etch stop layer 139 may include, for example, a silicon oxynitride (SiON) layer. The fourth mask layer 141 may include, for example, an anti-reflective coating material.

The first resist pattern 143 may have one or more openings 145. The openings 145 may be disposed on the cell array area CR of the substrate 100. The openings 145 may expose portions of the fourth mask layer 141 on the cell array area CR of the substrate 100. For example, the openings 145 may have a rectangular shape elongated in third direction Z crossing first and second directions X and Y.

Figure 20A:
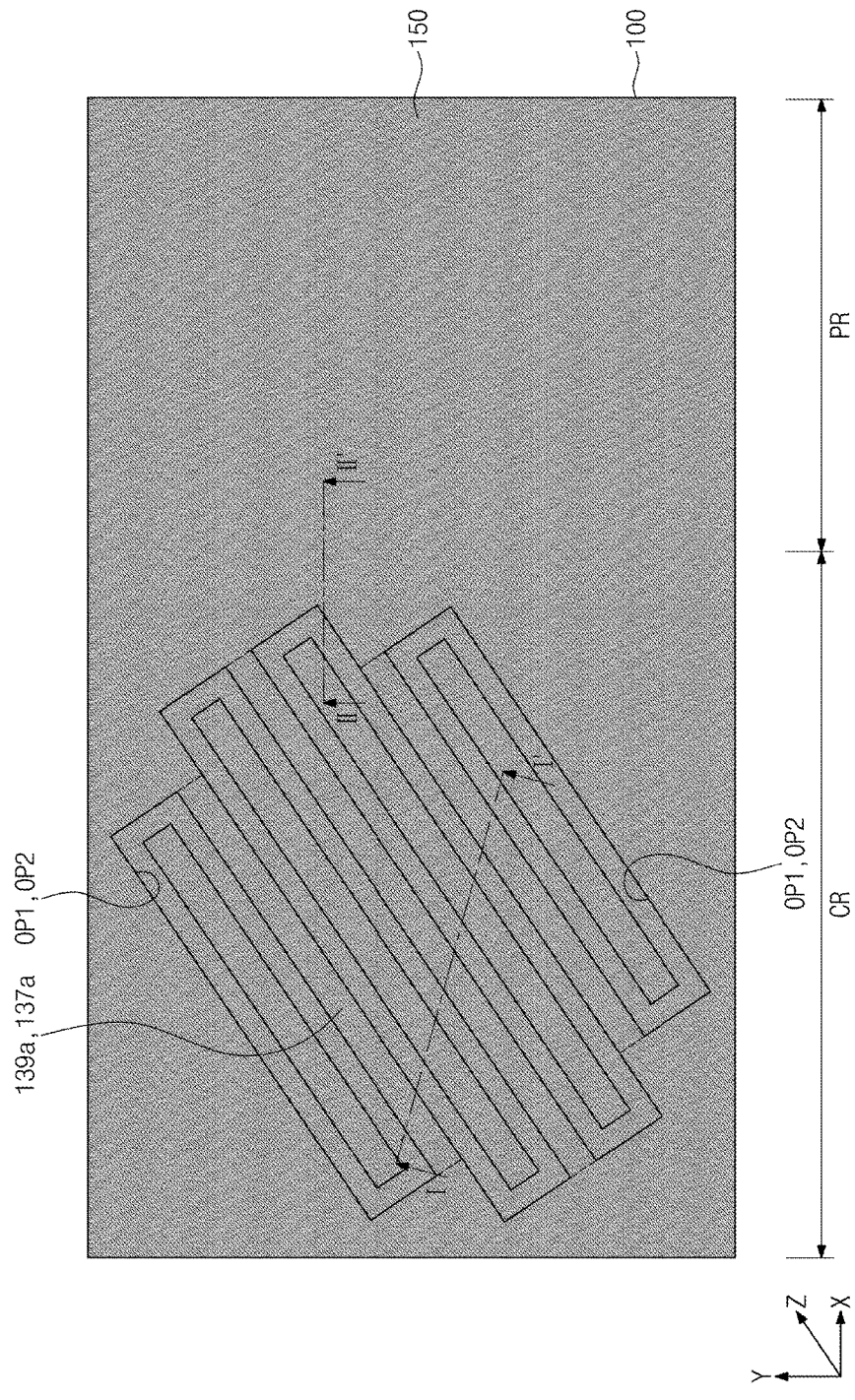
Figure 20B:
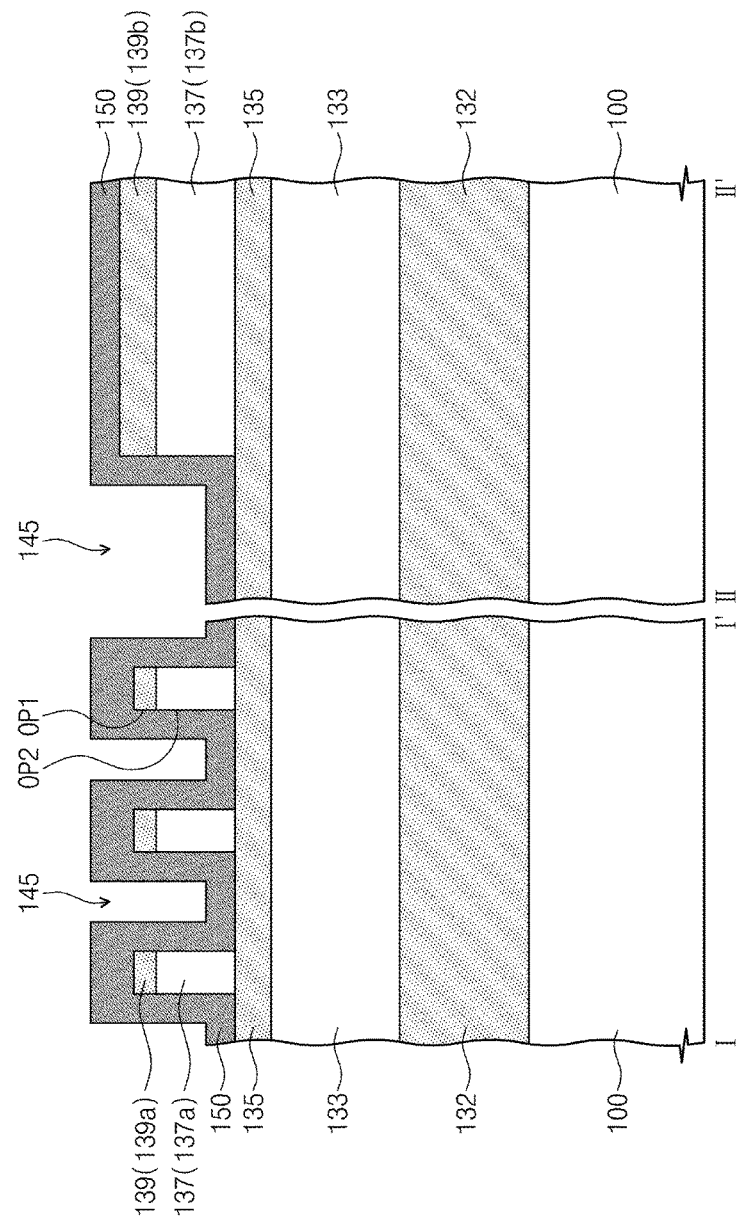

Referring to FIGS. 20A and 20B, the fourth mask layer 141, the second etch stop layer 139, and the third mask layer 137 may be sequentially etched using the first resist pattern 143 as an etch mask. Accordingly, first openings OP1 may be formed in the second etch stop layer 139, and second openings OP2 may be formed in third mask layer 137.

When the second etch stop layer 139 and the third mask layer 137 are patterned, the first resist pattern 143 and the fourth mask layer 141 may be etched to be removed. The second etch stop layer 139 may be patterned to have exposed top and side surfaces.

The second etch stop layer 139 may include first portions 139a and a second portion 139b. The first portions 139a may be disposed between a pair of first opening OP facing to each other and may correspond to portions of the second etch stop layer 139 which are provided on the cell array area CR of the substrate 100, and the second portion 139b may correspond to a remaining portion of the second etch stop layer 139. For example, the first portions 139a may have thicknesses less than that of the second portion 139b.

The third mask layer 137 may include first portions 137a and a second portion 137b. The first portions 137a of the third mask layer 137 may be provided between the first etch stop layer 135 and the first portions 139a of the second etch stop layer 139, and the second portion 137b of the third mask layer 137 may be provided between the first etch stop layer 135 and the second portion 139b of the second etch stop layer 139.

A spacer layer 150 may be formed on the second etch stop layer 139. The spacer layer 150 may uniformly cover a top surface of the second etch layer 139, sidewalls of the third mask layer 137 which are exposed through the second opening OP1, sidewalls of the second etch stop layer 139 which are exposed through the first openings OP1, and a top surface of the first etch stop layer 135 which is exposed through the first and second openings O1 and O2.

Figure 21A:
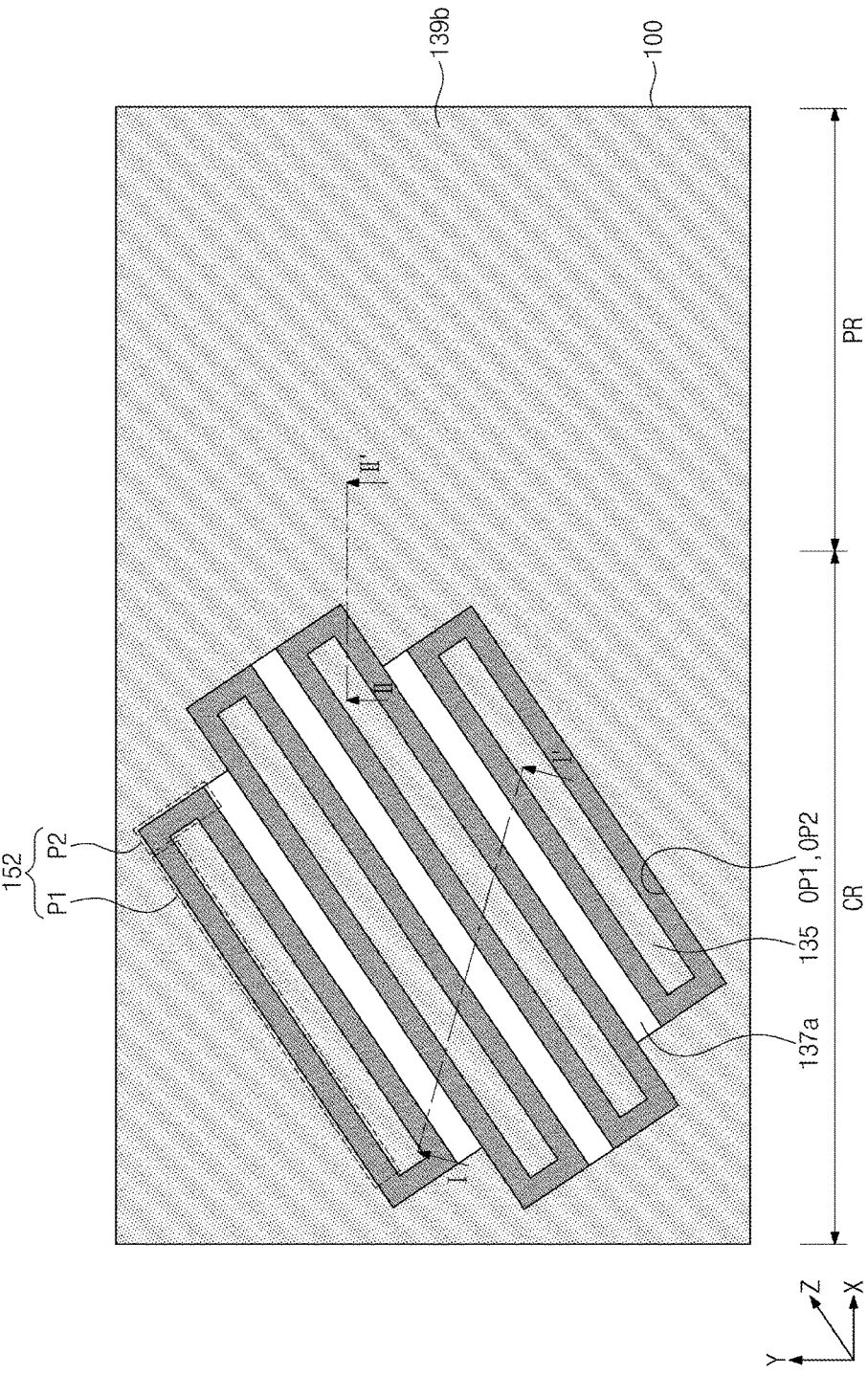
Figure 21B:
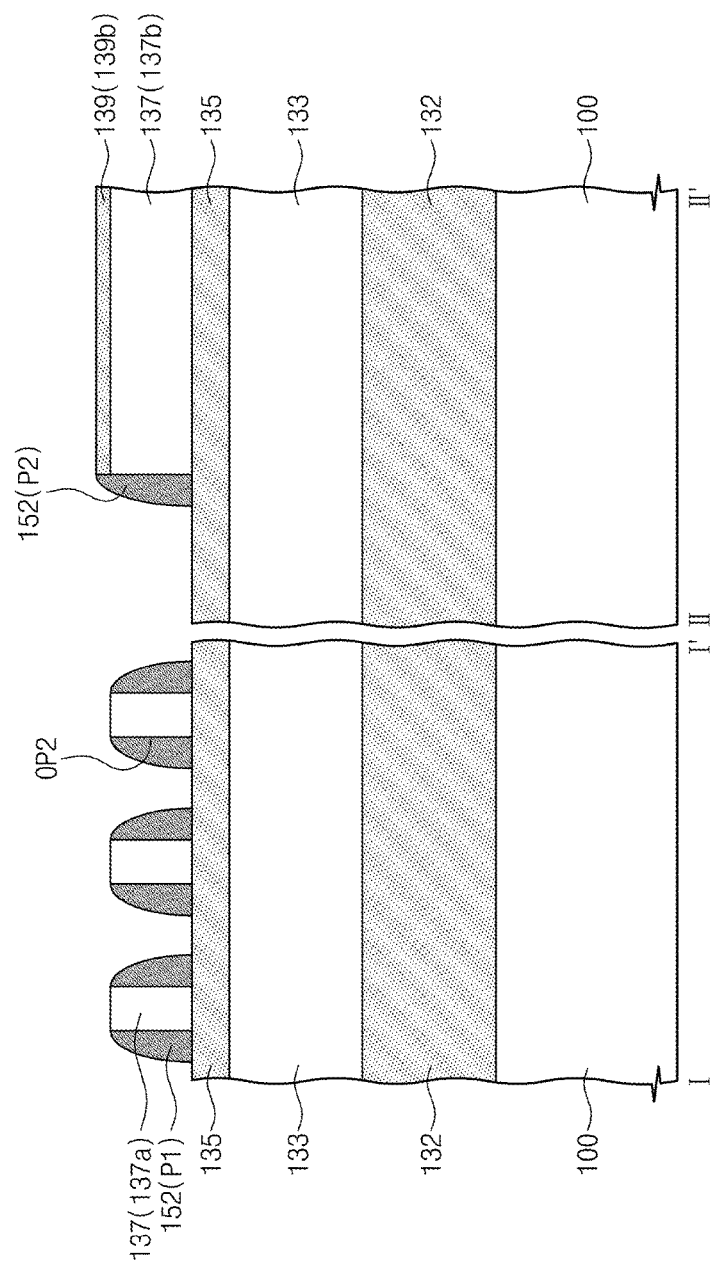

Referring to FIGS. 21A and 21B, an etch process may be performed to partially etch the spacer layer 150 on top surfaces of the first and second etch stop layers 135 and 139, which may form an active mask layer 152. During the etch process, the first portions 139a of the second etch stop layer 139 may be removed to expose top surfaces of the first portions 137a of the third mask layer 137. In addition, during the etch process, the second portion 139b of the second etch stop layer 139 may not be removed. In other words, the second portion 139b of the second etch stop layer 139 may remain on the second portion 137b of the third mask layer 137.

The active mask layer 152 may include a pair of first portions P1 and a pair of second portions P2 connected to the pair of first portions P1. The pair of first portions P1 of the active mask layer 152 may cover sidewalls of the first portions 137a of the third mask layer 137. As viewed in plan, the pair of first portions P1 of the active mask layer 152 may parallel extend in the third direction Z. At least one of pair of second portion P2 of the active mask layer 152 may cover a sidewall of the second portion 137b of the third mask layer 137 and a sidewall of the second portion 139b of the second etch stop layer 139. As viewed in plan, the active mask layer 152 may have, for example, a rectangular shape extending along an inner wall of the second opening OP2.

For example, the first portions P1 of the active mask layer 152 may have thicknesses less than those of the second portions P2 of the active mask layer 152. Alternatively, the active mask layer 152 may have the pair of first portions P1 with first heights from a top surface of the first etch stop layer 135 and the pair of second portions P2 with second heights from the top surface of the first etch stop layer 135 that are less than the first heights.

Figure 22A:
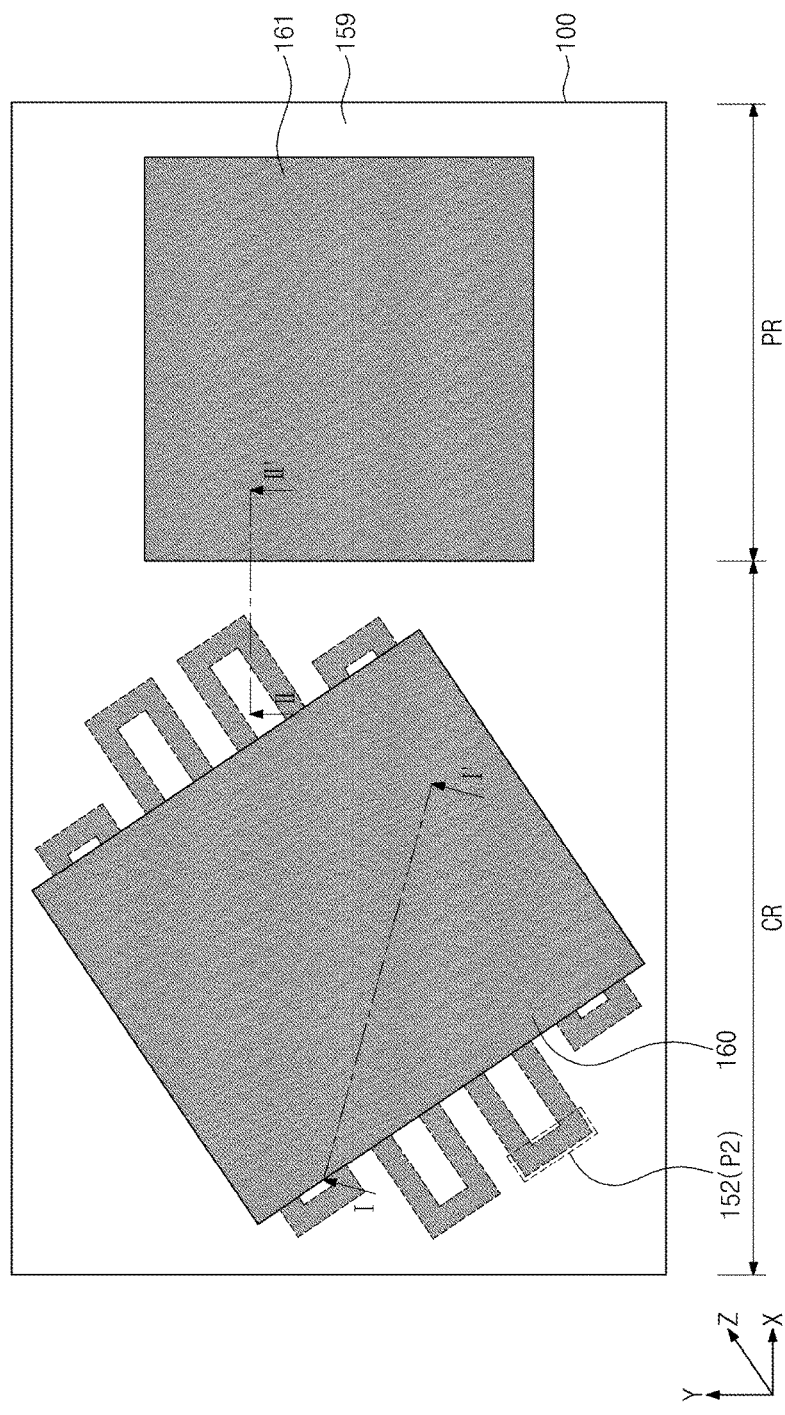
Figure 22B:
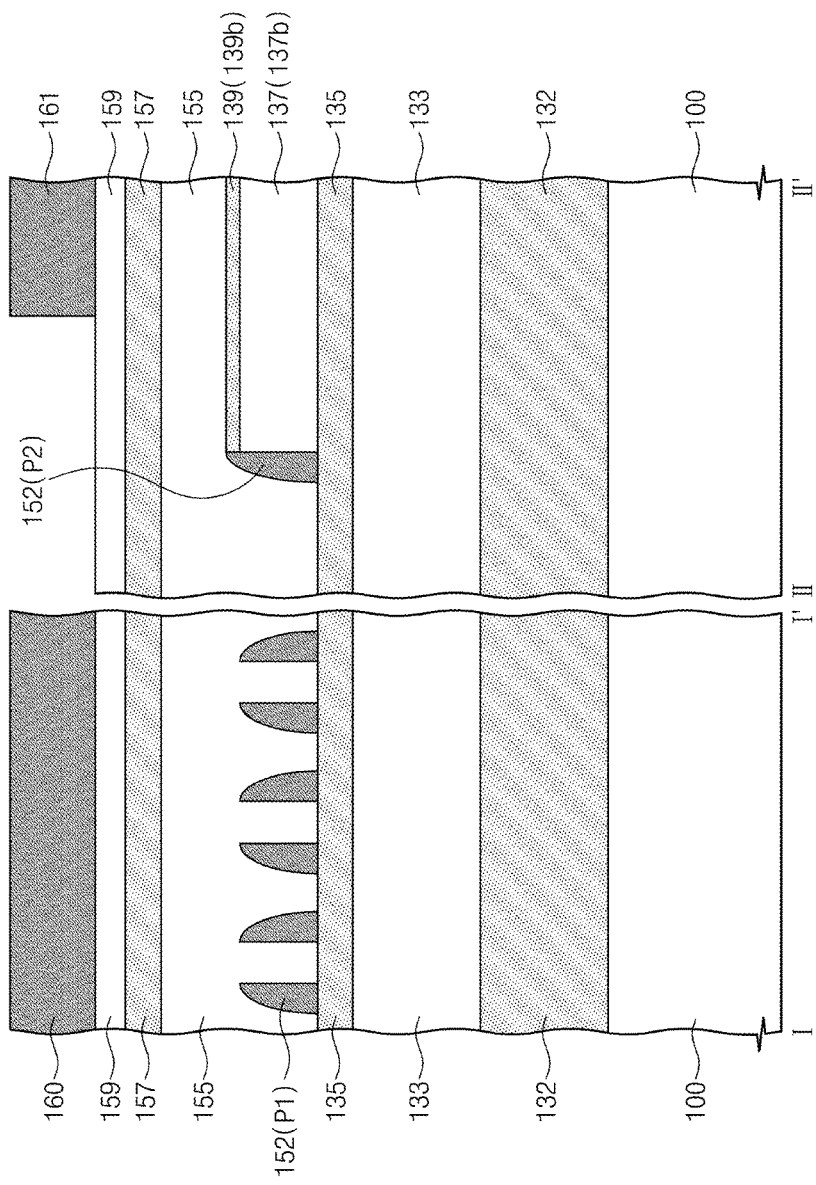

Referring to FIGS. 22A and 22B, an etch process may be performed to remove the first portions 137a of the third mask layer 137. Accordingly, the etch process may partially reveal the first etch stop layer 135 on the cell array area CR of the substrate 100, except portions of the first etch stop layer 135 on which the active mask layers 152 are formed.

A fifth mask layer 155, a third etch stop layer 157, and a sixth mask layer 159 may be sequentially formed on the first etch stop layer 135 and the second portion 139b of the second etch stop layer 139. The fifth mask layer 155 may include, for example, a spin on hard mask layer. The third etch stop layer 157 may include, for example, a silicon oxynitride (SiON) layer. The sixth mask layer 159 may include, for example, an anti-reflective coating material.

A second resist pattern 160 and a third resist pattern 161 may be formed on the sixth mask layer 159. The second resist pattern 160 may be formed on the cell array area CR of the substrate 100. For example, as viewed in plan, the second resist pattern 160 may completely or partially cover the first portions P1 of the active mask layers 152 and expose the second portions P2 of the active mask layers 152. In other words, as viewed in cross-sectional view, the second resist pattern 160 may vertically overlap with the first portions P1 of the active mask patterns 152.

The third resist pattern 161 may be formed on the peripheral circuit area PR of the substrate 100. The third resist pattern 161 may partially exposed the fifth mask layer 159 on the peripheral circuit area PR of the substrate 100.

Figure 23B:
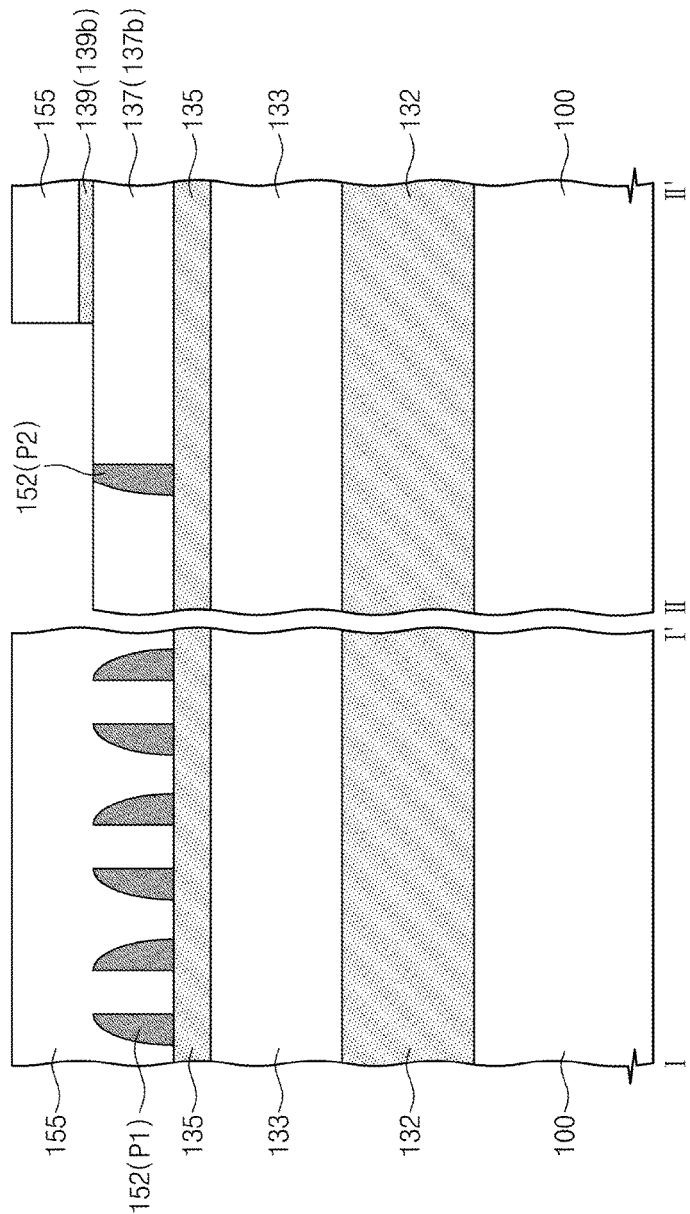

Referring to FIGS. 23A and 23B, the sixth mask layer 159, the third etch stop layer 157, the fifth mask layer 155, and the second portion 139b of the second etch stop layer 139 may be partially etched using the second and third resist patterns 160 and 161 as an etch mask. Accordingly, the etch process may partially expose the second portion P2 of the active mask layer 152 and the second portion 137b of the third mask layer 137. During the etch process, the second and third resist patterns 160 and 161, the sixth mask layer 159, and the third etch stop layer 157 may be etched together to be removed. Therefore, the fifth mask layer 155 may be exposed.

The fifth mask layer 155 and the second portion 139b of the second etch stop layer 139 may be partially removed to expose a top surface of the second portion P2 of the active mask layer 152, a sidewall of the second portion 139b of the second etch stop layer 139, and a portion of top surface of the second portion 137b of the third mask layer 137.

Referring to FIGS. 24A and 24B, the exposed second portion P2 of the bit line mask layer 52 may be removed. Accordingly, the pair of first portions P1 of the active mask layer 152 may be divided into two pieces spaced apart from each other.

Figure 25A:
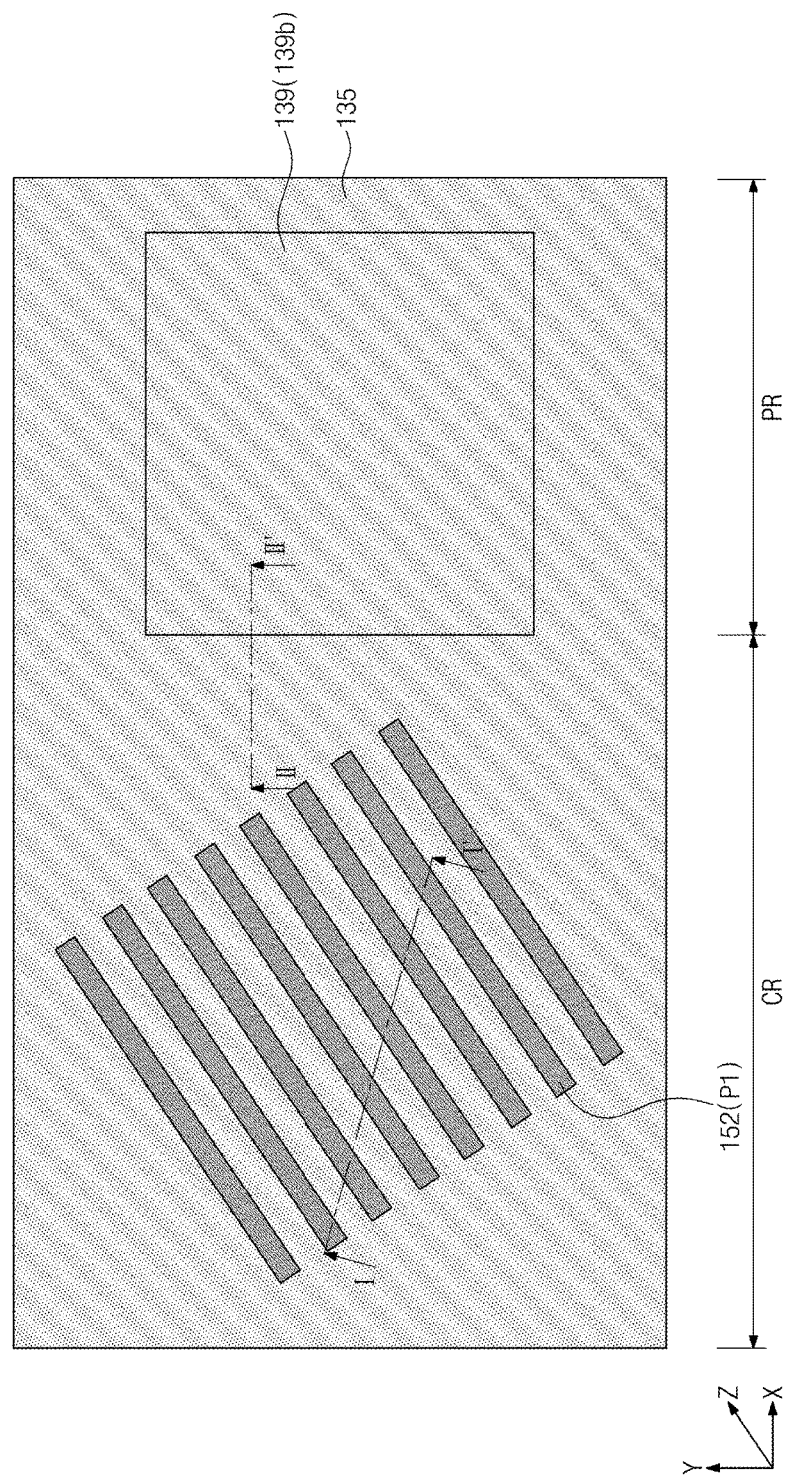
Figure 25B:
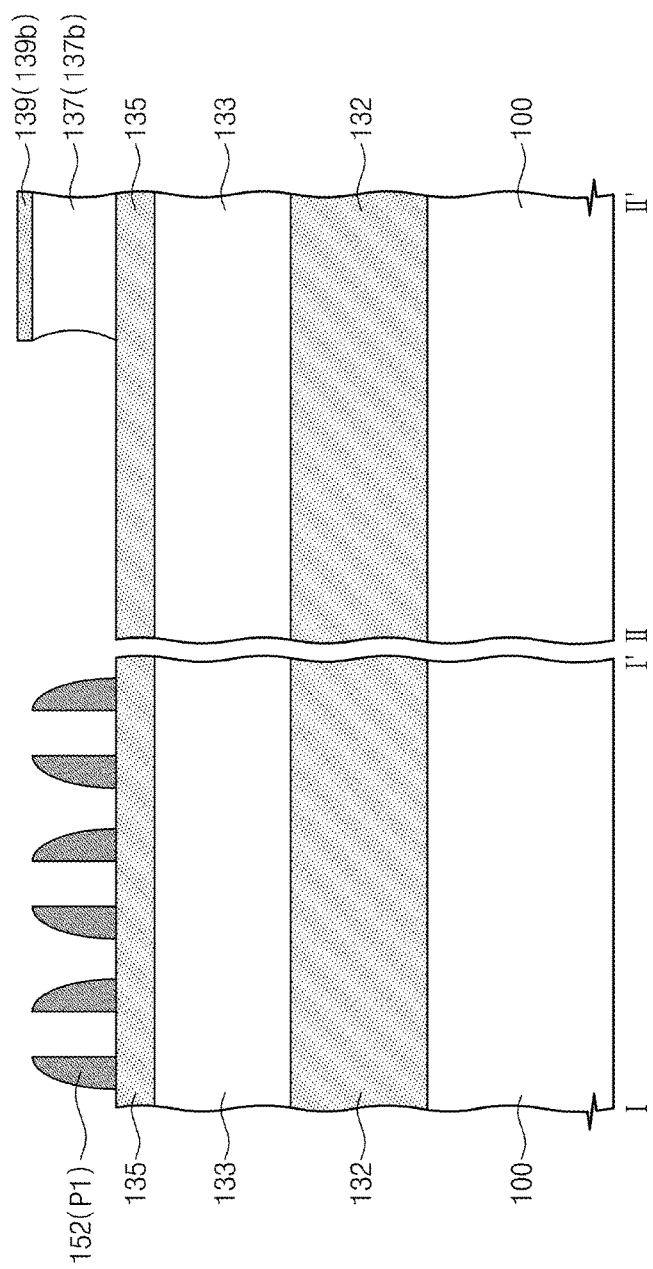

Referring to FIGS. 25A and 25B, the fifth mask layer 155 may be removed to expose the first portions P1 of the active mask layer 152. When the fifth mask layer 155 is removed, the second portion 137b of the third mask layer 137 may be partially removed together with the fifth mask layer 155 so as to remain under the second portion 139b of the second etch stop layer 139. For example, after the etch process, the second portion 139b of the second etch stop layer 139 and a portion of the second portion 137b of the third mask layer 137 may still remain on the fifth mask layer 135.

Figure 26A:
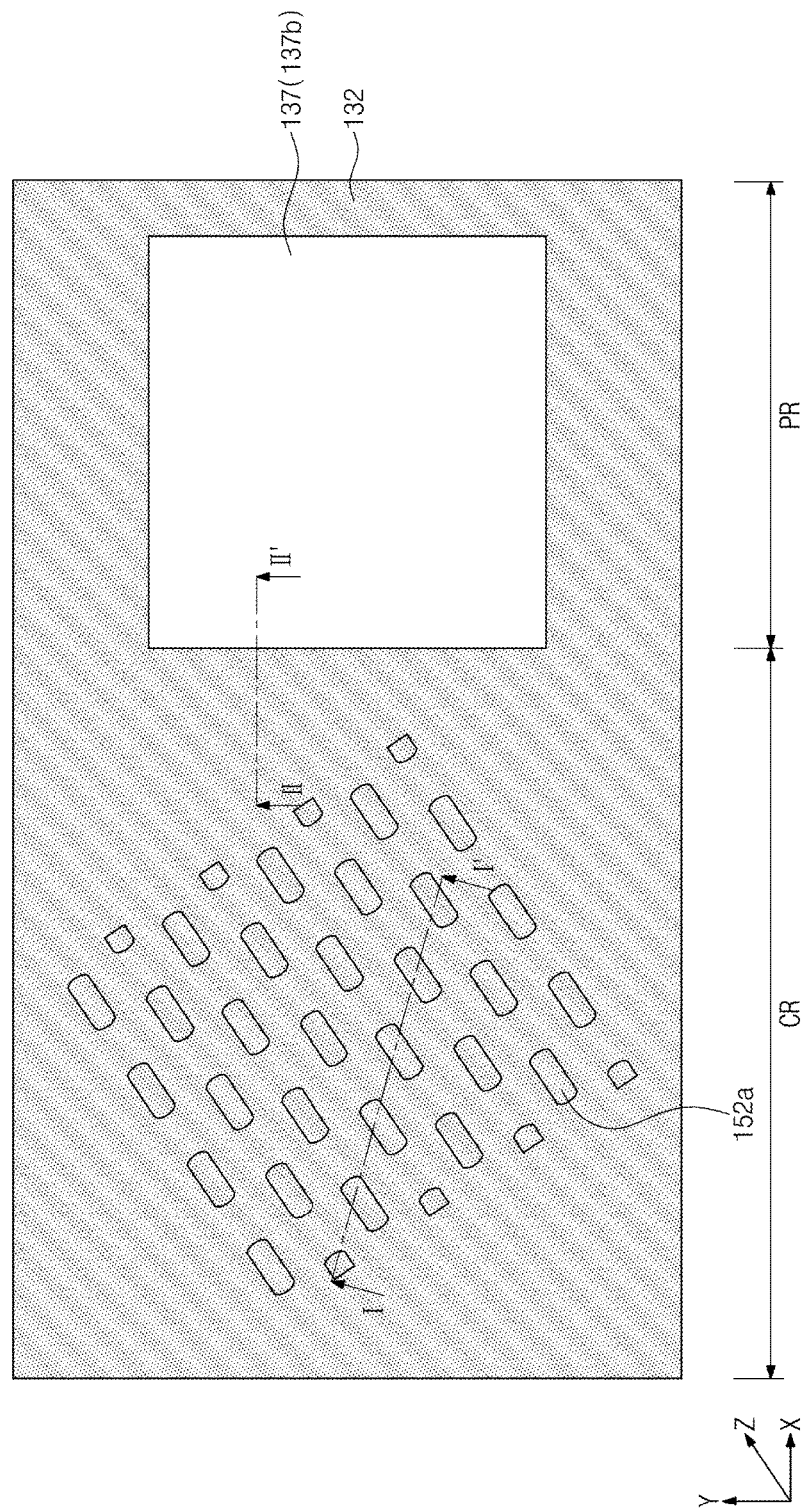
Figure 26B:
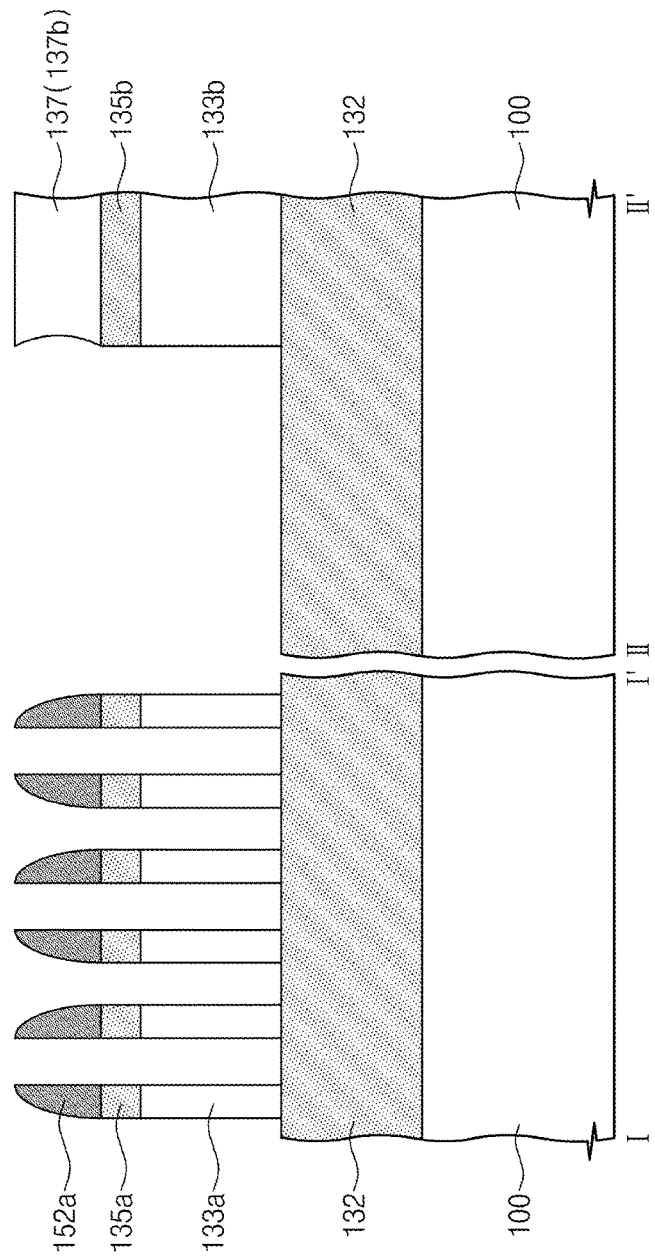

Referring to FIGS. 26A and 26B, the first portions P2 of the active mask layer 152 may be patterned to form active mask patterns 152a. For example, the active mask patterns 152a may be formed by providing an etch mask (not shown) having openings on the active mask layer 152 and partially removing the first portions P1 of the active mask layer 152 that are exposed by the openings. Each of the active mask patterns 152a may have a bar shape elongated in the third direction Z.

In the cell array CR of the substrate 100, the first etch stop layer 135 and the second mask layer 133 may be etched using the active mask patterns 152a as an etch mask. Accordingly, a second cell mask pattern 133a and a cell etch stop pattern 135a may be sequentially formed on the first mask layer 132 in the cell array CR of the substrate 100.

In the peripheral circuit area PR of the substrate 100, the first etch stop layer 135 and the second mask layer 133 may be etched using the second portion 139b of the second etch stop layer 139 and the second portion 137b of the third mask layer 137 as an etch mask. Accordingly, a second peripheral mask pattern 133b and a peripheral etch stop pattern 135b may be sequentially formed on the first mask layer 132 in the peripheral circuit area PR of the substrate 100.

After the etch process, the active mask patterns 152a may be removed.

Figure 27A:
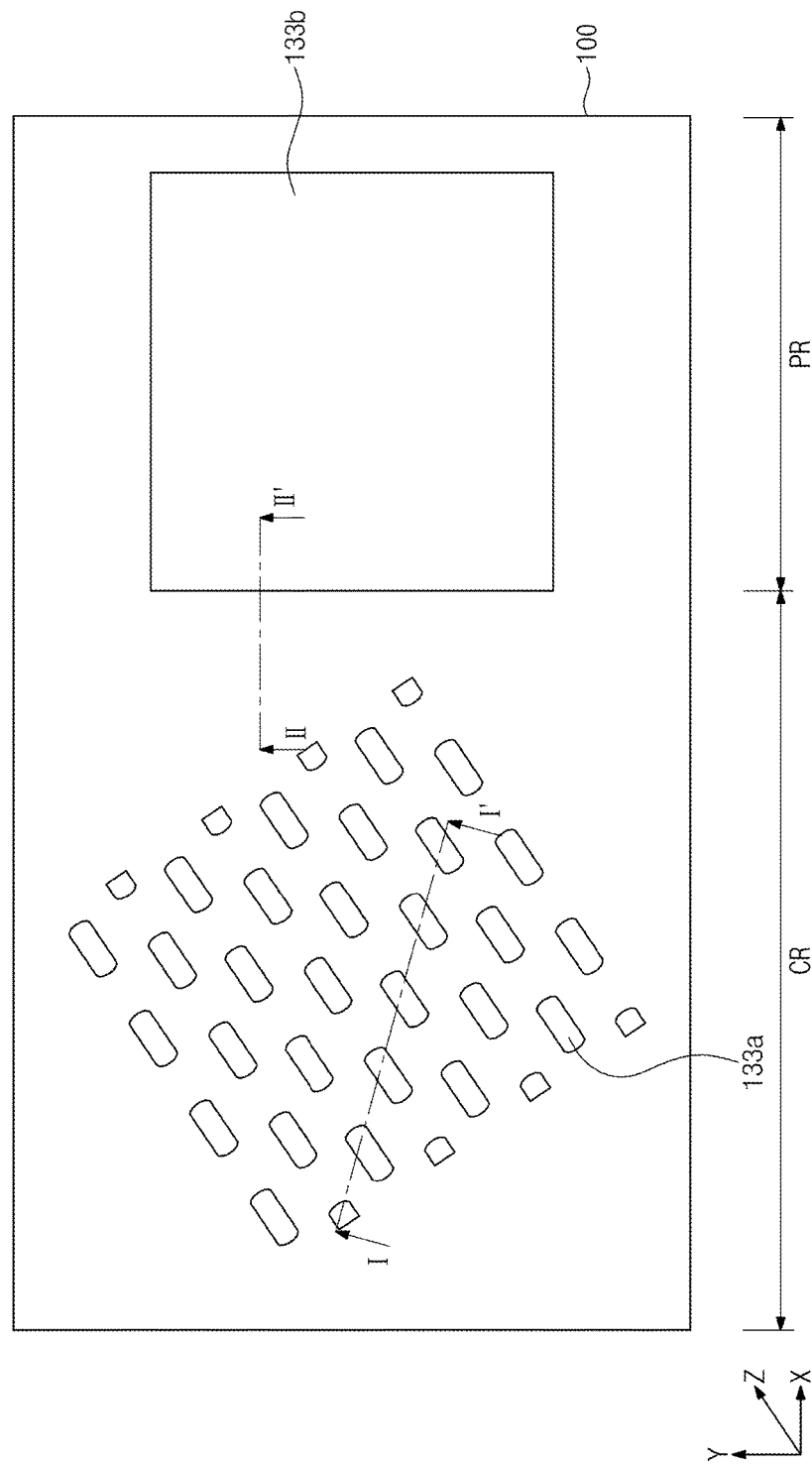
Figure 27B:
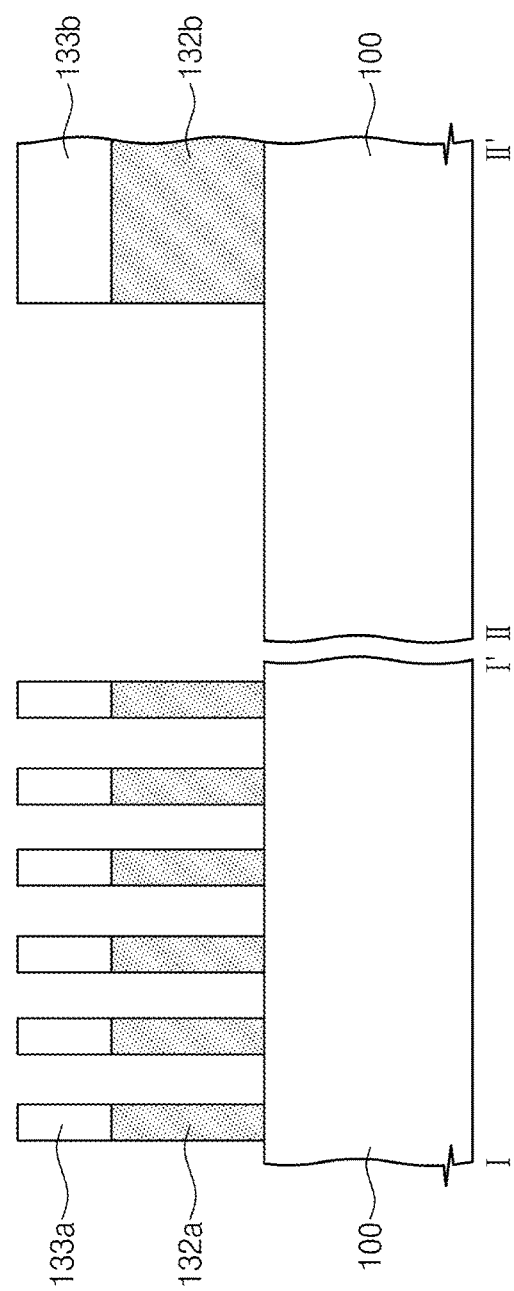

Referring to FIGS. 27A and 27B, in the cell array area CR of the substrate 100, the first mask layer 132 may be etched using the cell etch stop pattern 135a and the second cell mask pattern 133a as an etch mask. Therefore, first cell mask pattern 132a may be formed on the cell array area CR of the substrate 100. In the peripheral circuit area PR of the substrate 100, the first mask layer 132 may be etched using the second peripheral mask pattern 133b and the peripheral etch stop pattern 135b as an etch mask. Thus, a first peripheral mask pattern 132b may be formed in the peripheral circuit area PR of the substrate 100. During the etch process, the second portion 137b of the third mask layer 137, the cell etch stop pattern 135a, and the peripheral etch stop pattern 135b may be simultaneously or contemporaneously etched to be removed.

Figure 28A:
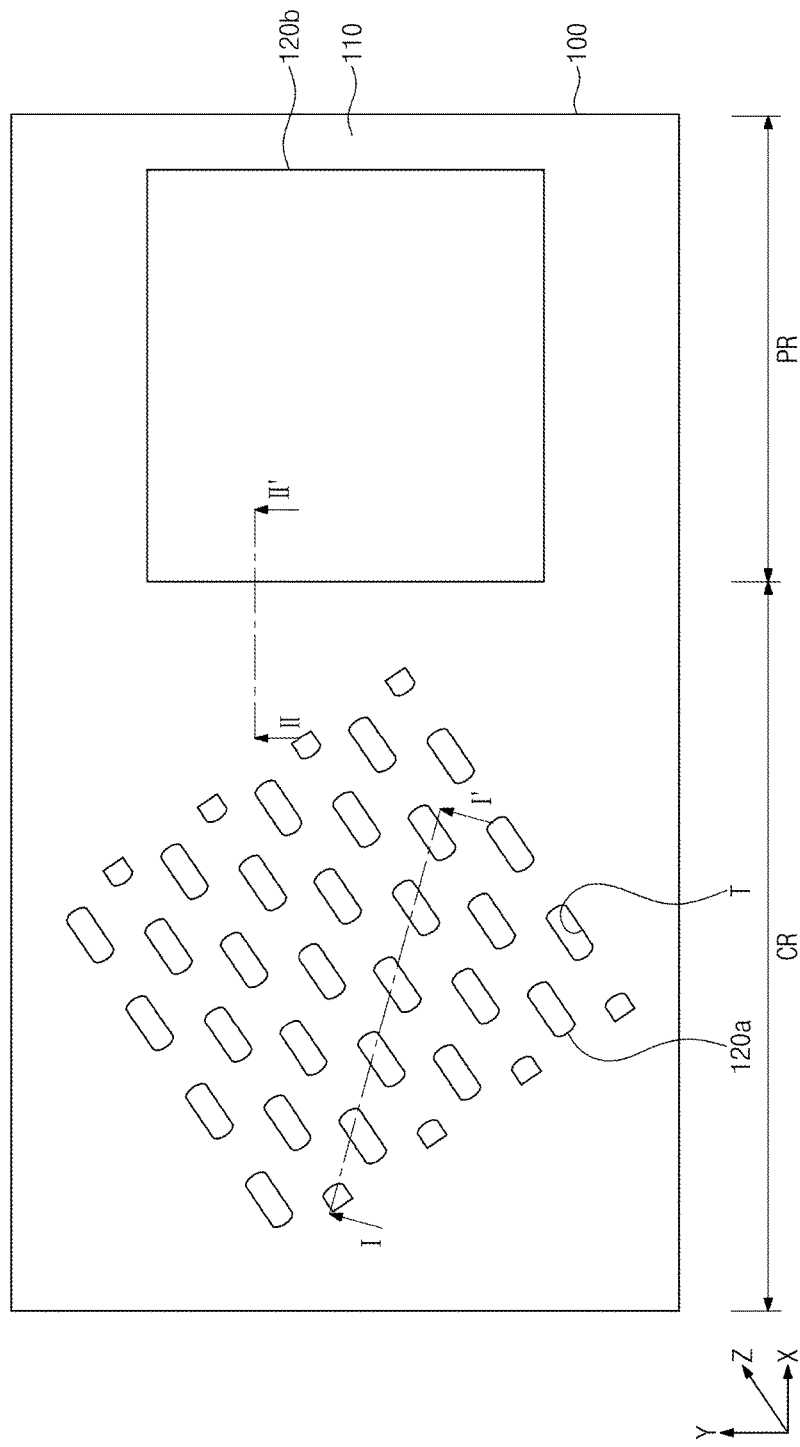
Figure 28B:
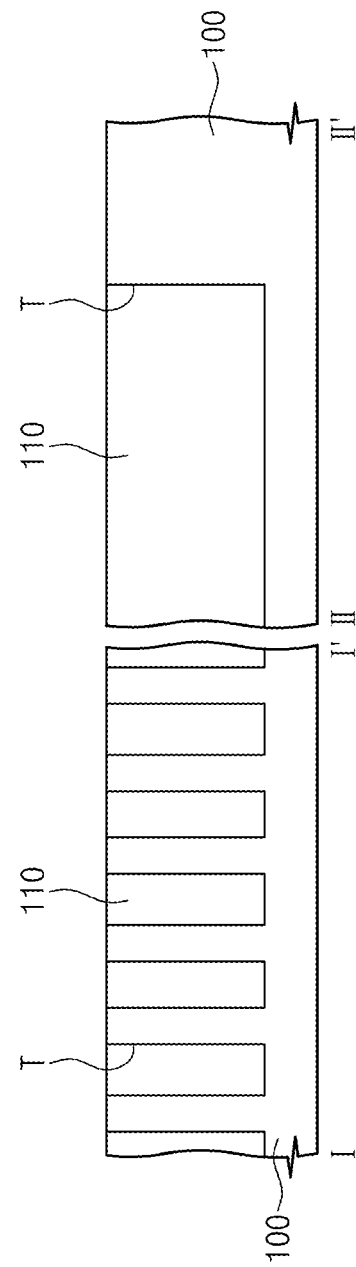

Referring to FIGS. 28A and 28B, the substrate 100 may be etched using the first cell mask pattern 132a and the first peripheral mask pattern 132b as an etch mask such that trenches T may be formed in the substrate 100. After the trenches T are formed, the first cell mask pattern 132a and the first peripheral mask pattern 132b may be removed.

The trench T may be filled with an insulative material to form a device isolation layer 110. The device isolation layer 110 may define first active regions 120a and a second active region 120b of the substrate 100. The first active regions 120a may be provided in the cell array area CR of the substrate 100, and the second active region 120b may be provided in the peripheral circuit area PR of the substrate 100.

According to example embodiments of the present inventive concepts, a pair of mask patterns formed on the cell array area of the substrate may be divided simultaneously or contemporaneously with the formation of mask pattern on the peripheral circuit area of the substrate. Accordingly, the present embodiments may reduce the number of process operations and manufacturing cost.

Although the present inventive concepts has been described in connection with the embodiment of the present inventive concepts illustrated in the accompanying drawings, it is not limited thereto. It will be apparent to those skilled in the art that various substitution, modifications and changes may be thereto without departing from the scope and spirit of the inventive concepts.

What is claimed is:

1. A method of fabricating a semiconductor device, the method comprising:
sequentially forming a first insulation pattern and an etch stop pattern on a peripheral circuit area of a substrate;
forming a first mask pattern on a cell array area of the substrate, the first mask pattern including,
a pair of first portions extending in parallel in a first direction, and
a second portion connected to the pair of first portions, the second portion covering a portion of a sidewall of the etch stop pattern and a portion of a sidewall of the first insulation pattern;
forming a second insulation layer on the substrate to cover the etch stop pattern and the first mask pattern;
sequentially etching a portion of the second insulation layer and a portion of the etch stop pattern to expose the second portion of the first mask pattern such that a remaining portion of the etch stop pattern defines a second mask pattern on the peripheral circuit area of the substrate; and
removing the second portion of the first mask pattern to divide the pair of first portions of the first mask pattern.

2. The method of claim 1, further comprising:
removing a remaining portion of the second insulation layer to expose the pair of first portions and a top surface of the second mask pattern,
wherein a portion of the first insulation pattern is removed together with the remaining portion of the second insulation layer, the portion of the first insulation pattern being exposed through the second mask pattern.

3. The method of claim 1, further comprising:
forming a conductive layer covering a top surface of the substrate; and
etching the conductive layer using the first portions of the first mask pattern and the second mask pattern as an etch mask to form a first conductive pattern and a second conductive pattern on the cell array area and the peripheral circuit area of the substrate, respectively.

4. The method of claim 1, further comprising:
forming a mask insulation layer covering a top surface of the substrate;
etching the mask insulation layer using the first portions of the first mask pattern and the second mask pattern to form a first mask insulation pattern and a second mask insulation pattern on the cell array area and the peripheral circuit area of the substrate, respectively;

etching the substrate using the first and second insulation patterns as an etch mask to form a first recess region and a second recess region on the cell array area and the peripheral circuit area of the substrate, respectively; and filling the first and second recess regions with an insulative material to form a first active pattern and a second active pattern on the cell array area and the peripheral circuit area of the substrate, respectively.

5. The method of claim 1, wherein the forming a first mask pattern comprises:

forming a first sacrificial pattern and a second sacrificial pattern sequentially stacked on the cell array area of the substrate, the first and second sacrificial patterns being arranged in a second direction crossing the first direction and extending in the first direction to be in contact with a portion of the sidewall of the first insulation pattern and a portion of the sidewall of the etch stop pattern;

forming a spacer layer covering surfaces of the first and second sacrificial patterns, the portion of the sidewall of the first insulation pattern, and the portion of the sidewall of the etch stop pattern;

etching the spacer layer to expose a top surface of the first sacrificial pattern; and removing the first sacrificial pattern.

6. The method of claim 5, wherein
the forming first and second sacrificial patterns is performed simultaneously with the sequentially forming a first insulation pattern and an etch stop pattern, and
the first sacrificial pattern includes a material substantially the same as the first insulation pattern and the second sacrificial pattern includes a material substantially the same as the etch stop pattern.

7. The method of claim 6, wherein the first sacrificial pattern has a thickness substantially the same as the first insulation pattern and the second sacrificial pattern has a thickness less than a thickness of the etch stop pattern.

8. The method of claim 7, wherein the etching the spacer layer includes removing the second sacrificial pattern such that the thickness of the etch stop pattern is reduced by the thickness of the second sacrificial pattern.

9. The method of claim 1, wherein the pair of first portions of the first mask pattern have a thickness less than a thickness of the second portion of the first mask pattern.

10. The method of claim 1, wherein the second insulation layer includes a material that is substantially the same as the first insulation pattern and has etch selectivity with respect to the etch stop pattern and the first mask pattern.

11. The method of claim 1, wherein the first insulation pattern includes a material having etch selectivity with respect to the first mask pattern such that the first insulation pattern is not etched when the second portion of the first mask pattern is etched.

12. A method of fabricating a semiconductor device, the method comprising:

forming a bit line contact on first active regions in a cell array area of a substrate, the bit line contact on a central portion of each of the first active regions extending in a first direction;

sequentially forming a first insulation pattern and an etch stop pattern on a second active region in a peripheral circuit area of the substrate;

forming a bit line mask pattern including a first portion extending across the bit line contact in a second direction crossing the first direction and a second portion on an end of the first portion, the second portion covering a portion of a sidewall of the etch stop pattern and a portion of a sidewall of the first insulation pattern;

forming a second insulation layer on the substrate to cover the etch stop pattern and the bit line mask pattern;

sequentially etching a portion of the second insulation layer and a portion of the etch stop pattern to expose the second portion of the bit line mask pattern such that a remaining portion of the etch stop pattern defines a gate mask pattern on the peripheral circuit area of the substrate; and removing the second portion of the bit line mask pattern.

13. The method of claim 12, further comprising:
removing a remaining portion of the second insulation layer to expose the first portion of the bit line mask pattern and a top surface of the gate mask pattern,
wherein a portion of the first insulation pattern is removed together with the remaining portion of the second insulation layer, the portion of the first insulation pattern being exposed through the gate mask pattern.

14. The method of claim 12, wherein the first portion of the bit line mask pattern has a thickness less than a thickness of the second portion of the bit line mask pattern.

15. The method of claim 12, further comprising:
forming a conductive layer covering a top surface of the substrate; and
etching the conductive layer using the first portion of the bit line mask pattern and the gate mask pattern as an etch mask to form a bit line in contact with the bit line contact on the cell array area and a peripheral gate electrode on the peripheral circuit area.

16. A method of fabricating a semiconductor device, the method comprising:

forming an etch stop pattern on a peripheral circuit area of a substrate;

forming a first mask pattern on a cell array area of the substrate, the first mask pattern including a pair of first portions and a second portion connected to the pair of first portions; and simultaneously removing the second portion of the first mask pattern and a portion of the etch stop pattern in order to divide the pair of first portions of the first mask pattern and form a second mask pattern on the peripheral circuit area of the substrate.

17. The method of claim 16, further comprising:
forming a conductive layer covering a top surface of the substrate; and
etching the conductive layer using the first portions of the first mask pattern and the second mask pattern as an etch mask to form a first conductive pattern and a second conductive pattern on the cell array area and the peripheral circuit area of the substrate, respectively.

18. The method of claim 16, further comprising:
forming a mask insulation layer covering a top surface of the substrate; and
etching the mask insulation layer using the first portions of the first mask pattern and the second mask pattern to form a first mask insulation pattern and a second mask insulation pattern on the cell array area and the peripheral circuit area of the substrate, respectively.

19. The method of claim 16, wherein the forming a first mask pattern comprises:
forming a first sacrificial pattern and a second sacrificial pattern sequentially stacked on the cell array area of the substrate;
forming a spacer layer covering surfaces of the first and second sacrificial patterns;

etching the spacer layer to expose a top surface of the first sacrificial pattern; and removing the first sacrificial pattern.

20. The method of claim 16, wherein the pair of first portions of the first mask pattern have a thickness less than a thickness of the second portion of the first mask pattern.

* * * * *